(12) United States Patent
Yoo et al.

(10) Patent No.: US 12,550,542 B2
(45) Date of Patent: Feb. 10, 2026

(54) DISPLAY DEVICE

(71) Applicant: Samsung Display Co., LTD., Yongin-si (KR)

(72) Inventors: In Kyung Yoo, Yongin-si (KR); Cha Dong Kim, Yongin-si (KR); Young Seok Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 381 days.

(21) Appl. No.: 18/361,447

(22) Filed: Jul. 28, 2023

(65) Prior Publication Data

US 2024/0121992 A1    Apr. 11, 2024

(30) Foreign Application Priority Data

Oct. 11, 2022    (KR) .................. 10-2022-0130068
Jan. 30, 2023    (KR) .................. 10-2023-0012043

(51) Int. Cl.
  *G06F 3/044*    (2006.01)
  *H10K 59/122*   (2023.01)
  *H10K 59/80*    (2023.01)

(52) U.S. Cl.
  CPC ......... *H10K 59/122* (2023.02); *H10K 59/873* (2023.02)

(58) Field of Classification Search
  CPC ... H10K 59/112; H10K 59/873; G06F 3/0446
  See application file for complete search history.

(56) References Cited

U.S. PATENT DOCUMENTS

| 2018/0033830 | A1 | 2/2018 | Kim et al. |
| 2022/0059641 | A1 | 2/2022 | Na |
| 2022/0173206 | A1 | 6/2022 | Lim et al. |
| 2022/0173352 | A1 | 6/2022 | Kwak |
| 2024/0284716 | A1* | 8/2024 | Yoo ................. H10K 59/1315 |
| 2024/0357871 | A1* | 10/2024 | Shin ............... H10K 59/80522 |
| 2024/0372045 | A1* | 11/2024 | Jang ................. H10H 20/853 |

FOREIGN PATENT DOCUMENTS

KR    10-2008-0000432 A    1/2008

* cited by examiner

*Primary Examiner* — Joseph L Williams
(74) *Attorney, Agent, or Firm* — Womble Bond Dickinson (US) LLP

(57) ABSTRACT

A display device includes: a display area and a non-display area; anode electrodes in the display area; an inorganic insulating layer on the anode electrodes; a bank structure on the inorganic insulating layer, and including openings overlapping with the anode electrodes; light emitting layers on the anode electrodes and in the openings; cathode electrodes on the light emitting layers and in the openings; a first power line in the non-display area; and a power connection electrode including through portions partially overlapping with the first power line, and between the first power line and the display area. The bank structure includes: hole patterns on the power connection electrode in the non-display area, and overlapping with the through portions; a first bank layer; and a second bank layer on the first bank layer. The second bank layer includes a tip protruding from a sidewall of the first bank layer.

20 Claims, 29 Drawing Sheets

DISPLAY DEVICE

CROSS-REFERENCE TO RELATED APPLICATION

This application claims priority to and the benefit of Korean Patent Application No. 10-2022-0130068, filed on Oct. 11, 2022, and Korean Patent Application No. 10-2023-0012043, filed on Jan. 30, 2023, in the Korean Intellectual Property Office, the entire disclosures of all of which are incorporated by reference herein.

BACKGROUND

1. Field

Embodiments of the present disclosure relate to a display device.

2. Description of the Related Art

With the advancement of information-oriented society, more and more demands are placed on display devices for displaying images in various ways. For example, display devices are employed in various electronic devices, such as smartphones, digital cameras, laptop computers, navigation devices, and smart televisions. The display device may be a flat panel display device, such as a liquid crystal display device, a field emission display device, and an organic light emitting display device. From among the flat panel display devices, in a light emitting display device, because each of the pixels of a display panel includes a light emitting element capable of emitting light by itself, an image can be displayed without a backlight unit for providing light to the display panel.

The above information disclosed in this Background section is for enhancement of understanding of the background of the present disclosure, and therefore, it may contain information that does not constitute prior art.

SUMMARY

Aspects of embodiments of the present disclosure are directed to a display device in which separate light emitting elements are formed in emission areas without using a mask process, and including a pad portion made of the same material as that of a structure disposed in a display area and formed at (e.g., in or on) the same layer as that of the structure disposed in the display area.

However, the aspects and features of the present disclosure are not limited to those set forth above. The above and other aspects and features of the present disclosure will become more apparent to one of ordinary skill in the art to which the present disclosure pertains by referencing the detailed description and drawings of the present disclosure.

According to one or more embodiments of the present disclosure, a display device includes: a display area, and a non-display area surrounding the display area; anode electrodes in the display area, and spaced from each other; an inorganic insulating layer in the display area, and on the anode electrodes; a bank structure on the inorganic insulating layer, and including a plurality of openings overlapping with the anode electrodes; a plurality of light emitting layers on the anode electrodes and in the openings of the bank structure; a plurality of cathode electrodes on the light emitting layers and in the openings of the bank structure; a first power line in the non-display area, and surrounding the display area; and a power connection electrode including a plurality of through portions partially overlapping with the first power line, and between the first power line and the display area. The bank structure includes: a plurality of hole patterns on the power connection electrode in the non-display area, and overlapping with the through portions; a first bank layer; and a second bank layer on the first bank layer, and including a metal material different from that of the first bank layer. The second bank layer includes a tip protruding from a sidewall of the first bank layer.

In an embodiment, the display device may further include: a first insulating pattern on the through portions of the power connection electrode; and a second insulating pattern on the first insulating pattern. The hole patterns may penetrate the first insulating pattern and the second insulating pattern.

In an embodiment, the inorganic insulating layer may not be in contact with a top surface of each of the anode electrodes, and the display device may further include a residual pattern between the anode electrodes and the inorganic insulating layer.

In an embodiment, the power connection electrode may be at the same layer as that of the anode electrodes, the first insulating pattern may include the same material as that of the residual pattern, and the second insulating pattern may include the same material as that of the inorganic insulating layer.

In an embodiment, parts of the light emitting layers may be located between the anode electrodes and the inorganic insulating layer.

In an embodiment, the first insulating pattern may cover inner sidewalls of the through portions.

In an embodiment, the display device may further include a bridge electrode in the non-display area between the first power line and the power connection electrode, and the bridge electrode may be in direct contact with the first power line and the power connection electrode.

In an embodiment, areas of the hole patterns may be smaller than areas of the through portions.

In an embodiment, the first bank layer may include aluminum (Al), and the second bank layer may include titanium (Ti).

In an embodiment, each of the cathode electrodes may be in direct contact with a corresponding side surface of the first bank layer.

In an embodiment, the hole patterns may not overlap with the first power line.

In an embodiment, the display device may further include a gate driver between the display area and the first power line in the non-display area, the power connection electrode may overlap with the gate driver, and at least some of the plurality of hole patterns may overlap with the gate driver.

In an embodiment, the display device may further include: a plurality of organic patterns on the second bank layer to surround the openings, and including the same material as those of the light emitting layers; and a plurality of electrode patterns on the organic patterns, and including the same material as that of the cathode electrodes.

In an embodiment, the display device may further include: a thin film encapsulation layer including: a first encapsulation layer on the bank structure; a second encapsulation layer on the first encapsulation layer; and a third encapsulation layer on the second encapsulation layer; and a touch layer on the thin film encapsulation layer, and including a plurality of touch insulating layers, and a touch electrode between the touch insulating layers.

In an embodiment, the display device may further include: a light blocking layer on the touch layer to overlap with the touch electrode, and including a plurality of opening holes overlapping with the openings of the bank structure; and a plurality of color filters in the opening holes, respectively, on the light blocking layer.

According to one or more embodiments of the present disclosure, a display device includes: a substrate including a display area, and a non-display area surrounding the display area; a first power line in the non-display area; a passivation layer on the first power line, and in the display area and the non-display area; an anode electrode on the passivation layer in the display area; a power connection electrode on the passivation layer in the non-display area, electrically connected to the first power line, and including a plurality of through portions; a residual pattern partially on the anode electrode; a plurality of first insulating patterns partially overlapping with the through portions in the non-display area; an inorganic insulating layer on the residual pattern, and partially overlapping with the anode electrode; second insulating patterns on the first insulating patterns and the power connection electrode; a bank structure including: a plurality of openings on the inorganic insulating layer and the power connection electrode, and overlapping with the anode electrode; and a plurality of hole patterns overlapping with the through portions, and penetrating the first insulating patterns and the second insulating patterns; an active layer on the anode electrode in the openings of the bank structure; and a cathode electrode on the active layer. The bank structure includes: a first bank layer; and a second bank layer on the first bank layer, and including a metal material different from that of the first bank layer. The second bank layer includes a tip protruding from a sidewall of the first bank layer.

In an embodiment, the hole patterns may not overlap with the first power line, and may be located between the first power line and the display area in the non-display area.

In an embodiment, the first insulating patterns may cover inner sidewalls of the through portions, and areas of the hole patterns may be smaller than areas of the through portions.

In an embodiment, the display device may further include a bridge electrode in the non-display area between the first power line and the power connection electrode.

In an embodiment, the cathode electrode may be in direct contact with a side surface of the first bank layer.

According to one or more embodiments of the present disclosure, in a display device, a bank structure including a metal material may be disposed across a display area and a non-display area, and light emitting elements disposed in openings formed in the display area may be electrically connected to a power line disposed in the non-display area through the bank structure.

According to one or more embodiments of the present disclosure, the display device may include hole patterns penetrating the bank structure disposed in the non-display area, and may form a path through which gases generated in a thin film transistor layer are discharged. Accordingly, even when the bank structures are disposed to cover the thin film transistor layer, a lifting phenomenon due to gases generated during a manufacturing process may be prevented or substantially prevented, and reliability may be secured.

However, the aspects and features of the present disclosure are not limited to those described above, and various other aspects and features may be included herein.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
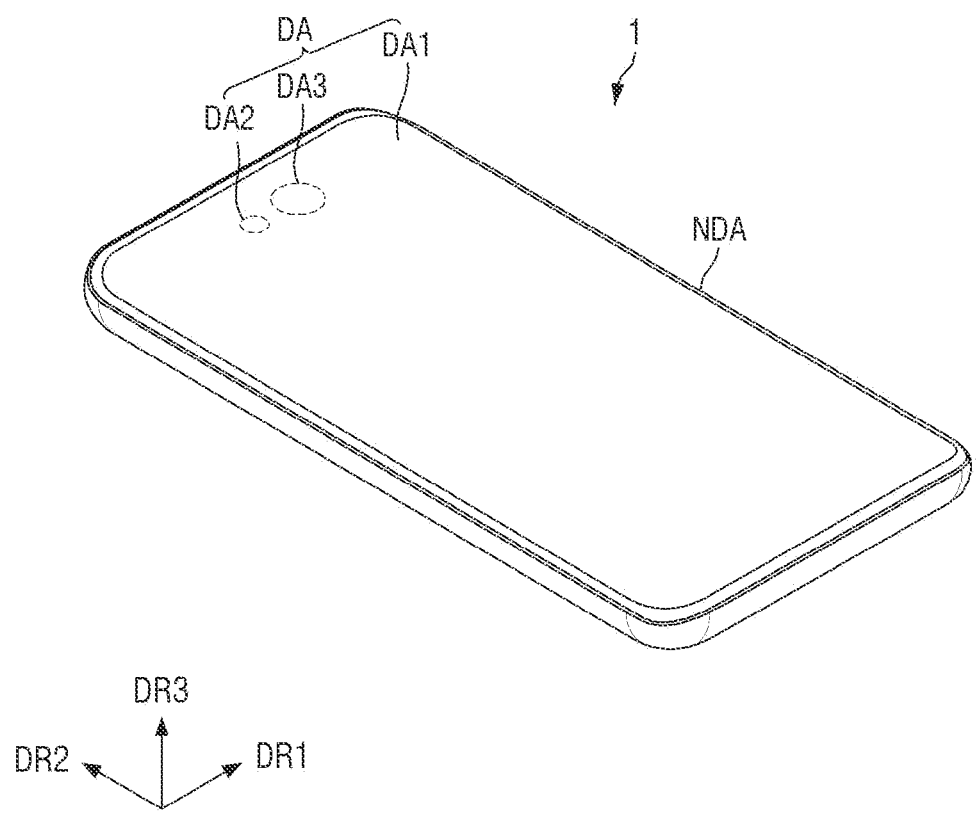
FIG. 1 is a schematic perspective view of a display device according to one or more embodiments.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B.

Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display device according to one or more embodiments.

Referring to FIG. 1, an electronic device 1 displays a moving image or a still image. The electronic device 1 may refer to any suitable kind of electronic device for providing a display screen. Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

Figure 2:
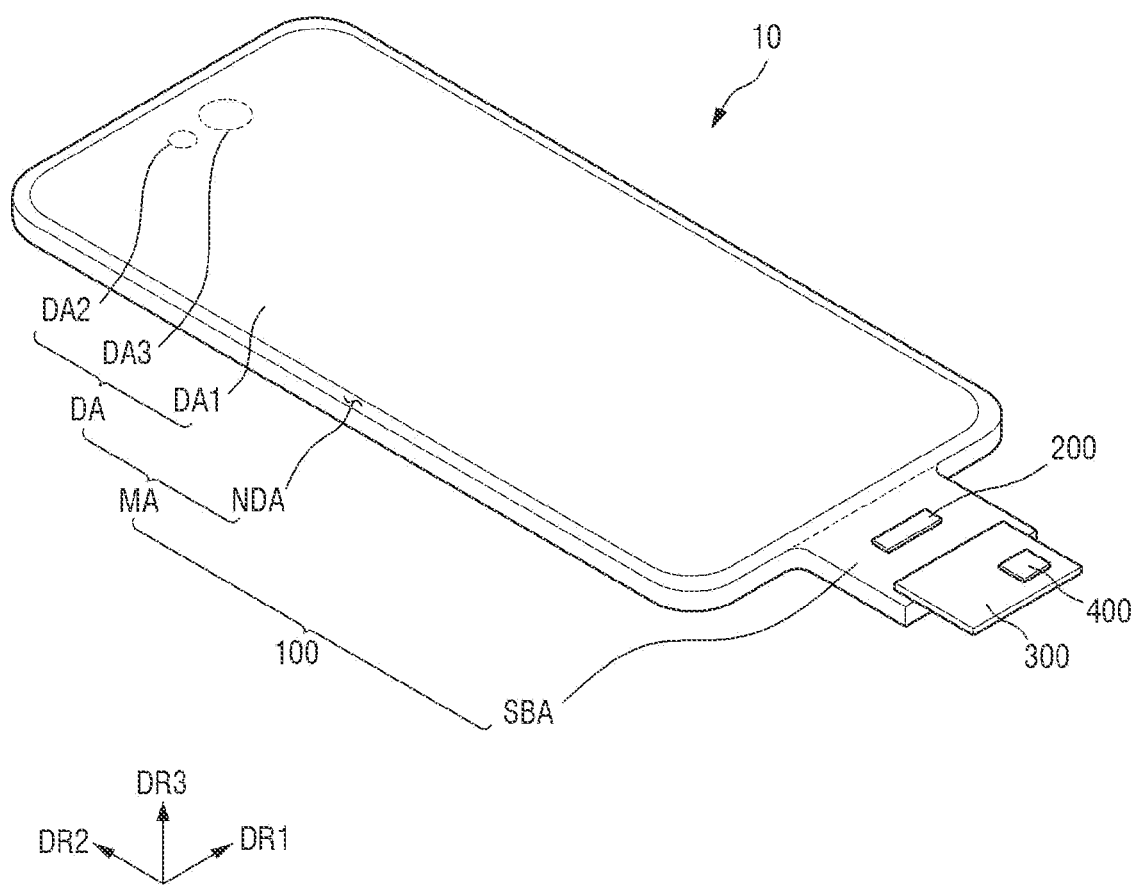
FIG. 2 is a perspective view illustrating a display device included in an electronic device according to one or more embodiments.

The electronic device 1 may include a display device 10 as illustrated in FIG. 2 for providing the display screen. Examples of the display device 10 may include an inorganic light emitting diode display device, an organic light emitting display device, a quantum dot light emitting display device, a plasma display device, and a field emission display device. Hereinafter, for convenience, a case where an organic light emitting diode display device is applied as the display device 10 will be described in more detail, but the present disclosure is not limited thereto, and other suitable kinds of display devices may be applied without departing from the spirit and scope of the present disclosure.

The shape of the electronic device 1 may be variously modified. For example, the electronic device 1 may have any suitable shape, such as a rectangular shape elongated in a horizontal direction, a rectangular shape elongated in a vertical direction, a square shape, a quadrilateral shape with rounded corners (e.g., vertices), other suitable polygonal shapes, and a circular shape. The shape of a display area DA of the electronic device 1 may also be similar to the overall shape of the electronic device 1. FIG. 1 illustrates the electronic device 1 having a rectangular shape elongated in a second direction DR2 as an example.

The electronic device 1 may include the display area DA and a non-display area NDA. The display area DA is an area where a screen may be displayed, and the non-display area NDA is an area where a screen is not displayed. The display area DA may also be referred to as an active region, and the non-display area NDA may also be referred to as a non-active region. The display area DA may occupy or substantially occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and the second display area DA2 and the third display area DA3 may correspond to a component area.

FIG. 2 is a perspective view illustrating a display device included in an electronic device according to one or more embodiments.

Referring to FIG. 2, the electronic device 1 according to one or more embodiments may include a display device 10. The display device 10 may provide a screen displayed by the electronic device 1. The display device 10 may have a planar shape similar to the shape of the electronic device 1. For example, the display device 10 may have a shape similar to a rectangular shape having a short side extending in the first direction DR1 and a long side extending in the second direction DR2. An edge where the short side extending in the first direction DR1 and the long side extending in the second direction DR2 meet each other may be rounded to have a curvature, but is not limited thereto, and may be formed at a right angle. The planar shape of the display device 10 is not limited to a quadrilateral shape, and may be formed in a shape similar to another suitable polygonal shape, a circular shape, or an elliptical shape.

The display device 10 may include a display panel 100, a display driver 200, a circuit board 300, and a touch driver 400.

The display panel 100 may include a main region MA and a sub-region SBA.

The main region MA may include the display area DA including pixels for displaying an image, and the non-display area NDA disposed around (e.g., adjacent to or surrounding around a periphery of) the display area DA. The display area DA may include the first display area DA1, the second display area DA2, and the third display area DA3. The display area DA may emit light from a plurality of emission areas or a plurality of opening areas. For example, the display panel 100 may include a pixel circuit including switching elements, a pixel defining layer for defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may be a region extending from one side of the main region MA. The sub-region SBA may include a flexible material that may be bent, folded, or rolled. For example, when the sub-region SBA is bent, the sub-region SBA may overlap with the main region MA in a thickness direction (e.g., the third direction DR3). The sub-region SBA may include the display driver 200 and a pad portion connected to the circuit board 300. In another embodiment, the sub-region SBA may be omitted, and the display driver 200 and the pad portion may be arranged in the non-display area NDA.

The display driver 200 may output signals and voltages for driving the display panel 100. The display driver 200 may supply data voltages to data lines. The display driver 200 may supply a power voltage to a power line, and may supply a gate control signal to the gate driver. The display driver 200 may be formed as an integrated circuit (IC), and mounted on the display panel 100 by a chip on glass (COG) method, a chip on plastic (COP) method, or an ultrasonic bonding method. For example, the display driver 200 may be disposed in the sub-region SBA, and may overlap with the main region MA in the thickness direction by bending of the sub-region SBA. As another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to the pad portion of the display panel 100. The circuit board 300 may be a flexible printed circuit board, a printed circuit board, or a flexible film, such as a chip on film.

A touch driver 400 may be mounted on the circuit board 300. The touch driver 400 may be connected to a touch sensing unit (e.g., a touch sensor) of the display panel 100. The touch driver 400 may supply a touch driving signal to a plurality of touch electrodes of the touch sensing unit, and may sense an amount of change in a capacitance between the plurality of touch electrodes. For example, the touch driving signal may be a pulse signal having a suitable frequency (e.g., a predetermined frequency). The touch driver 400 may determine whether an input is made and calculate input coordinates based on an amount of change in a capacitance between the plurality of touch electrodes. The touch driver 400 may be formed of an integrated circuit (IC).

Figure 3:
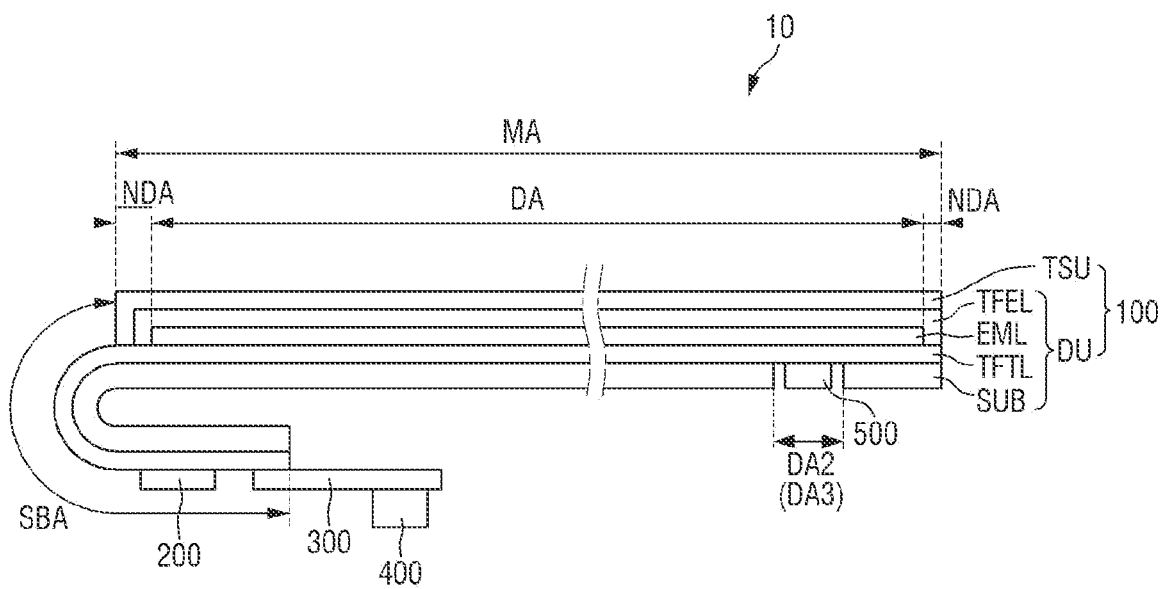
FIG. 3 is a cross-sectional view of the display device of FIG. 2 viewed from the side.
Figure 3:
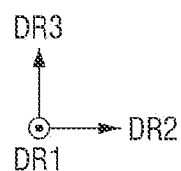

FIG. 3 is a cross-sectional view of the display device of FIG. 2 viewed from the side.

Referring to FIG. 3, the display panel 100 may include a display layer DU, a touch sensing layer TSU, and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate that may be bent, folded, or rolled. For example, the substrate SUB may include a polymer resin such as polyimide (PI), but is not limited thereto. In another embodiment, the substrate SUB may include a glass material or a metal material.

The thin film transistor layer TFTL may be disposed on the substrate SUB. The thin film transistor layer TFTL may include a plurality of thin film transistors constituting pixel circuits of the pixels. The thin film transistor layer TFTL may further include gate lines, data lines, power lines, gate control lines, fan-out lines, and lead lines. The fan-out lines connect the display driver 200 to the data lines, and the lead lines connect the display driver 200 to the pad portion. Each of the thin film transistors may include a semiconductor region, a source electrode, a drain electrode, and a gate electrode. For example, when the gate driver is formed on one side of the non-display area NDA of the display panel 100, the gate driver may include a plurality of thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements, each including a first electrode, a second electrode, and a light emitting layer to emit light, and a pixel defining layer defining the pixels. The plurality of light emitting elements of the light emitting element layer EML may be disposed in the display area DA.

In one or more embodiments, the light emitting layer may be an organic light emitting layer including an organic material. The light emitting layer may include a hole transporting layer, the organic light emitting layer, and an electron transporting layer. When the first electrode receives a voltage through the thin film transistor of the thin film transistor layer TFTL and the second electrode receives a cathode voltage, holes and electrons may be transferred to the organic light emitting layer through the hole transporting layer and the electron transporting layer, respectively, and may be combined with each other to emit light in the organic light emitting layer.

In another embodiment, the light emitting elements may include a quantum dot light emitting diode including a quantum dot light emitting layer, an inorganic light emitting diode including an inorganic semiconductor, or a micro light emitting diode.

The display device 10 according to one or more embodiments may include a plurality of color filters CF1, CF2, and CF3 (e.g., see FIGS. 5 and 6) of the color filter layer CFL disposed on the light emitting elements of the light emitting element layer EML. Each of the color filters may selectively transmit light of a suitable wavelength (e.g., a specific or predetermined wavelength), and may block or absorb light of a different wavelength. The color filters may absorb a part of light coming from the outside of the display device 10 to reduce reflected light due to external light. Accordingly, the color filters may prevent or substantially prevent color distortion caused by reflection of the external light. Because the color filters are disposed on the light emitting elements, the display device 10 may not require a separate substrate for the color filters. Accordingly, the thickness of the display device 10 may be reduced.

The thin film encapsulation layer TFEL may cover the top surface and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing a user's touch in a capacitive manner, and touch lines connecting the plurality of touch electrodes to the touch driver 400. For example, the touch sensing layer TSU may sense the user's touch by using a mutual capacitance method or a self-capacitance method.

In another embodiment, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area overlapping with the display area DA. The touch lines of the touch sensing layer TSU may be disposed in a touch peripheral area that overlaps with the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and/or visible light bands. For example, the optical device 500 may be an optical sensor that detects light incident on the display device 10, such as a proximity sensor, an illuminance sensor, and/or a camera sensor or an image sensor.

The color filter layer CFL may be disposed on the thin film encapsulation layer TFEL. The color filter layer CFL may include the plurality of color filters respectively corresponding to the plurality of emission areas. Each of the color filters may selectively transmit light of a suitable wavelength (e.g., a specific or predetermined wavelength), and may block or absorb light of a different wavelength. The color filter layer CFL may absorb a part of light coming from the outside of the display device 10 to reduce reflected light due to external light. Accordingly, the color filter layer CFL may prevent or substantially prevent color distortion caused by reflection of the external light.

Because the color filter layer CFL is disposed (e.g., directly disposed) on the thin film encapsulation layer TFEL, the display device 10 may not require a separate substrate for the color filter layer CFL. Accordingly, the thickness of the display device may be reduced.

Figure 4:
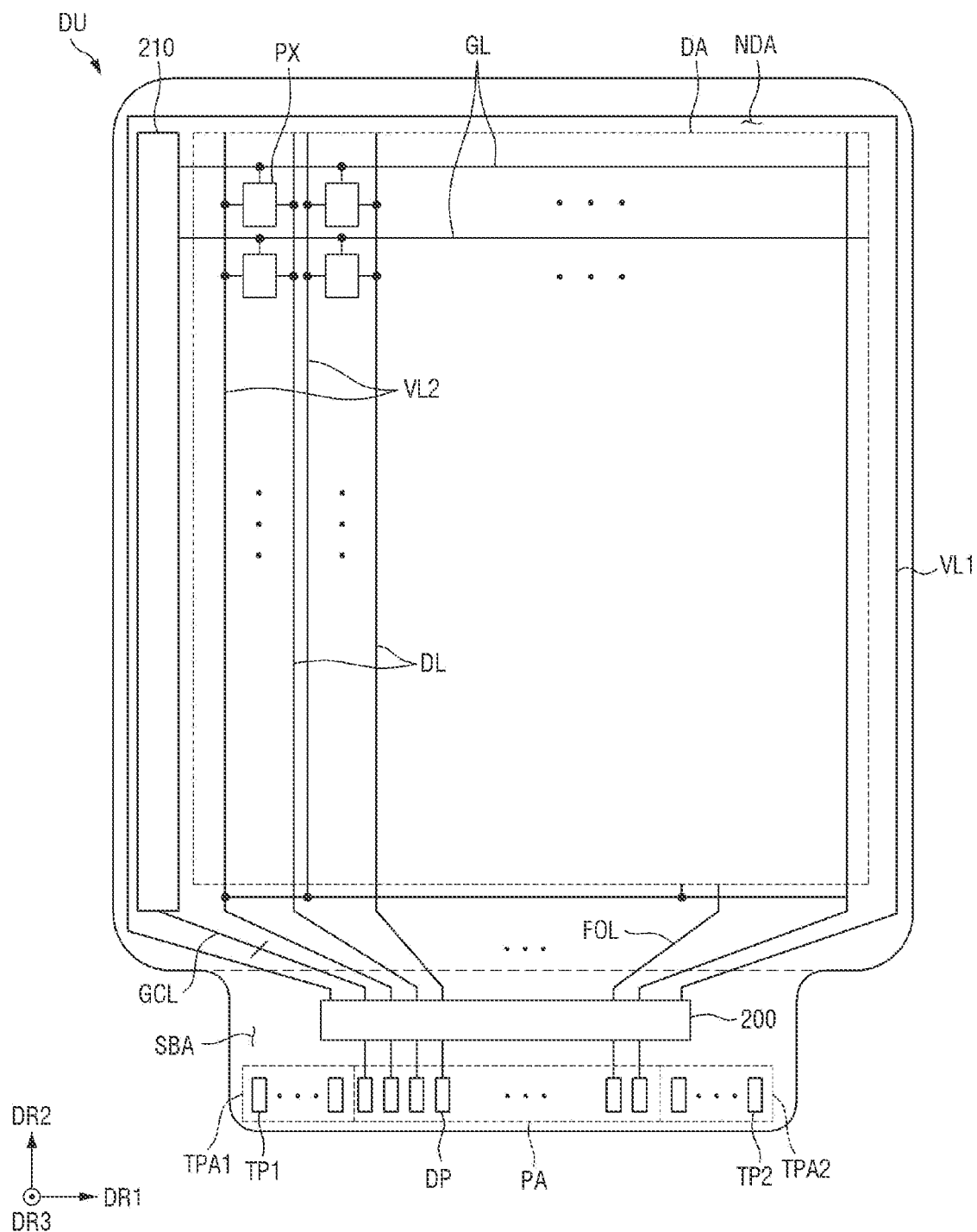
FIG. 4 is a plan view illustrating a display layer of a display device according to one or more embodiments.

FIG. 4 is a plan view illustrating a display layer of a display device according to one or more embodiments.

Referring to FIG. 4, the display layer DU may include the display area DA and the non-display area NDA.

The display area DA may be disposed at the center of the display panel 100. A plurality of pixels PX, a plurality of gate lines GL, a plurality of data lines DL, and some (e.g., a second power line VL2) of a plurality of power lines may be disposed in the display area DA. Each of the plurality of pixels PX may be defined as a minimum unit that emits light.

The plurality of gate lines GL may supply the gate signals received from the gate driver 210 to the plurality of pixels PX. The plurality of gate lines GL may extend in the first direction DR1, and may be spaced apart from each other in the second direction DR2 crossing the first direction DR1.

The plurality of data lines DL may supply the data voltages received from the display driver 200 to the plurality of pixels PX. The plurality of data lines DL may extend in the second direction DR2, and may be spaced apart from each other in the first direction DR1.

From among the plurality of power lines, the second power lines VL2 may supply the power voltage received from the display driver 200 to the plurality of pixels PX. Here, the power voltage may be at least one of a driving voltage, an initialization voltage, or a reference voltage. The plurality of second power lines VL2 may extend in the second direction DR2, and may be spaced apart from each other in the first direction DR1.

The non-display area NDA may surround (e.g., around a periphery of) the display area DA. Some (e.g., a first power line VL1) of the plurality of power lines, the gate driver 210, fan-out lines FOL, and gate control lines GCL may be disposed in the non-display area NDA. The gate driver 210 may generate a plurality of gate signals based on the gate control signal, and may sequentially supply the plurality of gate signals to the plurality of gate lines GL according to a suitable order (e.g., a set or predetermined order).

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210. While FIG. 4 illustrates that the gate driver 210 is disposed in the non-display area NDA disposed to the left of the display area DA, the present disclosure is not limited thereto. In some embodiments, the display device 10 may include a plurality of gate drivers 210 disposed to the left and right sides of the display area DA, respectively.

The first power line VL1 of the plurality of power lines may be disposed in the non-display area NDA, while surrounding (e.g., around a periphery of) the display area DA. The first power line VL1 may supply the power voltage received from the display driver 200 to the plurality of pixels PX. Here, the power voltage may be a low-potential power voltage.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a suitable material, such as a self assembly anisotropic conductive paste (SAP) or an anisotropic conductive film.

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driver 200.

Figure 5:
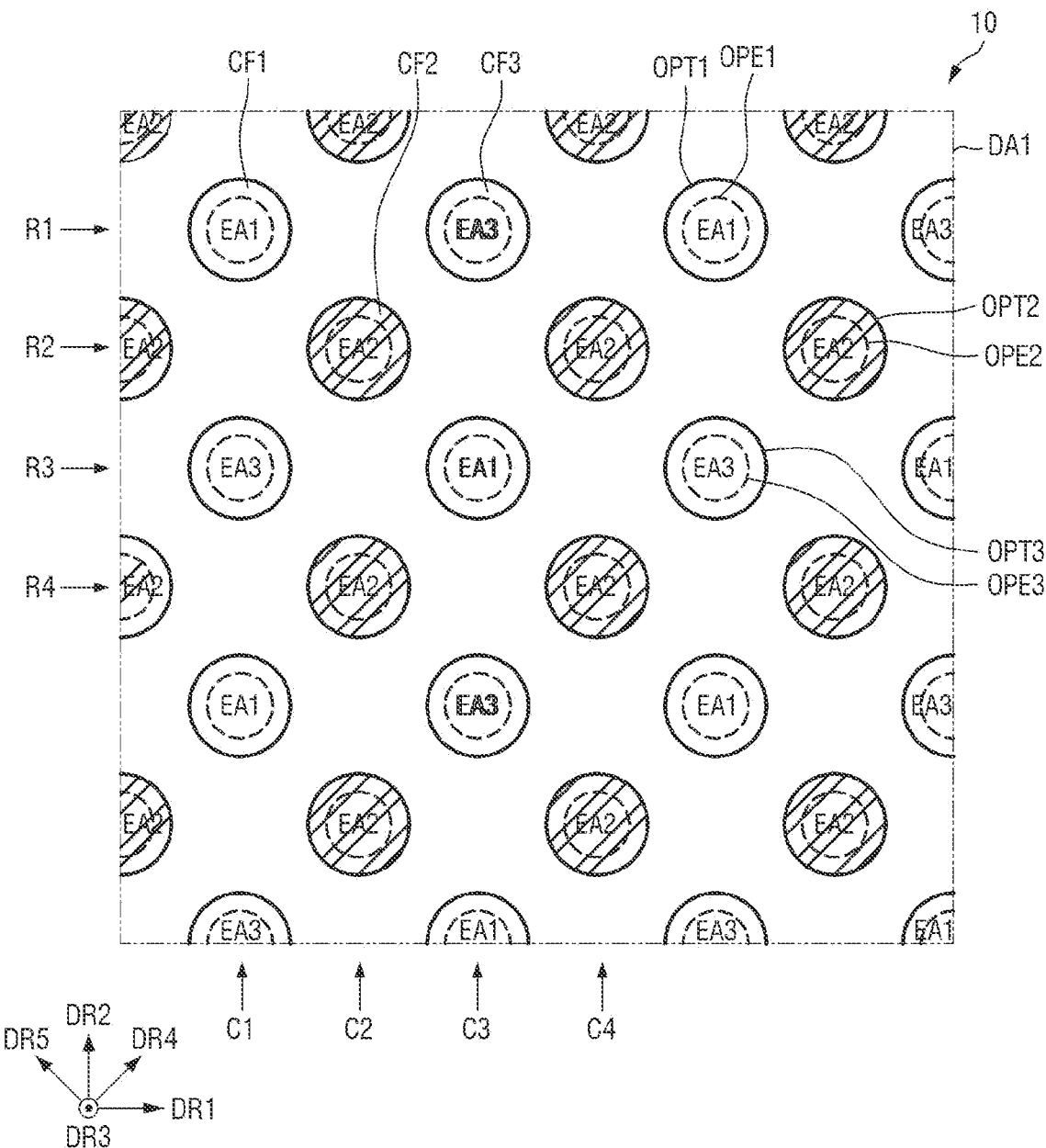
FIG. 5 is a plan view of the disposition of color filters and emission areas in the display area of a display device according to one or more embodiments.

FIG. 5 is a plan view of the disposition of the color filters and the emission areas in the display area of the display device according to one or more embodiments.

Referring to FIG. 5, the display device 10 may include a plurality of emission areas EA1, EA2, and EA3 disposed in the display area DA. The display area DA shown in FIG. 5 is part of the first display area DA1, and the plurality of emission areas EA1, EA2, and EA3 may be disposed in the first display area DA1. However, the plurality of emission areas EA1, EA2, and EA3 may also be disposed in the second display area DA2 and the third display area DA3 of the display area DA.

The emission areas EA1, EA2, and EA3 may include a first emission area EA1, a second emission area EA2, and a third emission area EA3 for emitting light of different colors from each other. The first to third emission areas EA1, EA2, and EA3 may emit red, green, and blue light, respectively, but the color of the light emitted from each of the emission areas EA1, EA2, and EA3 may be different depending on the type of light emitting elements ED1, ED2, and ED3 (e.g., see FIG. 6) disposed on a light emitting element layer EML to be described in more detail below. In an embodiment, the first emission area EA1 may emit first light of a red color, the second emission area EA2 may emit second light of a green color, and the third emission area EA3 may emit third light of a blue color. However, the present disclosure is not limited thereto.

The plurality of emission areas EA1, EA2, and EA3 may be arranged in a diamond type (e.g., a PENTILE® type) of arrangement. For example, the first emission area EA1 and the third emission area EA3 may be spaced apart from each other in the first direction DR1, and may be alternately arranged with each other along the first direction DR1 and the second direction DR2. In the arrangement of the emission areas EA1, EA2, and EA3, the first emission area EA1 and the third emission area EA3 may be alternately arranged in the first direction DR1 in a first row R1 and a third row R3. In a first column C1 and a third column C3, the first emission area EA1 and the third emission area EA3 may be alternately arranged in the second direction DR2.

The second emission area EA2 may be spaced apart from another adjacent second emission area EA2 in the first direction DR1 and the second direction DR2, and may be spaced apart from an adjacent first emission area EA1 and an adjacent third emission area EA3 in a fourth direction DR4 or a fifth direction DR5. The plurality of second emission areas EA2 may be repeatedly arranged along the first direction DR1 and the second direction DR2, and the second emission area EA2 and the first emission area EA1, or the second emission area EA2 and the third emission area EA3 may be alternately arranged along the fourth direction DR4 or the fifth direction DR5. In the arrangement of the emission areas EA1, EA2, and EA3, the second emission area EA2 may be repeatedly disposed in the first direction DR1 in a second row R2 and a fourth row R4, and the second emission area EA2 may be repeatedly disposed in the second direction DR2 in a second column C2 and a fourth column C4.

The first to third emission areas EA1, EA2, and EA3 may be respectively defined by a plurality of openings OPE1, OPE2, and OPE3 formed in a bank structure BNS (e.g., see FIG. 6) of the light emitting element layer EML, which will be described in more detail below. For example, the first emission area EA1 may be defined by the first opening OPE1 of the pixel defining layer, the second emission area EA2 may be defined by the second opening OPE2 of the pixel defining layer, and the third emission area EA3 may be defined by the third opening OPE3 of the pixel defining layer.

Figure 6:
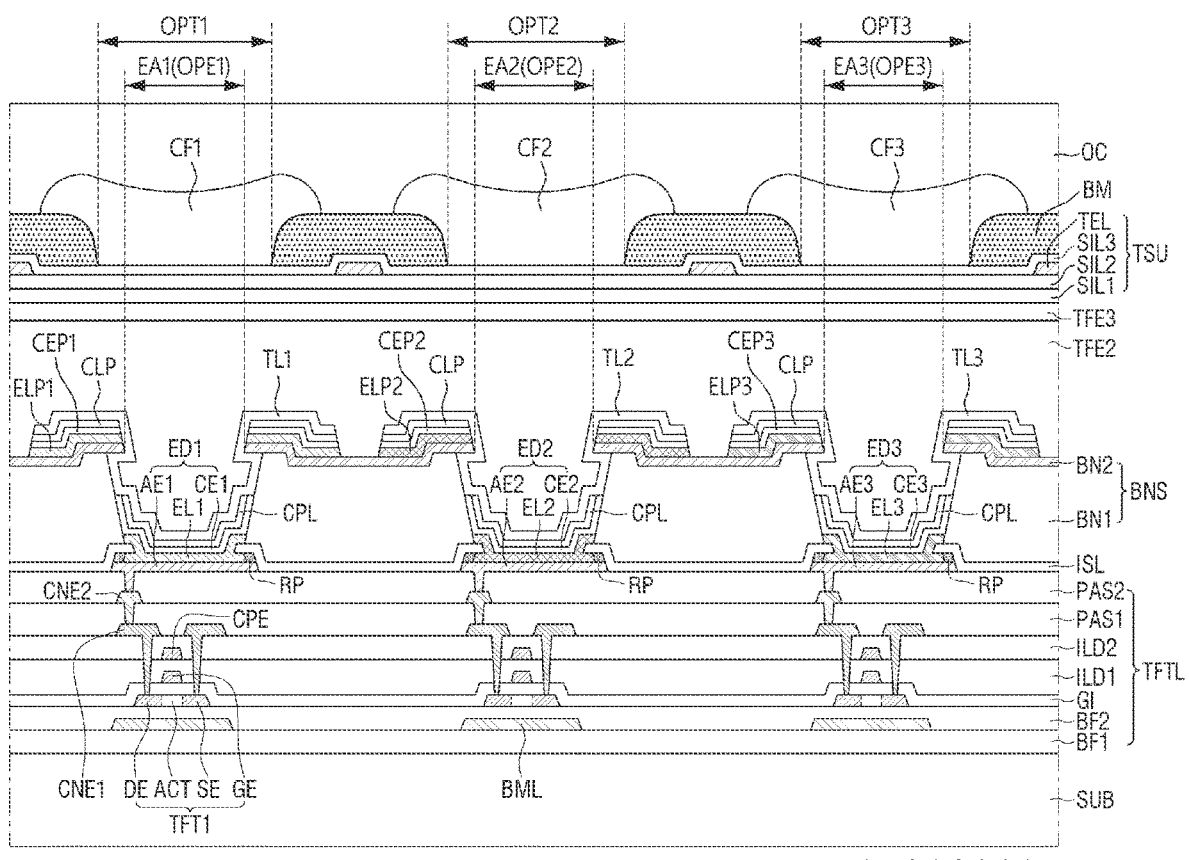
FIG. 6 is a cross-sectional view illustrating a part of a display device according to one or more embodiments.

The areas of the emission areas EA1, EA2, and EA3 may be variously modified according to the sizes of the openings OPE1, OPE2, and OPE3 of the bank structure (e.g., the pixel defining layer). The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. In an embodiment, the areas or sizes of the first to third emission areas EA1, EA2, and EA3 may be the same or substantially the same as each other. In the embodiment of FIG. 6, the first emission area EA1, the second emission area EA2, and the third emission area EA3 may have the same or substantially the same area or the same or substantially the same diameter as each other.

However, the present disclosure is not limited thereto. The areas of the emission areas EA1, EA2, and EA3 may be freely adjusted according to the color of the screen desired for the display device 10 and the electronic device 1. In addition, the areas of the emission areas EA1, EA2, and EA3 may be related to a light efficiency and the lifespan of the light emitting element ED, and may have a trade-off relation with the reflection by external light. The areas of the emission areas EA1, EA2, and EA3 may be adjusted in consideration of one or more of the above factors. For example, in the display device 10, the area of the third emission area EA3 may be greater than the areas of the first emission area EA1 and the second emission area EA2, and the area of the first emission area EA1 may be greater than the area of the second emission area EA2.

In the display device 10 having the arrangement of the emission areas EA1, EA2, and EA3 shown in FIG. 5, one first emission area EA1, two second emission areas EA2, and one third emission area EA3 that are adjacent to each other may form one pixel group. One pixel group may include the emission areas EA1, EA2, and EA3 for emitting light of different colors to express a white gray scale. However, the present disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed in the emission areas EA1, EA2, and EA3, or a plurality of opening holes OPT1, OPT2, and OPT3 of a light blocking layer BM disposed to correspond to the openings OPE1, OPE2, and OPE3, respectively. The opening holes OPT1, OPT2, and OPT3 of the light blocking layer may be formed to overlap with the openings OPE1, OPE2, and OPE3, and a light exit area from which the light emitted from the emission areas EA1, EA2, and EA3 is emitted may be formed. The color filters CF1, CF2, and CF3 may have areas greater than those of the openings OPE1, OPE2, and OPE3, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant, such as a dye or a pigment, that absorbs light in a wavelength band other than light in a suitable wavelength (e.g., a specific or predetermined wavelength) band, and may be disposed to correspond to the color of the light emitted from the emission areas EA1, EA2, and EA3. For example, the first color filter CF1 may be a red color filter that is disposed to overlap with the first emission area EA1, and transmits the first light of the red color. The second color filter CF2 may be a green color filter that is disposed to overlap with the second emission area EA2, and transmits the second light of the green color. The third color filter CF3 may be a blue color filter that is disposed to overlap with the third emission area EA3, and transmits the third light of the blue color.

Like the arrangement of the emission areas EA1, EA2, and EA3, the color filters CF1, CF2, and CF3 may be arranged in a diamond type (e.g., a PENTILE® type) of arrangement. For example, the first color filter CF1 and the third color filter CF3 may be alternately arranged in the first direction DR1 and the second direction DR2. In the arrangement of the color filters CF1, CF2, and CF3, the first color filter CF1 and the third color filter CF3 may be alternately arranged in the first direction DR1 in the first row R1 and the third row R3. In the first column C1 and the third column C3, the first color filter CF1 and the third color filter CF3 may be alternately arranged in the second direction DR2.

The second color filter CF2 and another adjacent second color filter CF2 may be arranged in the first direction DR1 and the second direction DR2, and the second color filter CF2 and an adjacent first color filter CF1 and an adjacent third color filter CF3 may be arranged in the fourth direction DR4 or the fifth direction DR5. The plurality of second color filters CF2 may be repeatedly arranged along the first direction DR1 and the second direction DR2, and the second color filter CF2 and the first color filter CF1, or the second color filter CF2 and the third color filter CF3 may be alternately arranged along the fourth direction DR4 or the fifth direction DR5. In the arrangement of the color filters CF1, CF2, and CF3, the second color filter CF2 may be repeatedly disposed in the first direction DR1 in the second row R2 and the fourth row R4, and the second color filter CF2 may be repeatedly disposed in the second direction DR2 in the column C2 and the fourth column C4.

Figure 7:
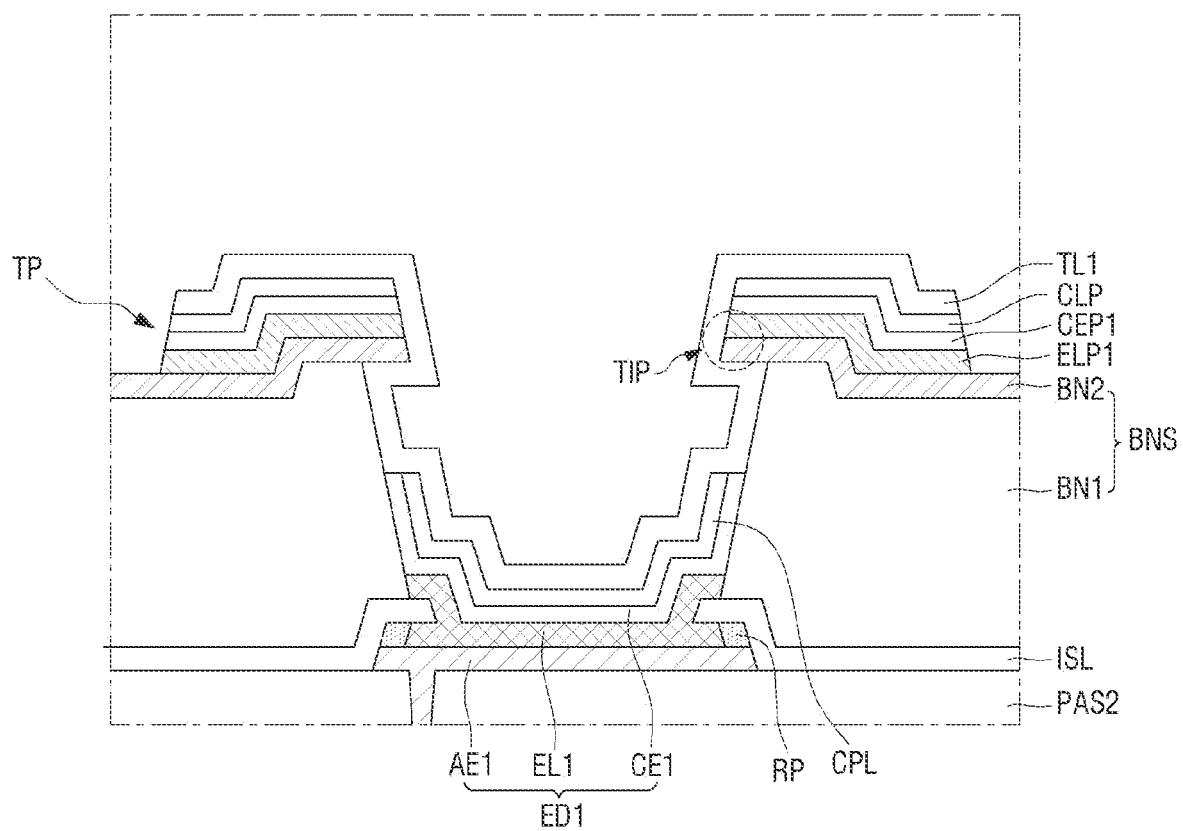
FIG. 7 is an enlarged view illustrating the first emission area of FIG. 6.

FIG. 6 is a cross-sectional view illustrating a part of a display device according to one or more embodiments. FIG. 7 is an enlarged view illustrating the first emission area of FIG. 6. FIG. 6, which is a partial cross-sectional view of the display device 10, illustrates a cross section of the substrate SUB, the thin film transistor layer TFTL, the light emitting element layer EML, and the thin film encapsulation layer TFEL of the display layer DU, the touch sensing layer TSU, and the color filter layer CFL. FIG. 7 illustrates a first light emitting element ED1 disposed in the first emission area EA1 in FIG. 6, and a part of the bank structure BNS adjacent thereto.

Referring to FIGS. 5, 6, and 7, the display panel 100 of the display device 10 may include the display layer DU. The display layer DU may include the substrate SUB, the thin film transistor layer TFTL, the light emitting element layer EML, and the thin film encapsulation layer TFEL. The display panel 100 may include the light blocking layer BM disposed on the thin film encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate that may be bent, folded or rolled. For example, the substrate SUB may include a polymer resin such as polyimide (PI), but is not limited thereto. As another example, the substrate SUB may include a glass material or a metal material.

The thin film transistor layer TFTL may include a first buffer layer BF1, a lower metal layer BML, a second buffer layer BF2, a first thin film transistor TFT1, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing or substantially preventing the penetration of air or moisture. For example, the first buffer layer BF1 may include a plurality of inorganic layers that are alternately stacked.

The lower metal layer BML may be disposed on the first buffer layer BF1. For example, the lower metal layer BML may be formed as a single layer or multiple layers including (e.g., made of) any one or more of molybdenum (Mo), aluminum (Al), chromium (Cr), gold (Au), titanium (Ti), nickel (Ni), neodymium (Nd), copper (Cu), or a suitable alloy thereof.

The second buffer layer BF2 may cover the first buffer layer BF1 and the lower metal layer BML. The second buffer layer BF2 may include an inorganic layer capable of preventing or substantially preventing the penetration of air or moisture. For example, the second buffer layer BF2 may include a plurality of inorganic layers that are alternately stacked.

The first thin film transistor TFT1 may be disposed on the second buffer layer BF2, and may be included in a corresponding pixel circuit of each of the plurality of pixels. For example, the first thin film transistor TFT1 may be a driving transistor or a switching transistor of a pixel circuit disposed in the display area DA. The first thin film transistor TFT1 may include a semiconductor layer ACT, a source electrode SE, a drain electrode DE, and a gate electrode GE.

The semiconductor layer ACT may be disposed on the second buffer layer BF2. The semiconductor layer ACT may overlap with the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and/or the drain electrode DE.

The gate electrode GE may be disposed on the gate insulating layer GI. The gate electrode GE may overlap with the semiconductor layer ACT, with the gate insulating layer GI interposed therebetween.

The gate insulating layer GI may be disposed on the semiconductor layer ACT. For example, the gate insulating layer GI may cover the semiconductor layer ACT and the second buffer layer BF2 to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap with the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the first thin film transistor TFT1 to the second connection electrode CNE2. The first connection electrode CNE1 may be inserted into a contact hole provided in (e.g., penetrating) the second interlayer insulating layer ILD2, the first interlayer insulating layer ILD1, and the gate insulating layer GI to be in contact with the drain electrode DE of the first thin film transistor TFT1.

The first passivation layer PAS1 may cover the first connection electrode CNE1 and the second interlayer insulating layer ILD2. The first passivation layer PAS1 may protect the first thin film transistor TFT1. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a corresponding anode electrode AE1, AE2, or AE3 of the corresponding light emitting element ED. The second connection electrode CNE2 may be inserted into a contact hole formed in (e.g., penetrating) the first passivation layer PAS1 to be in contact with the first connection electrode CNE1.

The second passivation layer PAS2 may cover the second connection electrode CNE2 and the first passivation layer PAS1. The second passivation layer PAS2 may include contact holes through which the anode electrodes AE1, AE2, and AE3 of the light emitting elements ED1, ED2, and ED3 pass.

The light emitting element layer EML may be disposed on the thin film transistor layer TFTL. The light emitting element layer EML may include the light emitting elements ED1, ED2, and ED3, and the plurality of bank structures BNS. The light emitting elements ED1, ED2, ED3 may include the anode electrodes AE1, AE2, and AE3, light emitting layers EL1, EL2, and EL3, and cathode electrodes CE1, CE2, and CE3.

The display device 10 may include the plurality of emission areas EA1, EA2, and EA3 disposed in the display area DA. The emission areas EA1, EA2, and EA3 may include a first emission area EA1, a second emission area EA2, and a third emission area EA3 for emitting light of different colors from each other. The first to third emission areas EA1, EA2, and EA3 may emit red, green, and blue light, respectively, and the color of the light emitted from each of the emission areas EA1, EA2, and EA3 may be different depending on the kind of the light emitting element ED disposed in the light emitting element layer EML. In an embodiment, the first emission area EA1 may emit first light of a red color, the second emission area EA2 may emit second light of a green color, and the third emission area EA3 may emit third light of a blue color. However, the present disclosure is not limited thereto.

The first to third emission areas EA1, EA2, and EA3 may be defined by a plurality of openings OPE1, OPE2, and OPE3, respectively, which are formed in (e.g., penetrate) the bank structure BNS of the light emitting element layer EML. For example, the first emission area EA1 may be defined by the first opening OPE1 of the bank structure BNS, the second emission area EA2 may be defined by the second opening OPE2 of the bank structure BNS, and the third emission area EA3 may be defined by the third opening OPE3 of the bank structure BNS.

In an embodiment, the areas or sizes of the first to third emission areas EA1, EA2, and EA3 may be the same or substantially the same as each other. For example, in the display device 10, the openings OPE1, OPE2, and OPE3 of the bank structures BNS may have the same or substantially the same diameter as each other, and the first emission area EA1, the second emission area EA2, and the third emission area EA3 may have the same or substantially the same area as each other. However, the present disclosure is not limited thereto. In the display device 10, the areas or sizes of the first to third emission areas EA1, EA2, and EA3 may be different from each other. For example, the areas of the second emission areas EA2 may be greater than the areas of the first emission areas EA1 and the third emission areas EA3, and the areas of the third emission areas EA3 may be greater than the areas of the first emission areas EA1. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. While FIG. 5 illustrates that the emission areas EA1, EA2, and EA3 have the same or substantially the same sized area as each other, the present disclosure is not limited thereto. The areas of the emission areas EA1, EA2, and EA3 may be freely adjusted according to the color of the screen desired by the display device 10 and the electronic device 1. In addition, the areas of the emission areas EA1, EA2, and EA3 may be related to a light efficiency and the lifespan of the light emitting element ED, and may have a trade-off relation with the reflection by external light. The areas of the emission areas EA1, EA2, and EA3 may be adjusted in consideration of one or more of the above factors.

In the display device 10, one first emission area EA1, one second emission area EA2, and one third emission area EA3 that are disposed adjacent to each other may form one pixel group. One pixel group may include the emission areas EA1, EA2, and EA3 for emitting light of different colors to express a white gray scale. However, the present disclosure is not limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of light emitting elements ED1, ED2, and ED3 disposed in the different emission areas EA1, EA2, and EA3. The light emitting elements ED1, ED2, and ED3 may include the first light emitting element ED1 disposed in the first emission area EA1, the second light emitting element ED2 disposed in the second emission area EA2, and the third light emitting element ED3 disposed in the third emission area EA3. The light emitting elements ED1, ED2, and ED3 may include the anode electrodes AE1, AE2, and AE3, the light emitting layers EL1, EL2, and EL3, and the cathode electrodes CE1, CE2, and CE3, respectively. The light emitting layers EL1, EL2, and EL3 disposed in the different emission areas EA1, EA2, and EA3 may emit different colored light depending on the materials of the light emitting layers EL1, EL2, and EL3. For example, the first light emitting element ED1 disposed in the first emission area EA1 may emit red light of a first color, the second light emitting element ED2 disposed in the second emission area EA2 may emit green light of a second color, and the third light emitting element ED3 disposed in the third emission area EA3 may emit blue light of a third color. The first to third emission areas EA1, EA2, and EA3 constituting one pixel may respectively include the light emitting elements ED1, ED2, and ED3 for emitting lights of different colors from each other to express a white gray scale.

The anode electrodes AE1, AE2, and AE3 may be disposed on the second passivation layer PAS2. The anode electrodes AE1, AE2, and AE3 may be disposed to overlap with any one of the openings OPE1, OPE2, and OPE3 of the bank structure BNS. The anode electrodes AE1, AE2, and AE3 may be electrically connected to the drain electrodes DE of the first thin film transistors TFT1 through the first and second connection electrodes CNE1 and CNE2.

The anode electrodes AE1, AE2, and AE3 may be disposed in the plurality of emission areas EA1, EA2, and EA3, respectively. The anode electrodes AE1, AE2, and AE3 may include a first anode electrode AE1 disposed in the first emission area EA1, a second anode electrode AE2 disposed in the second emission area EA2, and a third anode electrode AE3 disposed in the third emission area EA3. The first anode electrode AE1, the second anode electrode AE2, and the third anode electrode AE3 may be disposed to be spaced apart from each other on the second passivation layer PAS2. The anode electrodes AE1, AE2, and AE3 may be disposed in the different emission areas EA1, EA2, and EA3 to constitute the light emitting elements ED1, ED2, and ED3 for emitting lights of different colors from each other, respectively.

An inorganic insulating layer ISL may be disposed on the second passivation layer PAS2 and the anode electrodes AE1, AE2, and AE3. The inorganic insulating layer ISL may be disposed on the entirety or substantially on the entirety of the second passivation layer PAS2, and may partially overlap with the anode electrodes AE1, AE2, and AE3 to expose a part of the top surface of each of the anode electrodes AE1, AE2, and AE3. The inorganic insulating layer ISL may expose the anode electrodes AE1, AE2, and AE3 at the portions overlapping with the openings OPE1, OPE2, and OPE3 of the bank structure BNS, and the light emitting layers EL1, EL2, and EL3 disposed on the anode electrodes AE1, AE2, and AE3 may be directly disposed on the anode electrodes AE1, AE2, and AE3, respectively. The inorganic insulating layer ISL may include an inorganic insulating material. For example, the inorganic insulating layer ISL may include aluminum oxide, titanium oxide, tantalum oxide, hafnium oxide, zinc oxide, silicon oxide, silicon nitride, and/or silicon oxynitride.

In accordance with one or more embodiments, the inorganic insulating layer ISL may be disposed on the anode electrodes AE1, AE2, and AE3, and may be spaced apart from the top surfaces of the anode electrodes AE1, AE2, and AE3. The inorganic insulating layer ISL may partially overlap with the anode electrodes AE1, AE2, and AE3 without direct contact, and the light emitting layers EL1, EL2, and EL3 of the light emitting elements ED1, ED2, and ED3 may be partially disposed between the inorganic insulating layer ISL and the anode electrodes AE1, AE2, and AE3. In the manufacturing process of the display device 10, a sacrificial layer SFL (e.g., see FIG. 14) may be disposed on the anode electrodes AE1, AE2, and AE3 before the inorganic insulating layer ISL is formed. The inorganic insulating layer ISL may be disposed to cover a part of the sacrificial layer, and may be spaced apart from the top surfaces of the anode electrodes AE1, AE2, and AE3 by the removal of the sacrificial layer. The inorganic insulating layer ISL may have a shape protruding further toward the inside of the openings OPE1, OPE2, and OPE3 than that of a residual pattern RP. In the deposition process of the light emitting layers EL1, EL2, and EL3, the materials forming the light emitting layers EL1, EL2, and EL3 may fill the space between the inorganic insulating layer ISL and the anode electrodes AE1, AE2, and AE3, and the inorganic insulating layer ISL may be partially disposed on the light emitting layers EL1, EL2, and EL3. However, the inorganic insulating layer ISL may be in direct contact with side surfaces of the anode electrodes AE1, AE2, and AE3.

The display device 10 may include the plurality of bank structures BNS disposed on the thin film transistor layer TFTL or the substrate SUB, and including the plurality of openings OPE1, OPE2, and OPE3. The bank structure BNS may have a structure in which bank layers BN1 and BN2 including different materials from each other are sequentially stacked, and may include the plurality of openings OPE1, OPE2, and OPE3 respectively forming the emission areas EA1, EA2, and EA3. The light emitting elements ED1, ED2, and ED3 of the display device 10 may be disposed to overlap with the openings OPE1, OPE2, and OPE3 of the bank structure BNS.

The bank structure BNS may include the first bank layer BN1 disposed on the inorganic insulating layer ISL, and the second bank layer BN2 disposed on the first bank layer BN1.

In accordance with one or more embodiments, the first bank layer BN1 and the second bank layer BN2 may include different metal materials from each other, and the bank structure BNS may include a tip TIP in which the second bank layer BN2 protrudes from the first bank layer BN1 toward the openings OPE1, OPE2, and OPE3. In the bank structure BNS, the lateral side of the first bank layer BN1 may have a shape that is recessed inward from the lateral side of the second bank layer BN2. In the bank structure BNS, the first bank layer BN1 may be thicker than the second bank layer BN2, and the second bank layer BN2 may be relatively thinner, so that the tip TIP may be formed in the manufacturing process. Because the second bank layer BN2 has a shape protruding toward the openings OPE1, OPE2, and OPE3 more than that of the first bank layer BN1, an undercut may be formed under the tip TIP of the second bank layer BN2 on the inner sidewalls of the openings OPE1, OPE2, and OPE3 of the bank structure BNS.

The sidewall shape of the bank structure BNS may be a structure that is formed by a difference in etching rates in an etching process due to different materials of the first bank layer BN1 and the second bank layer BN2. In accordance with one or more embodiments, the second bank layer BN2 may include a material having an etching rate lower than that of the first bank layer BN1, and the first bank layer BN1 may be further etched in the process of forming the openings OPE1, OPE2, and OPE3 of the bank structure BNS to form the undercut under the tip TIP of the second bank layer BN2. In an embodiment, the first bank layer BN1 may include a metal material having high electrical conductivity, and the second bank layer BN2 may include a metal material having low reflectivity. For example, the first bank layer BN1 may include aluminum (Al), and the second bank layer BN2 may include titanium (Ti). The bank structure BNS may have a structure in which Al/Ti layers are stacked on the inorganic insulating layer ISL, and the tip TIP may be formed in the Ti layer of the second bank layer BN2.

The bank structure BNS may include the openings OPE1, OPE2, and OPE3 respectively forming the emission areas EA1, EA2, and EA3. The light blocking layer BM may be disposed on the bank structure BNS. The uppermost layer of the bank structure BNS may include a material having low reflectivity to reduce reflection of external light. Further, in the bank structure BNS, the first bank layer BN1 may be electrically connected to the cathode electrodes CE1, CE2, and CE3 of the different light emitting elements ED1, ED2, and ED3. In the light emitting elements ED1, ED2, and ED3 disposed in the different emission areas EA1, EA2, and EA3, the cathode electrodes CE1, CE2, and CE3 are not directly connected to each other, and may be electrically connected to each other through the first bank layer BN1.

In the manufacturing process of the display device 10, a mask process may be used to form a pixel defining layer for forming the emission areas EA1, EA2, and EA3 using an organic material, or to form the light emitting layers EL1, EL2, and EL3 of the light emitting elements ED1, ED2, and ED3 in the respective emission areas EA1, EA2, and EA3. In order to perform the mask process, the display device 10 may use a structure for mounting a mask, or a large area of the non-display area NDA may be used to control a variation according to the mask process. If such a mask process is minimized or omitted, an unnecessary component (e.g., the structure for mounting the mask) may be omitted in the display device 10, and the area of the non-display area NDA for controlling the variation may be minimized or reduced.

The display device 10 according to one or more embodiments includes the bank structure BNS for forming the emission areas EA1, EA2, and EA3, and the emission areas EA1, EA2, and EA3 may be formed by a deposition and etching process instead of the mask process. Further, the bank structure BNS includes the first bank layer BN1 and the second bank layer BN2 including different metal materials from each other, and having a structure including the tip TIP on the inner sidewalls of the openings OPE1, OPE2, and OPE3, so that it may be possible to separately form the different layers in the different emission areas EA1, EA2, and EA3 even by a deposition process. For example, even when the light emitting layers EL1, EL2, and EL3 of the light emitting elements ED1, ED2, and ED3 and the cathode electrodes CE1, CE2, and CE3 are formed by a deposition process without using a mask, the deposited materials may be disconnected from each other without being connected to each other between the openings OPE1, OPE2, and OPE3 by the tip TIP of the second bank layer BN2 formed on the inner sidewalls of the openings OPE1, OPE2, and OPE3. By a process of forming a material for forming a specific layer on the entire surface of the display device 10 and then removing part of the layer formed in an undesired region by etching, it may be possible to individually form different layers in the different emission areas EA1, EA2, and EA3. In the display device 10, the different light emitting elements ED1, ED2, and ED3 may be formed in the different emission areas EA1, EA2, and EA3 by the deposition and etching process without using the mask process, and an unnecessary component in the display device 10 may be omitted to minimize or reduce the area of the non-display area NDA.

A first encapsulation layer TFE1 of the thin film encapsulation layer TFEL may be disposed on the cathode electrodes CE1, CE2, and CE3 of the light emitting elements ED1, ED2, and ED3. The first encapsulation layer TFE1 may include a first inorganic layer TL1 disposed on the first light emitting element ED1, a second inorganic layer TL2 disposed on the second light emitting element ED2, and a third inorganic layer TL3 disposed on the third light emitting element ED3. The first to third inorganic layers TL1, TL2, and TL3 may be formed on the entire bank structure BNS, and may be disposed to cover the light emitting elements ED1, ED2, and ED3, organic patterns ELP1, ELP2, and ELP3 described in more detail below, and electrode patterns CEP1, CEP2, and CEP3 in the respective emission areas EA1, EA2, and EA3, without being disposed between the emission areas EA1, EA2, and EA3. The shape of the inorganic layers TL1, TL2, and TL3 may be formed by forming the inorganic layers TL1, TL2, and TL3 to completely cover the bank structure BNS, and then partially patterning the inorganic layers TL1, TL2, and TL3.

The display device 10 may include patterns that are traces of the deposition process and the shape of the bank structure BNS. The patterns may be formed concurrently (e.g., simultaneously or substantially simultaneously) with the light emitting layers EL1, EL2, and EL3 of the light emitting elements ED1, ED2, and ED3 and the cathode electrodes CE1, CE2, and CE3, and may remain on the bank structure BNS. Hereinafter, the structures of the light emitting layers EL1, EL2, and EL3, the cathode electrodes CE1, CE2, and CE3, and the patterns will be described in more detail.

The light emitting layers EL1, EL2, and EL3 may be disposed on the anode electrodes AE1, AE2, and AE3, respectively. The light emitting layers EL1, EL2, and EL3 may be organic light emitting layers including (e.g., made of) an organic material, and may be formed on the anode electrodes AE1, AE2, and AE3, respectively, by the deposition process. In the light emitting layers EL1, EL2, and EL3, when the first thin film transistor TFT1 applies a suitable voltage (e.g., a predetermined voltage) to the anode electrodes AE1, AE2, and AE3 of the light emitting elements ED1, ED2, and ED3, and the cathode electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

The light emitting layers EL1, EL2, and EL3 may include the first light emitting layer EL1, the second light emitting layer EL2, and the third light emitting layer EL3 disposed in the different emission areas EA1, EA2, and EA3 from each other. The first light emitting layer EL1 may be disposed on the first anode electrode AE1 in the first emission area EA1, the second light emitting layer EL2 may be disposed on the second anode electrode AE2 in the second emission area EA2, and the third light emitting layer EL3 may be disposed on the third anode electrode AE3 in the third emission area EA3. The first to third light emitting layers EL1, EL2, and EL3 may be light emitting layers of the first to third light emitting elements ED1, ED2 and ED3, respectively. The first light emitting layer EL1 may be the light emitting layer for emitting red light of the first color, the second light emitting layer EL2 may be the light emitting layer for emitting green light of the second color, and the third light emitting layer EL3 may be the light emitting layer for emitting blue light of the third color.

In accordance with one or more embodiments, the light emitting layers EL1, EL2, and EL3 of the light emitting elements ED1, ED2, and ED3 may be partially disposed between the anode electrodes AE1, AE2, and AE3 and the inorganic insulating layer ISL. The inorganic insulating layer ISL may be disposed on the anode electrodes AE1, AE2, and AE3, and may be spaced apart from the top surfaces of the anode electrodes AE1, AE2, and AE3. The deposition process of the light emitting layers EL1, EL2, and EL3 may be performed, such that the material of the light emitting layer is deposited in an inclined direction rather than in a direction perpendicular to or substantially perpendicular to the top surface of the substrate SUB. Accordingly, the light emitting layers EL1, EL2, and EL3 may be respectively disposed on the top surfaces of the anode electrodes AE1, AE2, and AE3 exposed through the openings OPE1, OPE2, and OPE3 of the bank structure BNS, to fill the space between the anode electrodes AE1, AE2, and AE3 and the inorganic insulating layer ISL.

As described above, in the manufacturing process of the display device 10, the sacrificial layer SFL (e.g., see FIG. 14) may be disposed between the inorganic insulating layer ISL and the anode electrodes AE1, AE2, and AE3. The light emitting layers EL1, EL2, and EL3 may be disposed in a region where the sacrificial layer SFL is partially removed. Accordingly, the bottom surface of the inorganic insulating layer ISL may be spaced apart from the anode electrodes AE1, AE2, and AE3. However, the sacrificial layer SFL may remain as a partial residual pattern RP in the region between the inorganic insulating layer ISL and the anode electrodes AE1, AE2, and AE3. The region between the inorganic insulating layer ISL and the anode electrodes AE1, AE2, and AE3 may be filled with the partial residual pattern RP and the light emitting layers EL1, EL2, and EL3.

The display device 10 according to one or more embodiments may include the plurality of organic patterns ELP1, ELP2, and ELP3 including the same or substantially the same material as those of the light emitting layers EL1, EL2, and EL3, and disposed on the bank structure BNS. Because the light emitting layers EL1, EL2, and EL3 are formed by a process of depositing materials on the entire surface of the display device 10, the materials forming the light emitting layers EL1, EL2, and EL3 may also be deposited on the bank structure BNS, in addition to in the openings OPE1, OPE2, and OPE3 of the bank structure BNS.

For example, the display device 10 may include the organic patterns ELP1, ELP2, and ELP3 disposed on the bank structure BNS. The organic patterns ELP1, ELP2, and ELP3 may include the first organic pattern ELP1, the second organic pattern ELP2, and the third organic pattern ELP3 that are disposed on the second bank layer BN2 of the bank structure BNS.

The first organic pattern ELP1 may include the same material as that of the first light emitting layer EL1 of the first light emitting element ED1. The second organic pattern ELP2 may include the same material as that of the second light emitting layer EL2 of the second light emitting element ED2. The third organic pattern ELP3 may include the same material as that of the third light emitting layer EL3 of the third light emitting element ED3. The organic patterns ELP1, ELP2, and ELP3 may be formed in the same process as the process of forming the light emitting layers EL1, EL2, and EL3 including the same material as those of the organic patterns ELP1, ELP2, and ELP3.

The first organic pattern ELP1, the second organic pattern ELP2, and the third organic pattern ELP3 may be directly disposed on the second bank layer BN2 of the bank structure BNS. The organic patterns ELP1, ELP2, and ELP3 may be formed in the same process as the process of forming the light emitting layers EL1, EL2, and EL3 including the same material as those of the organic patterns ELP1, ELP2, and ELP3, and may be disposed near (e.g., adjacent to) the emission areas EA1, EA2, and EA3 in which the light emitting layers EL1, EL2, and EL3 are disposed, respectively. For example, the first organic pattern ELP1 may be disposed on the second bank layer BN2, while surrounding (e.g., around a periphery of) the first opening OPE1 near (e.g., adjacent to) the first opening OPE1 or the first emission area EA1. The second organic pattern ELP2 may be disposed on the second bank layer BN2, while surrounding (e.g., around a periphery of) the second opening OPE2 near (e.g., adjacent to) the second opening OPE2 or the second emission area EA2. The third organic pattern ELP3 may be disposed on the second bank layer BN2, while surrounding (e.g., around a periphery of) the third opening OPE3 near (e.g., adjacent to) the third opening OPE3 or the third emission area EA3.

The organic patterns ELP1, ELP2, and ELP3 may be traces formed, because they are disconnected without being connected with the light emitting layers EL1, EL2, and EL3 due to the tip TIP of the bank structure BNS. The light emitting layers EL1, EL2, and EL3 may be formed in the openings OPE1, OPE2, and OPE3, respectively, and the organic patterns ELP1, ELP2, and ELP3 and the light emitting layers EL1, EL2, and EL3 may be disconnected from each other by the tip TIP formed on the sidewalls of the openings OPE1, OPE2, and OPE3. Because the light emitting layers EL1, EL2, and EL3 are formed by the deposition process without using a mask, the materials of the light emitting layers EL1, EL2, and EL3 may be formed on the entire bank structure BNS. The organic patterns ELP1, ELP2, and ELP3 may be formed by patterning them near (e.g., adjacent to) the emission areas EA1, EA2, and EA3 or the openings OPE1, OPE2, and OPE3.

The cathode electrodes CE1, CE2, and CE3 may be disposed on the light emitting layers EL1, EL2, and EL3, respectively. The cathode electrodes CE1, CE2, and CE3 may include a transparent conductive material, so that light generated in the light emitting layers EL1, EL2, and EL3 may be emitted. The cathode electrodes CE1, CE2, and CE3 may receive a common voltage or a low potential voltage. When the anode electrodes AE1, AE2, and AE3 receive the voltage corresponding to a data voltage and the cathode electrodes CE1, CE2, and CE3 receive the low potential voltage, a potential difference is formed between the anode electrodes AE1, AE2, and AE3 and the cathode electrodes CE1, CE2, and CE3, so that the light emitting layers EL1, ED2, and ED3 may emit light.

The cathode electrodes CE1, CE2, and CE3 may include the first cathode electrode CE1, the second cathode electrode CE2, and the third cathode electrode CE3 disposed in the different emission areas EA1, EA2, and EA3. The first cathode electrode CE1 may be disposed on the first light emitting layer EL1 in the first emission area EA1, the second cathode electrode CE2 may be disposed on the second light emitting layer EL2 in the second emission area EA2, and the third cathode electrode CE3 may be disposed on the third light emitting layer EL3 in the third emission area EA3.

In accordance with one or more embodiments, the cathode electrodes CE1, CE2, and CE3 of the light emitting elements ED1, ED2, and ED3 may be partially disposed on the side surface of the first bank layer BN1 of the bank structure BNS. Similar to the light emitting layers EL1, EL2, and EL3, the cathode electrodes CE1, CE2, and CE3 may also be formed by a deposition process. The deposition process of the cathode electrodes CE1, CE2, and CE3 may be performed, such that the electrode material is deposited in an inclined direction rather than in a direction perpendicular to or substantially perpendicular to the top surface of the substrate SUB. Accordingly, the cathode electrodes CE1, CE2, and CE3 may be disposed on the side surface of the first bank layer BN1 under the tip TIP of the second bank layer BN2 of the bank structure BNS. The cathode electrodes CE1, CE2, and CE3 may be in direct contact with the side surface of the first bank layer BN1. The cathode electrodes CE1, CE2, and CE3 of the different light emitting elements ED1, ED2, and ED3 may be in direct contact with the first bank layer BN1 of the bank structure BNS, and the cathode electrodes CE1, CE2, and CE3 may be electrically connected to each other. Unlike the anode electrodes AE1, AE2, and AE3, the cathode electrodes CE1, CE2, and CE3 may be implemented in the form of an electrode that is electrically common to all the pixels, without being divided for a plurality of pixels.

In accordance with one or more embodiments, the contact area between the cathode electrodes CE1, CE2, and CE3 and the side surface of the first bank layer BN1 may be greater than the contact area between the light emitting layers EL1, EL2, and EL3 and the side surface of the first bank layer BN1. The cathode electrodes CE1, CE2, and CE3 and the light emitting layers EL1, EL2, and EL3 are formed, such that the materials thereof are deposited in an inclined direction rather than in a direction perpendicular to or substantially perpendicular to the top surface of the substrate SUB, and the area disposed on the side surface of the first bank layer BN1 may vary depending on the inclined angle. In an embodiment, the deposition process of the cathode electrodes CE1, CE2, and CE3 may be performed in a more inclined direction than that of the deposition process of the light emitting layers EL1, EL2, and EL3. The cathode electrodes CE1, CE2, and CE3 may be disposed in larger areas on the sidewalls of the openings OPE1, OPE2, and OPE3 compared to that of the light emitting layers EL1, EL2, and EL3, or may be located at higher positions on the sidewalls of the openings OPE1, OPE2, and OPE3 compared to the light emitting layers EL1, EL2, and EL3. Because the cathode electrodes CE1, CE2, and CE3 of the different light emitting elements ED1, ED2, and ED3 are electrically connected to each other through the first bank layer BN1, it may be desired that they are in contact with the first bank layer BN1 in larger areas.

The display device 10 according to one or more embodiments may include a plurality of electrode patterns CEP1, CPE2, and CEP3 including the same material as those of the cathode electrodes CE1, CE2, and CE3 and disposed on the bank structure BNS. Because the cathode electrodes CE1, CE2, and CE3 are formed by a process of depositing a material on the entire surface of the display device 10, the material forming the cathode electrodes CE1, CE2, and CE3 may also be deposited on the bank structure BNS in addition to in the openings OPE1, OPE2, and OPE3 of the bank structure BNS.

The display device 10 may include the electrode patterns CEP1, CPE2, and CEP3 disposed above the bank structure BNS. The electrode patterns CEP1, CPE2, and CEP3 may include the first electrode pattern CEP1, the second electrode pattern CEP2, and the third electrode pattern CEP3 disposed on the second bank layer BN2 of the bank structure BNS.

For example, the first electrode pattern CEP1, the second electrode pattern CEP2, and the third electrode pattern CEP3 may be directly disposed on the first organic pattern ELP1, the second organic pattern ELP2, and the third organic pattern ELP3, respectively. The arrangement relationship of the electrode patterns CEP1, CPE2, and CEP3 and the organic patterns ELP1, ELP2, and ELP3 may be the same or substantially the same as the arrangement relationship of the light emitting layers EL1, EL2, and EL3 of the light emitting elements ED1, ED2, and ED3 and the cathode electrodes CE1, CE2, and CE3. The electrode patterns CEP1, CPE2, and CEP3 may be traces formed, because the deposited material is disconnected without being connected with the cathode electrodes CE1, CE2, and CE3 due to the tip TIP of the bank structure BNS. In the display device 10, the cathode electrodes CE1, CE2, and CE3 may be individually formed in different areas from each other, even in a deposition process without using a mask, due to the tip TIP of the bank structure BNS.

A capping layer CPL may be disposed on the cathode electrodes CE1, CE2, and CE3. The capping layer CPL may include an inorganic insulating material to cover the patterns disposed on the bank structure BNS and the light emitting elements ED1, ED2, and ED3. The capping layer CPL may prevent or substantially prevent the light emitting elements ED1, ED2, and ED3 from being damaged by external air, and may prevent or substantially prevent the patterns disposed on the bank structure BNS from being peeled off during the manufacturing process of the display device 10. In an embodiment, the capping layer CPL may include aluminum oxide, titanium oxide, tantalum oxide, hafnium oxide, zinc oxide, silicon oxide, silicon nitride, and/or silicon oxynitride.

The display device 10 may include a capping pattern CLP disposed on the bank structure BNS. The capping pattern CLP may be directly disposed on the first electrode pattern CEP1, the second electrode pattern CEP2, and the third electrode pattern CEP3 disposed on the second bank layer BN2 of the bank structure BNS. The arrangement relationship of the capping pattern CLP and the electrode patterns CEP1, CEP2, and CEP3 may be the same or substantially the same as the arrangement relationship of the cathode electrodes CE1, CE2, and CE3 of the light emitting elements ED1, ED2, and ED3 and the capping layer CPL. The capping pattern CLP may be a trace formed, because the deposited material is disconnected without being connected with the capping layer CPL due to the tip TIP of the bank structure BNS.

The plurality of organic patterns ELP1, ELP2, and ELP3, the electrode patterns CEP1, CPE2, and CEP3, and the capping pattern CLP may be disposed on the bank structure BNS, and may be disposed to surround around the peripheries of the emission areas EA1, EA2, and EA3 or the openings OPE1, OPE2, and OPE3, respectively. The stacked structure of the organic patterns ELP1, ELP2, and ELP3, the electrode patterns CEP1, CPE2, and CEP3, and the capping pattern CLP disposed around (e.g., adjacent to) the emission areas EA1, EA2, and EA3 may be partially etched in the manufacturing process of the display device 10, so that the pattern shape may be changed. Accordingly, a part of the top surface of the second bank layer BN2 of the bank structure BNS may not be covered by the organic patterns ELP1, ELP2, and ELP3, the electrode patterns CEP1, CPE2, and CEP3, and the capping pattern CLP.

The thin film encapsulation layer TFEL may be disposed on the light emitting elements ED1, ED2, and ED3 and the bank structure BNS, and may cover the plurality of light emitting elements ED1, ED2, and ED3 and the bank structure BNS. The thin film encapsulation layer TFEL may include at least one inorganic layer to prevent or substantially prevent oxygen or moisture from permeating into the light emitting element layer EML. The thin film encapsulation layer TFEL may include at least one organic layer to protect the light emitting element layer EML from foreign substances, such as dust.

In an embodiment, the thin film encapsulation layer TFEL may include the first encapsulation layer TFE1, the second encapsulation layer TFE2, and the third encapsulation layer TFE3 that are sequentially stacked. The first encapsulation layer TFE1 and the third encapsulation layer TFE3 may be inorganic encapsulation layers, and the second encapsulation layer TFE2 that is disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene, and the like. For example, the second encapsulation layer TFE2 may include an acrylic resin, for example, such as polymethyl methacrylate, polyacrylic acid, or the like. The second encapsulation layer TFE2 may be formed by curing a monomer or applying a polymer.

The first encapsulation layer TFE1 may be disposed on the light emitting elements ED1, ED2, and ED3, the plurality of patterns, and the bank structure BNS. The first encapsulation layer TFE1 may include the first inorganic layer TL1, the second inorganic layer TL2, and the third inorganic layer TL3, which are disposed to correspond to the different emission areas EA1, EA2, and EA3, respectively.

The first inorganic layer TL1, the second inorganic layer TL2, and the third inorganic layer TL3 may include an inorganic insulating material to cover the light emitting elements ED1, ED2, and ED3, respectively. The first inorganic layer TL1, the second inorganic layer TL2, and the third inorganic layer TL3 may prevent or substantially prevent the light emitting elements ED1, ED2, and ED3 from being damaged by external air, and may prevent or substantially prevent the patterns disposed on the bank structure BNS from being peeled off during the manufacturing process of the display device 10. In an embodiment, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may be disposed to cover the organic patterns ELP1, ELP2, and ELP3, the electrode patterns CEP1, CPE2, and CEP3, and the capping pattern CLP. Because the first inorganic layer TL1, the second inorganic layer TL2, and the third inorganic layer TL3 may be formed by a chemical vapor deposition (CVD) method, they may be formed to have a uniform or substantially uniform thickness along a stepped portion of the deposited layers. For example, the first inorganic layer TL1, the second inorganic layer TL2, and the third inorganic layer TL3 may form thin films even under the undercut by the tip TIP of the bank structure BNS.

The first inorganic layer TL1 may be disposed on the first light emitting element ED1 and the first electrode pattern CEP1. The first inorganic layer TL1 may be disposed to cover the first light emitting element ED1 and the first opening OPE1 along the inner sidewalls thereof, and may also be disposed to cover the first organic pattern ELP1, the first electrode pattern CEP1, and the capping pattern CLP. However, the first inorganic layer TL1 may not overlap with the second opening OPE2 and the third opening OPE3, and may be disposed on the first opening OPE1 and the bank structure BNS adjacent thereto.

The second inorganic layer TL2 may be disposed on the second light emitting element ED2 and the second electrode pattern CEP2. The second inorganic layer TL2 may be disposed to cover the second light emitting element ED2 and the second opening OPE2 along the inner sidewalls thereof, and may also be disposed to cover the second organic pattern ELP2, the second electrode pattern CEP2, and the capping pattern CLP. However, the second inorganic layer TL2 may not overlap with the first opening OPE1 and the third opening OPE3, and may be disposed on the second opening OPE2 and the bank structure BNS adjacent thereto.

The third inorganic layer TL3 may be disposed on the third light emitting element ED3 and the third electrode pattern CEP3. The third inorganic layer TL3 may be disposed along the inner sidewalls of the third light emitting element ED3 and the third opening OPE3 to cover them, and may also be disposed to cover the third organic pattern ELP3, the third electrode pattern CEP3, and the capping pattern CLP. However, the third inorganic layer TL3 may not overlap with the first opening OPE1 and the second opening OPE2, and may be disposed on the third opening OPE3 and the bank structure BNS adjacent thereto.

The first inorganic layer TL1 may be formed after the first cathode electrode CE1 is formed. The second inorganic layer TL2 may be formed after the second cathode electrode CE2 is formed. The third inorganic layer TL3 may be formed after the third cathode electrode CE3 is formed. Accordingly, the first to third inorganic layers TL1, TL2, and TL3 may be disposed to cover the different electrode patterns CEP1, CPE2, and CEP3 and the organic patterns ELP1, ELP2, and ELP3, respectively. In a plan view, the first inorganic layer TL1, the second inorganic layer TL2, and the third inorganic layer TL3 may have larger areas than those of the openings OPE1, OPE2, and OPE3 of the bank structure BNS, respectively. The first inorganic layer TL1, the second inorganic layer TL2, and the third inorganic layer TL3 may be spaced apart from each other on the bank structure BNS. Accordingly, a part of the second bank layer BN2 of the bank structure BNS may not overlap with the inorganic layers TL1, TL2, and TL3, and a part of the top surface thereof may be exposed without being covered by the inorganic layers TL1, TL2, and TL3. A part of the second bank layer BN2 may be in direct contact with the second encapsulation layer TFE2 of the thin film encapsulation layer TFEL, which will be described in more detail below.

The touch sensing layer TSU may be disposed on the encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the encapsulation layer TFEL. The first touch insulating layer SIL1 may have an insulating and optical function. The first touch insulating layer SIL1 may include at least one inorganic layer. However, the present disclosure is not limited thereto, and the first touch insulating layer SIL1 may be omitted as needed or desired.

The second touch insulating layer SIL2 may cover the first touch insulating layer SIL1. A touch electrode of another layer may be further disposed on the first touch insulating layer SIL1, and the second touch insulating layer SIL2 may cover the touch electrode TEL. The second touch insulating layer SIL2 may have an insulating and optical function. For example, the second touch insulating layer SIL2 may be an inorganic layer containing at least one of a silicon nitride layer, a silicon oxynitride layer, a silicon oxide layer, a titanium oxide layer, or an aluminum oxide layer.

A part of the touch electrode TEL may be disposed on the second touch insulating layer SIL2. The touch electrode TEL may not overlap with the first to third emission areas EA1, EA2, and EA3. The touch electrode TEL may be formed of a single layer containing molybdenum (Mo), titanium (Ti), copper (Cu), aluminum (Al), or indium tin oxide (ITO), or may be formed to have a stacked structure (e.g., Ti/Al/Ti) of aluminum and titanium, a stacked structure (e.g., ITO/Al/ITO) of aluminum and ITO, an Ag—Pd—Cu (APC) alloy, or a stacked structure (e.g., ITO/APC/ITO) of APC alloy and ITO.

The third touch insulating layer SIL3 may cover the touch electrode TEL and the second touch insulating layer SIL2. The third touch insulating layer SIL3 may have an insulating and optical function. The third touch insulating layer SIL3 may include (e.g., may be made of) one or more of the materials described above with reference to the second touch insulating layer SIL2.

The light blocking layer BM may be disposed on the touch sensing layer TSU. The light blocking layer BM may include the plurality of opening holes OPT1, OPT2, and OPT3 disposed to overlap with the emission areas EA1, EA2, and EA3. For example, the first opening hole OPT1 may be disposed to overlap with the first emission area EA1. The second opening hole OPT2 may be disposed to overlap with the second emission area EA2. The third opening hole OPT3 may be disposed to overlap with the third emission area EA3. The areas or sizes of the opening holes OPT1, OPT2, and OPT3 may be larger than the areas or sizes of the emission areas EA1, EA2, and EA3 defined by the bank structure BNS, respectively. The opening holes OPT1, OPT2, and OPT3 of the light blocking layer BM are formed to be larger than the emission areas EA1, EA2, and EA3, so that light emitted from the emission areas EA1, EA2, and EA3 may be visually recognized by the user from the front surface as well as from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but is not limited thereto. The light blocking layer BM may prevent or substantially prevent visible light infiltration and color mixture between the first to third emission areas EA1, EA2, and EA3, which leads to an improvement of color reproducibility of the display device 10.

The display device 10 may include the plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed on the light blocking layer BM including the plurality of opening holes OPT1, OPT2, and OPT3 disposed to correspond to the emission areas EA1, EA2, and EA3, respectively. The holes of the light blocking layer may be formed to overlap with the emission areas EA1, EA2, and EA3, or the openings of the bank structures BNS, and may form a light exit area from which the light emitted from the emission areas EA1, EA2, and EA3 is emitted. The color filters CF1, CF2, and CF3 may have areas larger than those of the holes of the light blocking layer BM, and the color filters CF1, CF2, and CF3 may completely cover the light exit area formed by the holes.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a suitable colorant, such as a dye or a pigment, that absorbs light in a wavelength band other than light in a suitable wavelength (e.g., a specific or predetermined wavelength) band, and may be disposed to correspond to the color of light emitted from the emission areas EA1, EA2, and EA3. For example, the first color filter CF1 may be a red color filter that is disposed to overlap with the first emission area EA1, and transmits the first light of the red color. The second color filter CF2 may be a green color filter that is disposed to overlap with the second emission area EA2, and transmits the second light of the green color. The third color filter CF3 may be a blue color filter that is disposed to overlap with the third emission area EA3, and transmits the third light of the blue color.

The plurality of color filters CF1, CF2, and CF3 may be spaced apart from other adjacent color filters CF1, CF2, and CF3 on the light blocking layer BM. The color filters CF1, CF2, and CF3 may have areas larger than those of the opening holes OPT1, OPT2, and OPT3 of the light blocking layer BM, respectively, while covering the holes, and may have areas small enough to be spaced apart from other color filters CF1, CF2, and CF3 on the light blocking layer BM. However, the present disclosure is not limited thereto. The plurality of color filters CF1, CF2, and CF3 may be disposed to partially overlap with other adjacent color filters CF1, CF2, and CF3. The different color filters CF1, CF2, and CF3 are areas that do not overlap with the emission areas EA1, EA2, and EA3, and may overlap with each other on the light blocking layer BM to be described in more detail below. In the display device 10, the color filters CF1, CF2, and CF3 are disposed to overlap with each other, so that the intensity of the reflected light by external light may be reduced. Furthermore, the color of the reflected light by the external light may be controlled by adjusting the disposition, shape, and area of the color filters CF1, CF2, and CF3 in a plan view.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 or openings OPE1, OPE2, and OPE3, and the opening holes OPT1, OPT2, and OPT3 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first opening hole OPT1 of the light blocking layer BM, the second color filter CF2 may be disposed in the second opening hole OPT2 of the light blocking layer BM, and the third color filter CF3 may be disposed in the third opening hole OPT3 of the light blocking layer BM. Each of the color filters CF1, CF2, and CF3 may be disposed to have a larger area in a plan view than that of the opening holes OPT1, OPT2, and OPT3 of the light blocking layer BM, and some may be disposed directly on the light blocking layer BM.

An overcoat layer OC may be disposed on the color filters CF1, CF2, and CF3 to planarize or substantially planarize the top ends (e.g., top surfaces) of the color filters CF1, CF2, and CF3. The overcoat layer OC may be a colorless light transmissive layer that does not have a color in a visible light band. For example, the overcoat layer OC may include a colorless light transmissive organic material, such as an acrylic resin.

In the display device 10, the plurality of light emitting elements ED1, ED2, and ED3 disposed in the display area DA may be arranged in the emission areas EA1, EA2, and EA3 formed by the bank structures BNS. As described above, the cathode electrodes CE1, CE2, and CE3 of the light emitting elements ED1, ED2, and ED3 may be electrically connected to each other through the first bank layer BN1 of the bank structure BNS. The cathode electrodes CE1, CE2, and CE3 of the light emitting elements ED1, ED2, and ED3 and the first bank layer BN1 may form a common electrode in the display area DA.

In the display device 10, the bank structure BNS may be disposed beyond the display area DA to the non-display area NDA. The first bank layer BN1 of the bank structure BNS may form a common electrode with the cathode electrodes CE1, CE2, and CE3 of the light emitting elements ED1, ED2, and ED3, may extend to the non-display area NDA, and may be electrically connected to the first power line VL1 disposed in the non-display area NDA. Accordingly, the light emitting elements ED1, ED2, and ED3 may be electrically connected to the first power line VL1 disposed in the non-display area NDA, and may receive a low potential voltage through the first power line VL1. In addition, the light emitting elements ED1, ED2, and ED3 may be electrically connected to the first thin film transistors TFT1 of the thin film transistor layer TFTL, and may receive a power voltage (e.g., a high potential voltage) through the second power line VL2 disposed in the display area DA. Hereinafter, the structure of the non-display area NDA of the display device 10 will be described in more detail.

Figure 8:
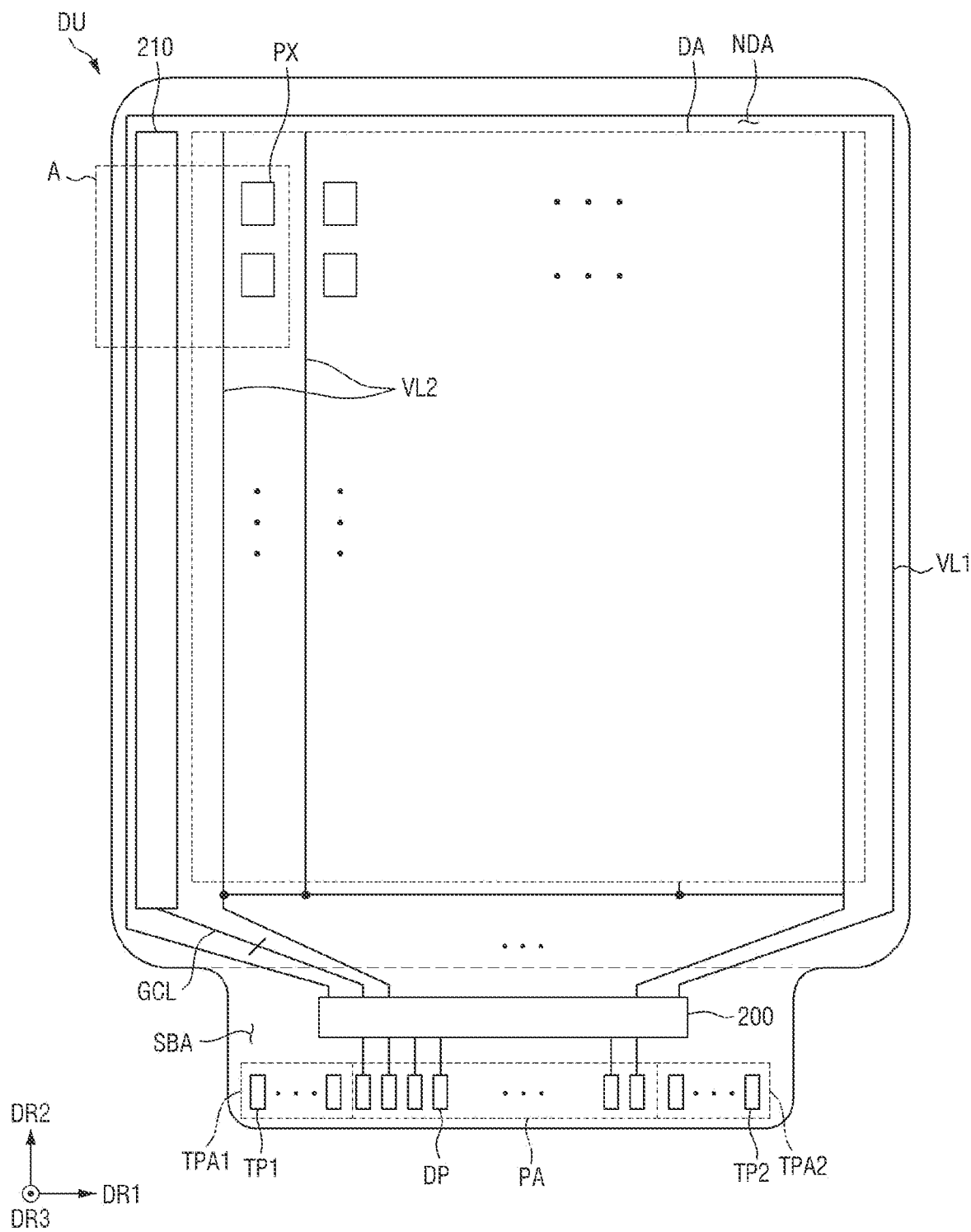
FIG. 8 is a plan view illustrating a layout of power lines disposed in a display device according to one or more embodiments.

FIG. 8 is a plan view illustrating a layout of power lines disposed in a display device according to one or more embodiments.

Referring to FIG. 8, the display layer DU of the display device 10 may include the display area DA, and the non-display area NDA surrounding (e.g., around a periphery of) the display area DA. As described above with reference to FIG. 4, the plurality of pixels PX and a plurality of wires (e.g., the second power lines VL2, the gate lines GL, and the data lines DL) may be disposed in the display area DA. The display driver 200, the gate driver 210, the plurality of display pad portions DP, and the first power line VL1 may be disposed in the non-display area NDA.

The first power line VL1 may be disposed in the non-display area NDA, while surrounding (e.g., around a periphery of) the display area DA. The first power line VL1 may be electrically connected to the display driver 200 in the non-display area NDA disposed below the display area DA, and may include portions extending in the first and second directions DR1 and DR2 to surround (e.g., around a periphery of) the display area DA. The first power line VL1 may be electrically connected to the bank structure BNS at the left and right outer portions of the display layer DU. The first power line VL1 may be electrically connected to the plurality of pixels PX of the display area DA through the bank structure BNS.

The second power line VL2 may extend in the second direction DR2, and may be disposed in the display area DA. The second power line VL2 may be electrically connected to the display driver 200 in the non-display area NDA disposed below the display area DA. The display device 10 may include the plurality of second power lines VL2, and the plurality of second power lines VL2 may be spaced apart from each other in the first direction DR1 in the display area DA. The second power line VL2 may be electrically connected to the first thin film transistor TFT1 in the display area DA. The second power line VL2 may be electrically connected to the plurality of pixels PX of the display area DA through the first thin film transistors TFT1.

For example, the second power line VL2 may be electrically connected to the anode electrodes AE1, AE2, and AE3 of the plurality of light emitting elements ED1, ED2, and ED3 disposed in the display area DA through the first thin film transistors TFT1. The light emitting elements ED1, ED2, and ED3 may receive a high potential voltage through the second power line VL2. The first power line VL1 may be electrically connected to the first bank layer BN1 of the bank structure BNS, and may be electrically connected to the light emitting elements ED1, ED2, and ED3 through the first bank layer BN1. The cathode electrodes CE1, CE2, and CE3 of the light emitting elements ED1, ED2, and ED3 may form a common electrode with the first bank layer BN1 of the bank structure BNS, and may receive a low potential voltage through the first power line VL1. The bank structure BNS may include the plurality of openings OPE1, OPE2, and OPE3 disposed in the display area DA to form the emission areas EA1, EA2, and EA3 in which the light emitting elements ED1, ED2, and ED3 are disposed. In addition, the bank structure BNS may extend beyond the display area DA to the non-display area NDA, may overlap with the gate driver 210 in the non-display area NDA, and may be electrically connected to the first power line VL1.

Figure 9:
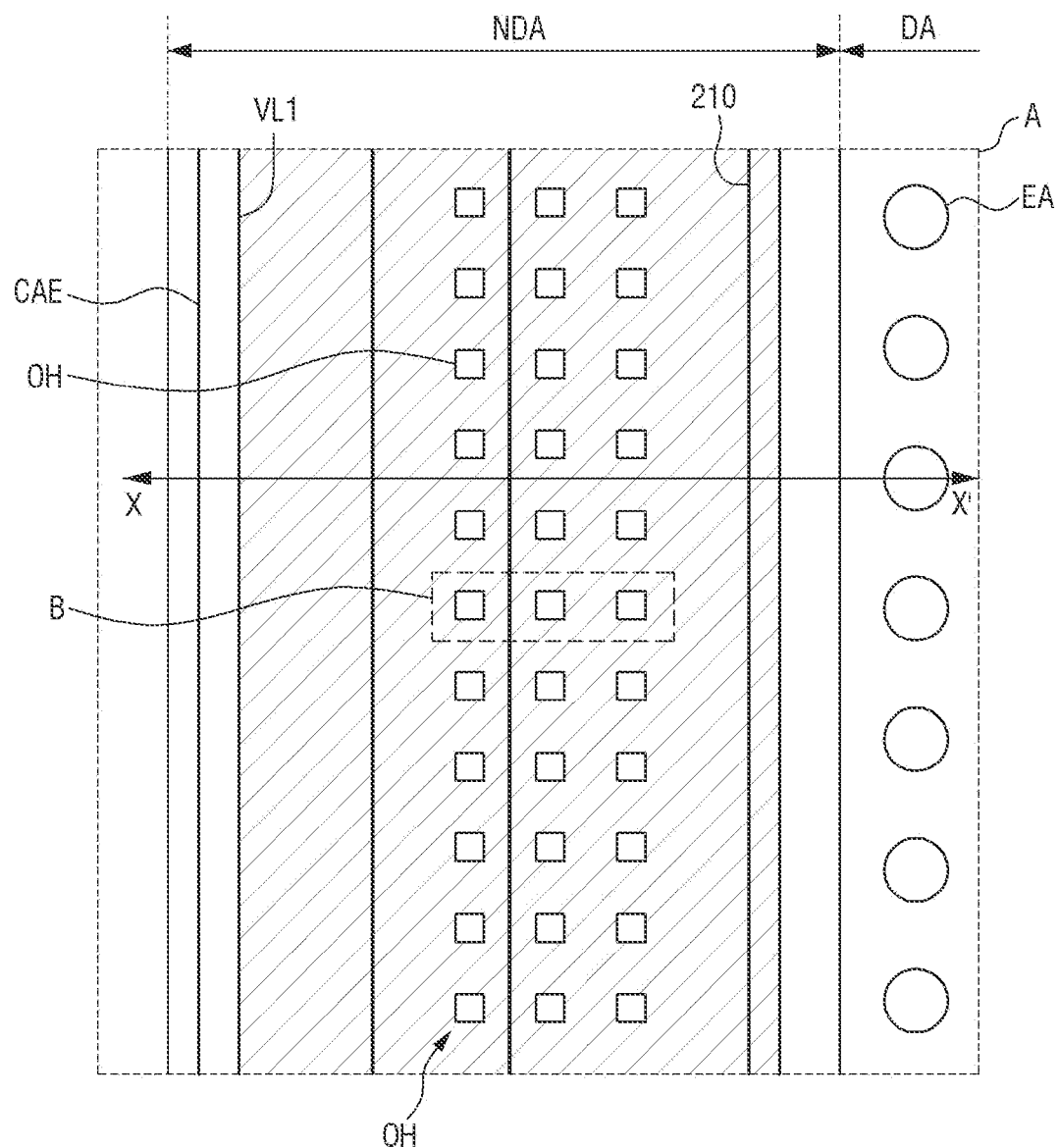
FIG. 9 is an enlarged view schematically showing the portion A of FIG. 8.
Figure 10:
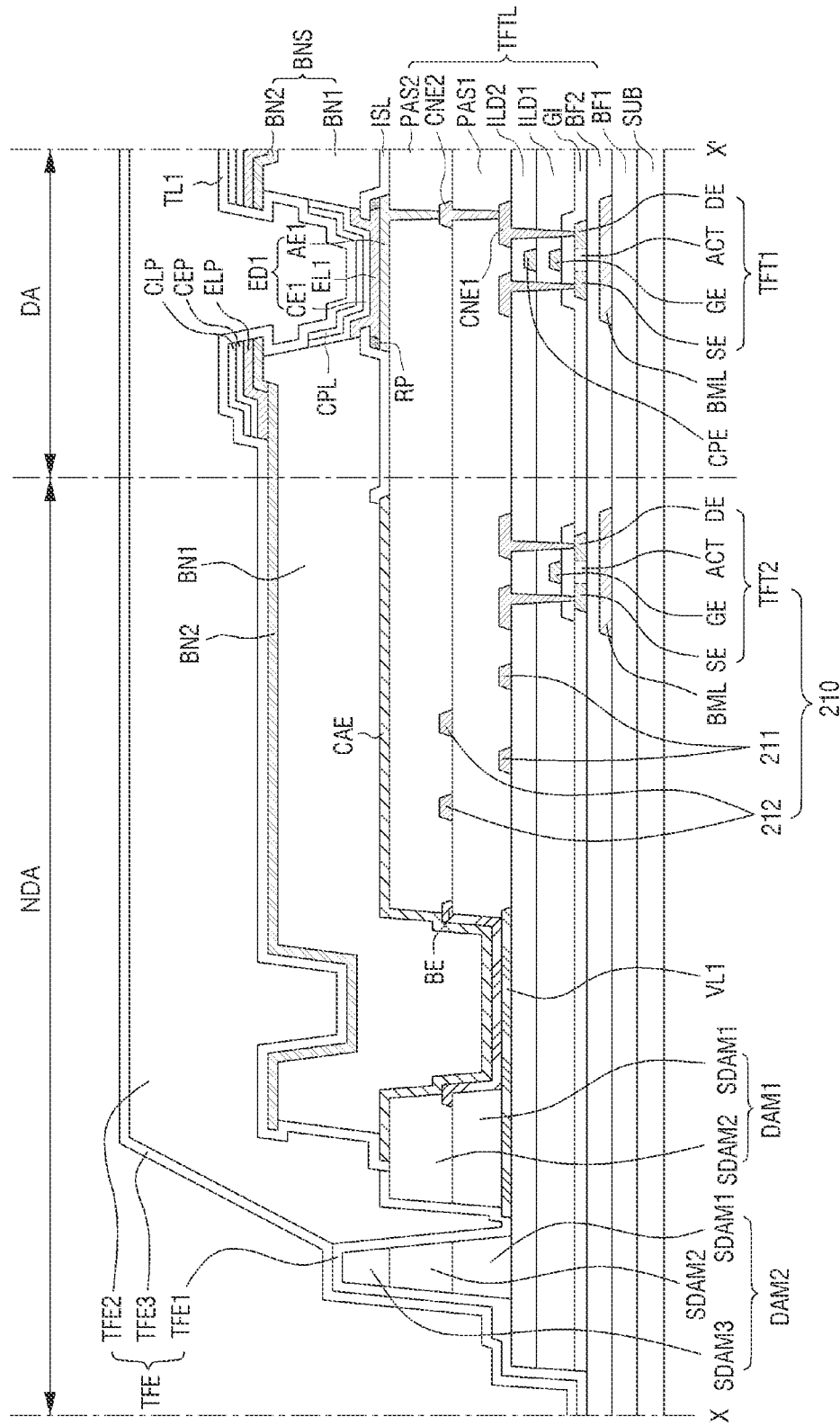
FIG. 10 is a cross-sectional view taken along the line X-X' of FIG. 9.

FIG. 9 is an enlarged view schematically showing the portion A of FIG. 8. FIG. 10 is a cross-sectional view taken along the line X-X' of FIG. 9. FIG. 9 is an enlarged view of a part of the non-display area NDA disposed to the left side of the display area DA. FIG. 10 illustrates a cross section of a part of the display area DA and the non-display area NDA taken along the first direction DR1.

Referring to FIGS. 9 and 10, the display device 10 may include the plurality of light emitting elements ED disposed in the display area DA, and the gate driver 210, the first power line VL1, a bridge electrode BE, a power connection electrode CAE, and dam structures DAM1 and DAM2 disposed in the non-display area NDA. In addition, the display device 10 may include the bank structure BNS disposed in the display area DA and the non-display area NDA. The light emitting elements ED, the bank structure BNS, and the first thin film transistor TFT1 disposed in the display area DA may be the same or substantially the same as those described above, and thus, redundant description thereof may not be repeated.

The gate driver 210 may include a second thin film transistor TFT2, and a plurality of gate driving electrodes 211 and 212. The second thin film transistor TFT2 may be disposed on the second buffer layer BF2, and may constitute a driving circuit of the gate driver 210. For example, the second thin film transistor TFT2 may be a switching transistor of the driving circuit of the gate driver disposed in the non-display area NDA. Similar to the first thin film transistor TFT1, the second thin film transistor TFT2 may include a semiconductor layer ACT, a source electrode SE, a drain electrode DE, and a gate electrode GE.

The gate driving electrodes 211 and 212 may include a plurality of first gate driving electrodes 211 disposed on the second interlayer insulating layer ILD2, and a plurality of second gate driving electrodes 212 disposed on the first passivation layer PAS1. The first gate driving electrodes 211 may be disposed at (e.g., in or on) the same layer as that of the first connection electrode CNE1 of the display area DA, and the second gate driving electrodes 212 may be disposed at (e.g., in or on) the same layer as that of the second connection electrode CNE2 of the display area DA. The first gate driving electrode 211 and the second gate driving electrode 212 may each serve as a connection electrode in a driving circuit of the gate driver 210.

The first power line VL1 may be disposed outside the gate driver 210 in the non-display area NDA. The first power line VL1 may be disposed on the second interlayer insulating layer ILD2, and may partially overlap with a first dam structure DAM1 to be described in more detail below in the non-display area NDA. The top surface of the first power line VL1 may be partially exposed through a hole penetrating the first and second passivation layers PAS1 and PAS2, and the exposed top surface thereof may be in contact with the bridge electrode BE. As described above, the first power line VL1 may be electrically connected to the display driver 200, so that a low potential voltage may be applied thereto.

The bridge electrode BE may be disposed on the first power line VL1 in the non-display area NDA. Similar to the first power line VL1, the bridge electrode BE may be disposed to extend in the non-display area NDA to surround (e.g., around a periphery of) the display area DA in a plan view. The bridge electrode BE may not overlap with the gate driver 210, and may be disposed outside the gate driver 210. However, the present disclosure is not limited thereto, and the bridge electrode BE may be disposed to overlap with a part or a portion of the first power line VL1, and may be formed in a plurality of patterns that are spaced apart from each other without integrally extending from one another. The bridge electrode BE may be disposed on the first passivation layer PAS1, and may be in direct contact with the first power line VL1 through a hole penetrating the first passivation layer PAS1. The bridge electrode BE may be disposed between the first power line VL1 and the power connection electrode CAE to serve as a bridge electrically connecting them to each other.

The power connection electrode CAE may be disposed to overlap with the gate driver 210, the bridge electrode BE, and the first power line VL1 in the non-display area NDA. The power connection electrode CAE may have a width larger than that of the bridge electrode BE, and may overlap with the gate driver 210 and the first power line VL1. The power connection electrode CAE may be disposed to extend in the non-display area NDA to surround (e.g., around a periphery of) the display area DA in a plan view. The power connection electrode CAE may be disposed on the second passivation layer PAS2, and may be disposed at (e.g., in or on) the same layer as that of the anode electrode AE of the display area DA. The power connection electrode CAE may be in direct contact with the bridge electrode BE through a hole penetrating the second passivation layer PAS2. The power connection electrode CAE may be disposed between the bridge electrode BE and the first bank layer BN1 to serve as a bridge electrically connecting them to each other. The power connection electrode CAE may be electrically connected to the first power line VL1.

The bank structure BNS may be disposed to extend from the display area DA to the outside of the non-display area NDA. The bank structure BNS may overlap with the gate driver 210, the power connection electrode CAE, the bridge electrode BE, and the first power line VL1 in the non-display area NDA. The first bank layer BN1 of the bank structure BNS may be directly disposed on the power connection electrode CAE in the non-display area NDA. For example, the bank structure BNS may extend to a portion where the first power line VL1 is disposed, and may also be disposed in and/or on a hole penetrating the first and second passivation layers PAS1 and PAS2. The first bank layer BN1 may be in direct contact with the power connection electrode CAE on the gate driver 210 and in the above described hole.

As described above, the first bank layer BN1 may include a metal material, and may be electrically connected to the first power line VL1 through the power connection electrode CAE and the bridge electrode BE. Because the first bank layer BN1 forms a common electrode with the cathode electrodes CE of the light emitting elements ED, the first power line VL1 may be electrically connected to the light emitting elements ED through the first bank layer BN1.

In some embodiments, the first passivation layer PAS1 and the second passivation layer PAS2 of the thin film transistor layer TFTL may include an organic insulating material, and a gas may be generated during the manufacturing process of the display device 10. When the gas generated from the passivation layers PAS1 and PAS2 is not smoothly discharged, the passivation layers PAS1 and PAS2 may be lifted by the gas. Accordingly, conductive layers disposed under the passivation layers PAS1 and PAS2 (e.g., electrodes of the first thin film transistor TFT1 disposed in the display area DA, and electrodes of the gate driver 210 disposed in the non-display area NDA) may be damaged.

In the display device 10, because the bank structure BNS extends to the outside of the non-display area NDA to partially overlap with the first power line VL1, an area between the display area DA and the first power line VL1, or an area where the gate driver 210 is disposed, may be covered by the bank structure BNS. In addition, because the power connection electrode CAE is also disposed to cover the gate driver 210, the area between the display area DA and the first power line VL1 may also be covered by the power connection electrode CAE. As the bank structure BNS including a metal material are arranged to also cover the non-display area NDA, if a discharge path for the gas generated from the passivation layers PAS1 and PAS2 is not formed, they may be vulnerable to the lifting phenomenon. The display device 10 according to one or more embodiments may include a plurality of hole patterns OH penetrating the power connection electrode CAE and the bank structure BNS disposed in the non-display area NDA. The hole patterns OH may form a discharge path for the gas generated from the passivation layers PAS1 and PAS2 during the manufacturing process of the display device 10.

Figure 11:
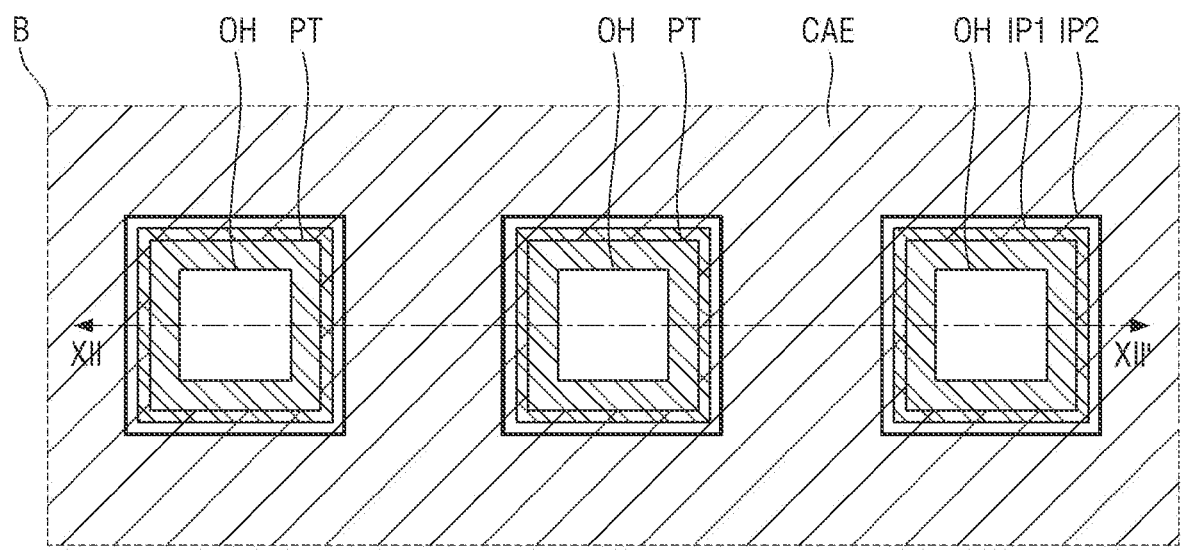
FIG. 11 is an enlarged view schematically showing the portion B of FIG. 9.
Figure 12:
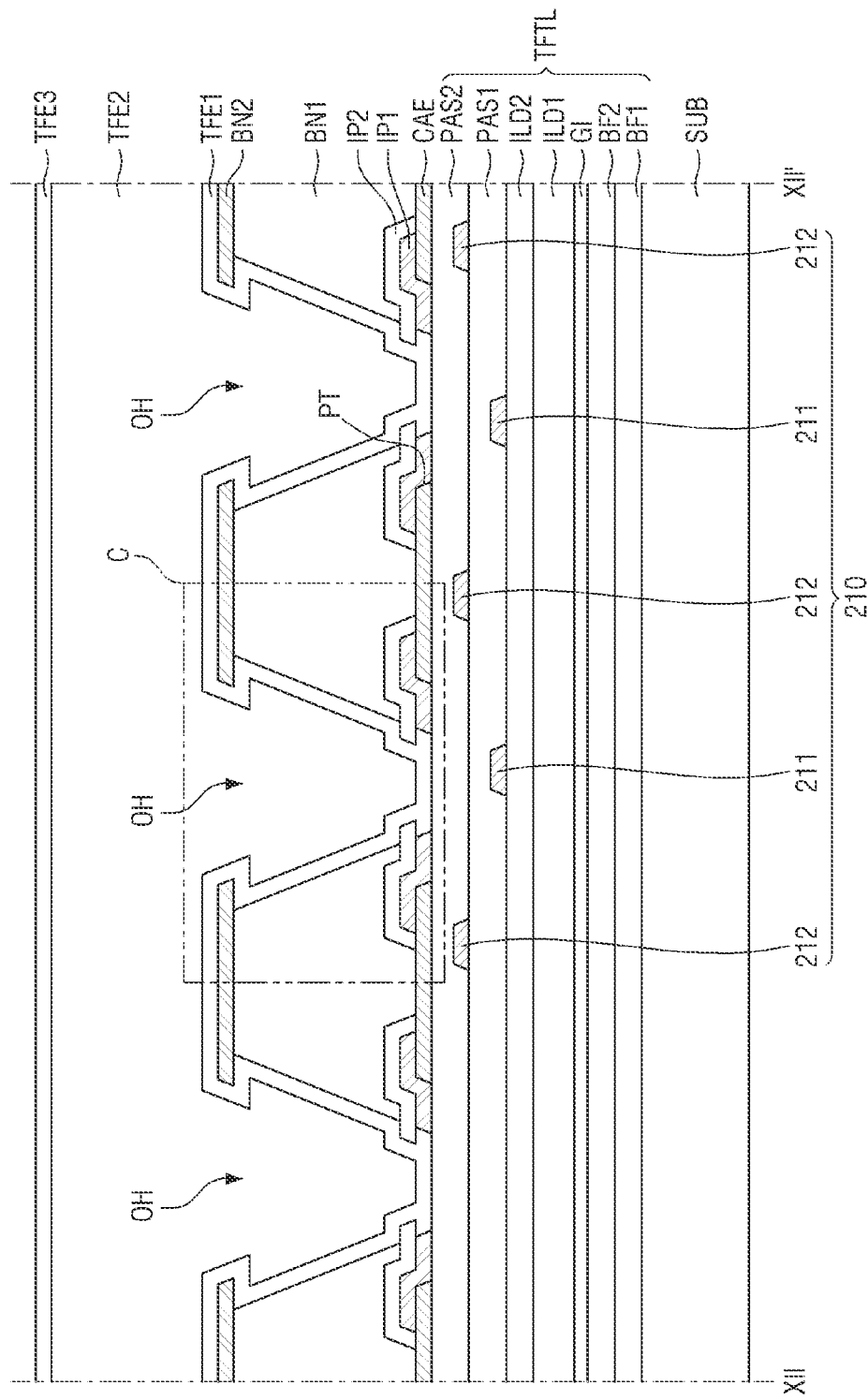
FIG. 12 is a cross-sectional view taken along the line XII-XII' of FIG. 11.
Figure 13:
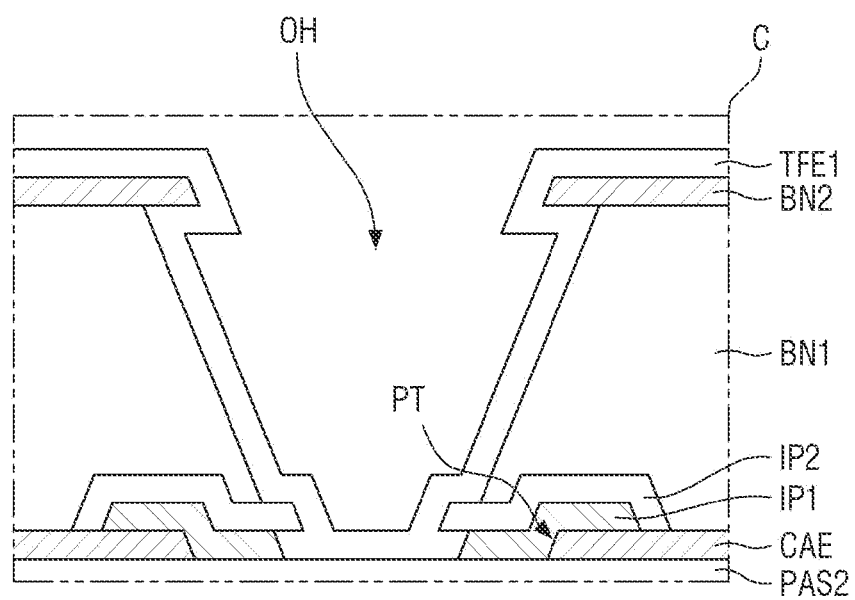
FIG. 13 is an enlarged view schematically showing the portion C of FIG. 12.

FIG. 11 is an enlarged view schematically showing the portion B of FIG. 9. FIG. 12 is a cross-sectional view taken along the line XII-XII' of FIG. 11. FIG. 13 is an enlarged view schematically showing the portion C of FIG. 12. FIG. 11 is an enlarged view of some of the hole patterns OH formed in the power connection electrode CAE in FIG. 9. FIG. 12 illustrates a cross section traversing the plurality of hole patterns OH in the first direction DR1.

Referring to FIGS. 11 to 13, the plurality of hole patterns OH may be disposed in the non-display area NDA, and may be spaced apart from each other in the first and second directions DR1 and DR2. For example, the plurality of hole patterns OH that are spaced apart from each other may be arranged along the first and second directions DR1 and DR2, and the arrangement of the hole patterns OH may surround (e.g., around a periphery of) the display area DA in the non-display area NDA. In a plan view, the arrangement of the plurality of hole patterns OH may have the same or substantially the same shape as that of the power connection electrode CAE. However, the present disclosure is not limited thereto. The plurality of hole patterns OH may be disposed in the non-display area NDA on the left and right sides of the display area DA. In addition, the plurality of hole patterns OH may not necessarily be spaced apart from each other only in the first and second directions DR1 and DR2. Similar to the arrangement of the emission areas EA1, EA2, and EA3 shown in FIG. 5, the plurality of hole patterns OH may be spaced apart from each other in any one direction of the first direction DR1, the second direction DR2, the fourth direction DR4, and/or the fifth direction DR5.

The plurality of hole patterns OH may be disposed to penetrate the power connection electrode CAE, and some of the plurality of hole patterns OH may overlap with the gate driver 210 in the thickness direction. However, some of the hole patterns OH may be disposed between the gate driver 210 and the first power line VL1, and may not overlap with them. The plurality of hole patterns OH may be randomly disposed in the non-display area NDA, but may not overlap with at least the first power line VL1. The hole patterns OH may be disposed to not overlap with the first power line VL1, and the power connection electrode CAE may have a larger contact area with the bridge electrode BE.

The power connection electrode CAE may include a plurality of through portions PT, and the hole pattern OH may be disposed in the through portion PT. Similar to the hole pattern OH, the plurality of through portions PT may also be arranged to be spaced apart from each other along the first direction DR1 or the second direction DR2. In a plan view, the area of the through portion PT may be greater than the area of the hole pattern OH. The hole pattern OH may be formed to pass through (e.g., penetrate) other layers disposed on the through portion PT.

According to one or more embodiments, the display device 10 may include a plurality of insulating patterns IP1 and IP2 disposed around (e.g., adjacent to) the hole patterns OH in the non-display area NDA. The insulating patterns IP1 and IP2 may include a first insulating pattern IP1 disposed directly on the power connection electrode CAE, and a second insulating pattern IP2 disposed on the first insulating pattern IP1. The first insulating pattern IP1 and the second insulating pattern IP2 may be disposed to correspond to each of the through portions PT and the hole patterns OH of the power connection electrode CAE. One first insulating pattern IP1 and one second insulating pattern IP2 may form a pattern pair (e.g., a pair of patterns), and a plurality of pattern pairs may be arranged on the power connection electrode CAE in the same or substantially the same way as the hole pattern OH or the through portion PT.

The first insulating pattern IP1 may be directly disposed on the through portion PT of the power connection electrode CAE. The first insulating pattern IP1 may be formed to have an area larger than that of the through portion PT in a plan view, and a part thereof may be directly disposed on the power connection electrode CAE. The first insulating pattern IP1 may cover the sidewall of the through portion PT, thereby preventing or substantially preventing the sidewall of the power connection electrode CAE from being exposed by the formation of the through portion PT. As described above, the power connection electrode CAE may be disposed at (e.g., in or on) the same layer as that of the anode electrode AE of the light emitting element ED, and may have the same material and/or structure thereof. In some embodiments, the anode electrode AE and the power connection electrode CAE may have a stacked structure of ITO/Ag/ITO, and the first insulating pattern IP1 may prevent or substantially prevent the side surface of an Ag layer of the power connection electrode CAE from being exposed.

The second insulating pattern IP2 may be disposed on the first insulating pattern IP1. The second insulating pattern IP2 may be formed to have an area larger than that of the first insulating pattern IP1 in a plan view, and may cover the outer side surface of the first insulating pattern IP1. A part of the second insulating pattern IP2 may be directly disposed on the power connection electrode CAE.

The hole pattern OH may pass through (e.g., may penetrate) the first and second insulating patterns IP1 and IP2. In the manufacturing process of the display device 10, the first insulating pattern IP1 and the second insulating pattern IP2 may be sequentially stacked on the power connection electrode CAE while covering the through portion PT, and then may be penetrated together when the hole pattern OH is formed. The reason that the insulating patterns IP1 and IP2 are arranged to surround (e.g., around a periphery of) the hole pattern OH in a plan view may be that the insulating patterns IP1 and IP2 have been penetrated in an etching process during the manufacturing process.

The bank structure BNS may be disposed on the power connection electrode CAE and the insulating patterns IP1 and IP2 in the non-display area NDA. The hole patterns OH may be formed to also pass through (e.g., penetrate) the bank structure BNS, and a tip of the second bank layer BN2 protruding from the inner sidewall of the hole pattern OH may be formed. As the hole pattern OH also penetrates the bank structure BNS, gases generated from the passivation layers PAS1 and PAS2 may flow to the outside through the hole pattern OH.

According to one or more embodiments, the first insulating pattern IP1 and the second insulating pattern IP2 may include the same material and may be disposed at (e.g., in or on) the same layer as those of the residual pattern RP and the inorganic insulating layer ISL, respectively, disposed in the display area DA. The first insulating pattern IP1 may include the same material as that of the residual pattern RP disposed directly on the anode electrode AE, and the second insulating pattern IP2 may include the same material as that of the inorganic insulating layer ISL. The stacking order of the anode electrode AE, the residual pattern RP, and the inorganic insulating layer ISL in the display area DA may be the same as the stacking order of the power connection electrode CAE, the first insulating pattern IP1, and the second insulating pattern IP2 in the non-display area NDA. For example, the power connection electrode CAE may be formed concurrently (e.g., simultaneously or substantially simultaneously) with the anode electrode AE, the first insulating pattern IP1 may be formed concurrently (e.g., simultaneously or substantially simultaneously) with the residual pattern RP or the sacrificial layer SFL (e.g., see FIG. 14), and the second insulating pattern IP2 may be formed concurrently (e.g., simultaneously or substantially simultaneously) with the inorganic insulating layer ISL.

In the manufacturing process of the display device 10, an etching process for forming the hole pattern OH in the non-display area NDA may be performed concurrently (e.g., simultaneously or substantially simultaneously) with an etching process for forming the openings OPE1, OPE2, and OPE3 in the display area DA. As will be described in more detail below, after the anode electrode AE, the sacrificial layer SFL (e.g., see FIG. 14), the inorganic insulating layer ISL, and the bank structure BNS are sequentially formed, the openings OPE1, OPE2, and OPE3 may be formed through a process of etching them. Concurrently (e.g., at the same time), in the non-display area NDA, after the power connection electrode CAE, the first insulating pattern IP1, the second insulating pattern IP2, and the bank structure BNS are sequentially formed, the hole pattern OH may be formed through an etching process of penetrating them.

In the display area DA, the sacrificial layer SFL is disposed to overlap with the anode electrode AE, whereas in the non-display area NDA, the first insulating pattern IP1 may be disposed to cover the sidewall of the through portion PT of the power connection electrode CAE. Accordingly, the same etching process is performed in the display area DA and the non-display area NDA, but there may be a difference in that the anode electrode AE is disposed in an area overlapping with the openings OPE1, OPE2, and OPE3 in the display area DA, and the through portion PT of the power connection electrode CAE is provided to expose the top surface of the second passivation layer PAS2 in the non-display area NDA. However, the layers etched in the openings OPE1, OPE2, and OPE3 of the display area DA and in the hole pattern OH of the non-display area NDA may be the same as each other, and even if the second passivation layer PAS2 is exposed in the non-display area NDA, the second passivation layer PAS2 may not be further etched, compared to the display area DA. As the same etching process is performed in the display area DA and the non-display area NDA, no step may be generated in the second passivation layer PAS2, but the anode electrode AE remains to form the light emitting element ED in the display area DA, and the hole pattern OH, which is a gas discharge path, may be formed in the through portion PT of the power connection electrode CAE in the non-display area NDA.

During the manufacturing process of the display device 10, because the sacrificial layer SFL is partially removed, the bottom surface of the inorganic insulating layer ISL may be spaced apart from the anode electrodes AE1, AE2, and AE3. Similarly, in the etching process for forming the hole pattern OH in the non-display area NDA, the first insulating pattern IP1 may be further etched when compared to the second insulating pattern IP2. Accordingly, the second insulating pattern IP2 may have a shape protruding further toward the inside of the hole pattern OH than that of the first insulating pattern IP1. A space may be formed between the second passivation layer PAS2 and the bottom surface of the second insulating pattern IP2 by the removal of the first insulating pattern IP1, and the bottom surface of the second insulating pattern IP2 and the top surface of the second passivation layer PAS2 may be spaced apart from each other. The profile of the second passivation layer PAS2, the first insulating pattern IP1, and the second insulating pattern IP2 may be the same or substantially the same as the profile formed by the anode electrode AE, the residual pattern RP, and the inorganic insulating layer ISL in the display area DA.

The first encapsulation layer TFE1 disposed on the bank structure BNS may also be disposed inside the hole pattern OH in the non-display area NDA. For example, the first encapsulation layer TFE1 may be directly disposed on the top surface of the second passivation layer PAS2 exposed by the hole pattern OH in the non-display area NDA, and may also be disposed on the inner sidewalls of the first insulating pattern IP1, the second insulating pattern IP2, and the bank structure BNS. After the gases generated from the passivation layers PAS1 and PAS2 are discharged through the hole pattern OH, the first encapsulation layer TFE1 may be disposed to encapsulate them.

The display device 10 may include the first dam DAM1 and the second dam DAM2 disposed in the non-display area NDA (e.g., see FIG. 10). The first dam DAM1 and the second dam DAM2 may be disposed at the outermost portion of the display area DA, and may be disposed to surround (e.g., around a periphery of) the display area DA. The first dam DAM1 and the second dam DAM2 may prevent or substantially prevent the second encapsulation layer TFE2 of the thin film encapsulation layer TFEL from overflowing from the non-display area NDA.

Referring again to FIG. 10, the first dam DAM1 may include a first sub-dam SDAM1 and a second sub-dam SDAM2. The second dam DAM2 may include a first sub-dam SDAM1, a second sub-dam SDAM2, and a third sub-dam SDAM3. The first sub-dam SDAM1 and the first passivation layer PAS1 may include the same material as each other, and may be disposed at (e.g., in or on) the same layer as each other. The second sub-dam SDAM2 and the second passivation layer PAS2 may include the same material as each other, and may be disposed at (e.g., in or on) the same layer as each other. The third sub-dam SDAM3 may be disposed on the second sub-dam SDAM2, and may include the same material as that of the second sub-dam SDAM2. The third sub-dam SDAM3 may be located at the same or substantially the same height as that of the inorganic insulating layer ISL disposed in the display area DA. In another embodiment, the third sub-dam SDAM3 and the inorganic insulating layer ISL may include the same material as each other, and may be disposed at (e.g., in or on) the same layer as each other.

The height of the first dam DAM1 may be lower (e.g., smaller) than the height of the second dam DAM2. However, the present disclosure is not limited thereto. The height of the first dam DAM1 may be the same or substantially the same as the height of the second dam DAM2, or may be higher (e.g., greater) than the height of the second dam DAM2.

The first encapsulation layer TFE1 and the third encapsulation layer TFE3 may cover the first dam DAM1 and the second dam DAM2 disposed at the outermost portion of the display area DA. The first encapsulation layer TFE1 and the third encapsulation layer TFE3 may extend to the outermost edge of the display panel 100 over the first dam DAM1 and the second dam DAM2.

The second encapsulation layer TFE2 may be disposed to cover the top surface of the first dam DAM1, but may not cover the top surface of the second dam DAM2. However, the present disclosure is not limited thereto. The second encapsulation layer TFE2 may not cover both the top surface of the first dam DAM1 and the top surface of the second dam DAM2. The second encapsulation layer TFE2 may not overflow to the edge of the display panel 100 due to the first dam DAM1 and the second dam DAM2.

From among the layers of the thin film transistor layer TFTL, the gate insulating layer GI, the first interlayer insulating layer ILD1, the second interlayer insulating layer ILD2, the first passivation layer PAS1, and the second passivation layer PAS2 may be removed at the outer portion of the second dam DAM2. The buffer layers BF1 and BF2 of the thin film transistor layer TFTL may be disposed at the outer side of the second dam DAM2, and the first encapsulation layer TFE1 and the third encapsulation layer TFE3 extending to the outermost edge of the display panel 100 may be directly disposed on the second buffer layer BF2.

In the display device 10 according to one or more embodiments, the bank structure BNS disposed in the display area DA may extend to the non-display area NDA, may form a common electrode with the cathode electrode CE, and may be electrically connected to the first power line VL1. Although the bank structures BNS are disposed to also cover the non-display area NDA, the hole patterns OH penetrating the bank structures BNS may be disposed in the non-display area NDA, so that a gas generated in the thin film transistor layer TFTL may be discharged through the hole patterns OH. The display device 10 may have a structure including the bank structure BNS, may prevent or substantially prevent a lifting phenomenon that may occur during the manufacturing process, and may secure a product reliability.

Hereinafter, manufacturing processes of the display device 10 according to one or more embodiments will be described in more detail.

FIGS. 14 through 21 are cross-sectional views sequentially illustrating a display area during a manufacturing process of a display device according to one or more embodiments.

FIGS. 14 through 21 schematically illustrate a process of forming the light emitting elements ED and the bank structure BNS of the light emitting element layer EML of the display device 10. Hereinafter, with respect to the manufacturing processes of the display device 10, redundant description of the formation process of each layer will not be repeated, and the formation order of each layer will be described in more detail.

Figure 14:
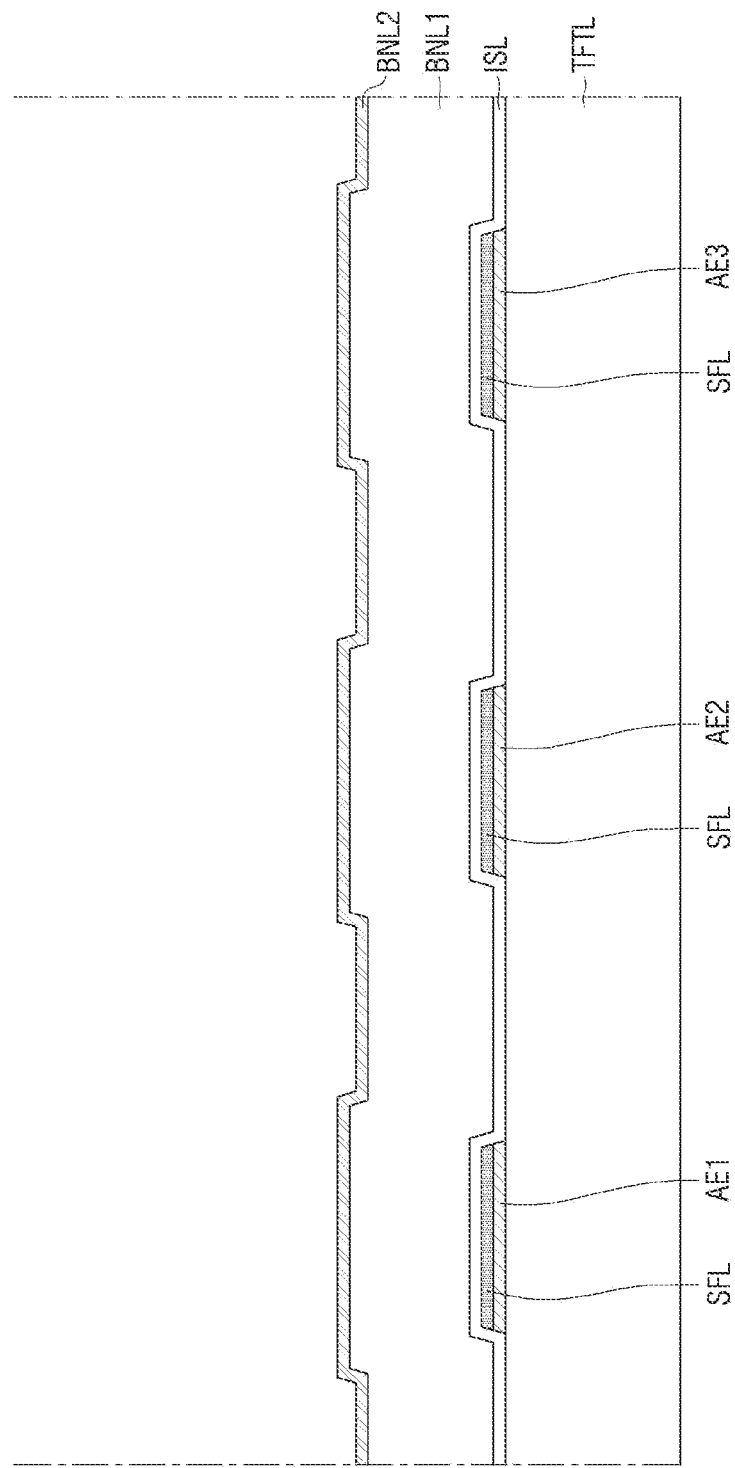
FIGS. 14-21 are cross-sectional views sequentially illustrating a display area during a manufacturing process of a display device according to one or more embodiments.

Referring to FIG. 14, the plurality of anode electrodes AE1, AE2, and AE3, the sacrificial layer SFL, the inorganic insulating layer ISL, and a plurality of bank material layers BNL1 and BNL2 are formed on the thin film transistor layer TFTL.

As described above, the thin film transistor layer TFTL may be disposed on the substrate SUB, and the structure of the thin film transistor TFTL may be the same or substantially the same as that described above with reference to FIG. 6. Accordingly, redundant description thereof may not be repeated.

The plurality of anode electrodes AE1, AE2, and AE3 may be disposed to be spaced apart from each other on the thin film transistor layer TFTL. The anode electrodes AE1, AE2, and AE3 may include the first anode electrode AE1, the second anode electrode AE2, and the third anode electrode AE3 of the different light emitting elements ED1, ED2, and ED3. The first to third anode electrodes AE1, AE2, and AE3 may be disposed to be spaced apart from each other on the thin film transistor layer TFTL.

The sacrificial layer SFL may be disposed on the anode electrodes AE1, AE2, and AE3. The sacrificial layer SFL may be disposed on the anode electrodes AE1, AE2, and AE3, and then may be partially removed in a subsequent process to form a space in which the light emitting layers EL1, EL2, and EL3 are disposed. The sacrificial layer SFL may prevent or substantially prevent the contact between the top surfaces of the anode electrodes AE1, AE2, and AE3 and the inorganic insulating layer ISL, and the sacrificial layer SFL may be removed to form a space between the anode electrodes AE1, AE2, and AE3 and the inorganic insulating layer ISL. In an embodiment, the sacrificial layer SFL may include an oxide semiconductor. For example, the sacrificial layer SFL may include at least one of indium-gallium-zinc oxide (IGZO), zinc-tin oxide (ZTO), or indium-tin oxide (ITO).

The inorganic insulating layer ISL and the bank material layers BNL1 and BNL2 may be disposed on the sacrificial layer SFL. The inorganic insulating layer ISL may be disposed to entirely cover the sacrificial layer SFL and the thin film transistor layer TFTL, and the plurality of bank material layers BNL1 and BNL2 may be disposed to entirely cover the inorganic insulating layer ISL. The bank material layers BNL1 and BNL2 may include the first bank material layer BNL1 and the second bank material layer BNL2 that are sequentially stacked. The first bank material layer BNL1 may be directly disposed on the inorganic insulating layer ISL, and the second bank material layer BNL2 may be disposed on the first bank material layer BNL1. The bank material layers BNL1 and BNL2 may be partially etched in a subsequent process to form the bank layers BN1 and BN2, respectively, of the bank structure BNS illustrated in FIG. 6. The first bank material layer BNL1 and the second bank material layer BNL2 may include different metal materials from each other to form the first bank layer BN1 and the second bank layer BN2, respectively.

Figure 15:
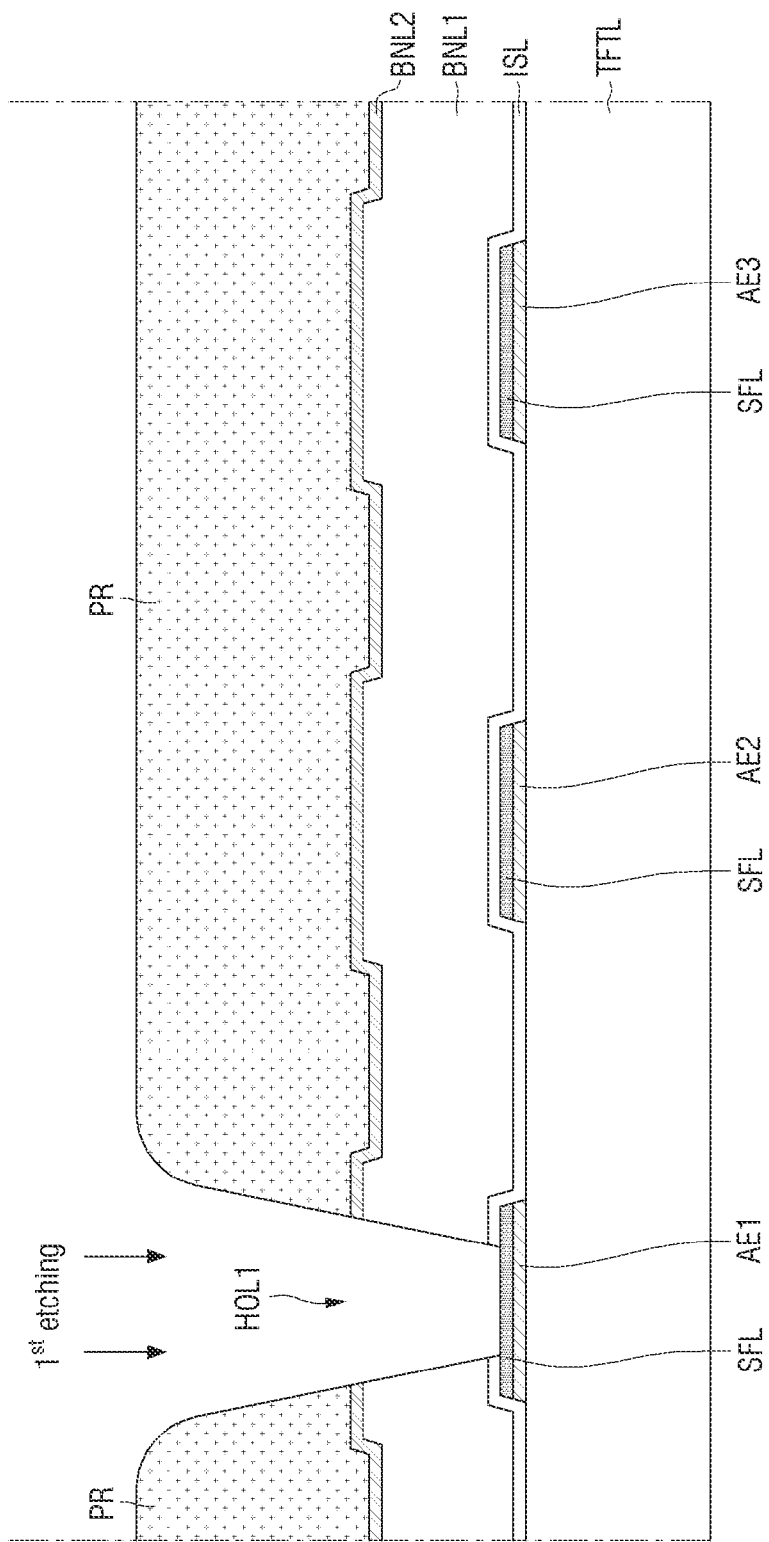

Referring to FIG. 15, photoresists PR may be formed on the bank material layers BNL1 and BNL2, and a first etching process (1$^{st}$ etching) for etching some of the bank material layers BNL1 and BNL2 using the photoresist PR as a mask is performed to form a first hole HOL1.

The photoresists PR may be disposed on the bank material layers BNL1 and BNL2 to be spaced apart from each other. The photoresists PR may not overlap with the first anode electrode AE1 on the second bank material layer BNL2, and may be disposed to expose portions of the bank material layers BNL1 and BNL2 overlapping with the first anode electrode AE1.

In an embodiment, the first etching process (1$^{st}$ etching) may be performed as dry etching. Because the first etching process (1$^{st}$ etching) is performed as a dry etching process, the bank material layers BNL1 and BNL2 including different materials from each other may be anisotropically etched. In this process, the bank material layers BNL1 and BNL2 and a part of the inorganic insulating layer ISL may be etched together to partially expose the sacrificial layer SFL disposed thereunder. The first hole HOL1 may be formed in the regions overlapping with the anode electrodes AE1, AE2, and AE3, and the first hole HOL1 may form the openings OPE1, OPE2, and OPE3 of the bank structure BNS.

Figure 16:
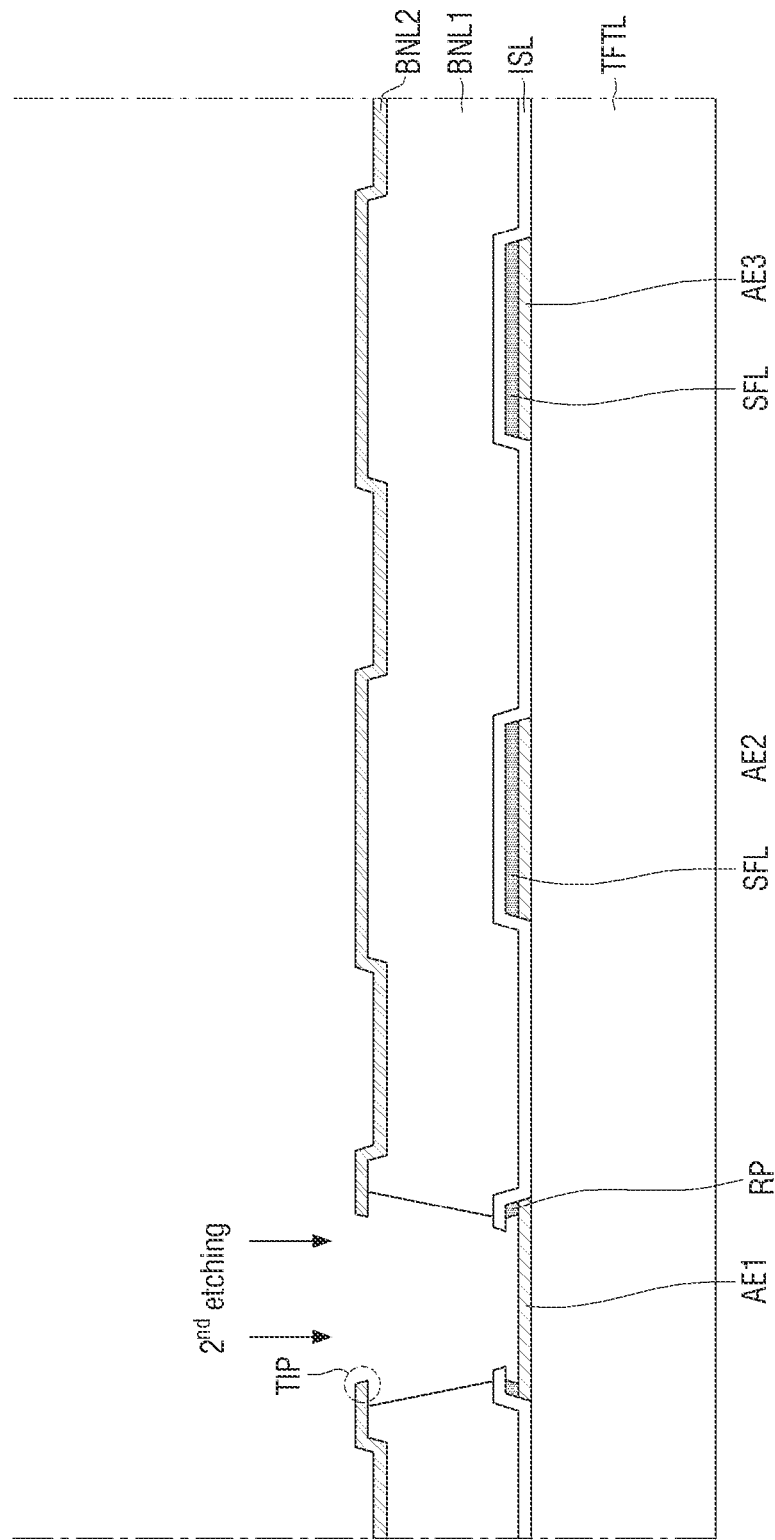

Referring to FIG. 16, a second etching process (2$^{nd}$ etching) for removing the sacrificial layer SFL disposed on the first anode electrode AE1 is performed. In an embodiment, the sacrificial layer SFL may include an oxide semiconductor layer, and the second etching process (2$^{nd}$ etching) may be performed as a wet etching process. In this process, the inner sidewall of the first hole HOL1 may be isotropically etched by the removal of the sacrificial layer SFL. From among the plurality of bank material layers BNL1 and BNL2, the first bank material layer BNL1 may have an etching rate faster than those of other bank material layers, and the second bank material layer BNL2 may have the tip TIP protruding more than the lateral side of the first bank material layer BNL1. On the lateral side of the first bank material layer BNL1, the undercut may be formed under the tip TIP of the second bank material layer BNL2. The first hole HOL1 may form the first opening OPE1 or the first emission area EA1 by the second etching process (2$^{nd}$ etching).

A part of the sacrificial layer SFL exposed by the first hole HOL1 and a portion between the inorganic insulating layer ISL and the first anode electrode AE1 may be removed. However, the sacrificial layer SFL may not be completely removed, and a portion thereof may remain as the partial residual pattern RP between the inorganic insulating layer ISL and the first anode electrode AE1. As the portion remaining after the sacrificial layer SFL is removed, a space may be formed between the first anode electrode AE1 and the inorganic insulating layer ISL disposed thereon. In a subsequent process, the first light emitting layer EL1 disposed on the first anode electrode AE1 may be formed to fill the space.

Figure 17:
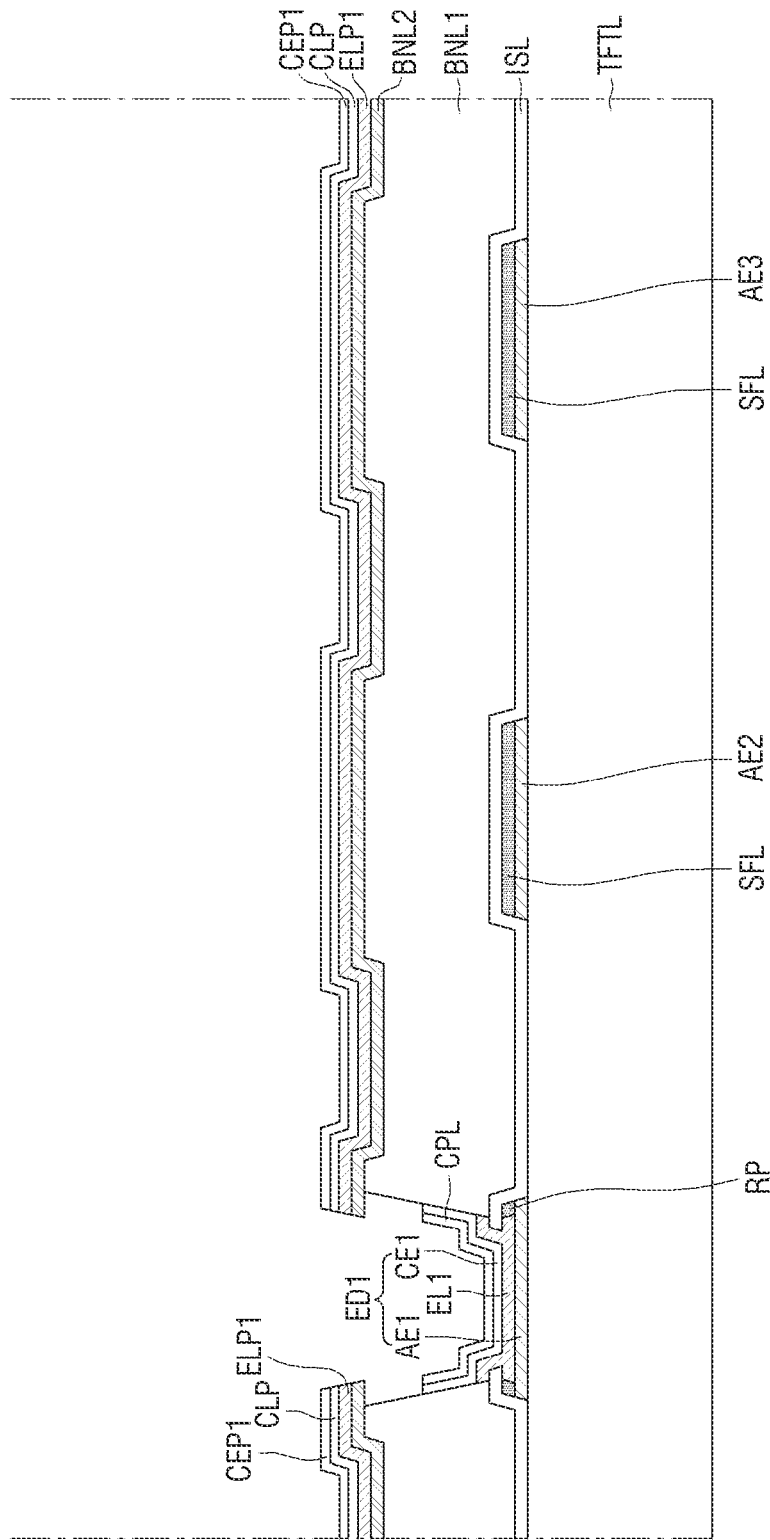

Referring to FIG. 17, the first light emitting element ED1 is formed by depositing the first light emitting layer EL1, the first cathode electrode CE1, and the capping layer CPL on the first anode electrode AE1. The first light emitting layer EL1 and the first cathode electrode CE1 may be formed in the first opening OPE1, and in the deposition process, the materials forming the first light emitting layer EL1 and the first cathode electrode CE1 may also be deposited on the second bank material layer BNL2 to form a plurality of patterns. For example, some of the materials may be deposited on the second bank material layer BNL2 to form the first organic pattern ELP1 and the first electrode pattern CEP1. A part of the capping layer CPL may be disposed in the first opening OPE1 to cover the first light emitting element ED1, and another part thereof may be disposed on the second bank material layer BNL2 to form the first organic pattern ELP1 and the first electrode pattern CEP1. Redundant description of the structures of the first light emitting layer EL1, the first cathode electrode CE1, the first organic pattern ELP1, and the first electrode pattern CEP1 will not be repeated.

The first light emitting layer EL1 and the first cathode electrode CE1 may be formed by a deposition process. The deposition of the materials thereof may not be smooth in the first opening OPE1 by the tip TIP of the second bank material layer BNL2. However, because the materials of the first light emitting layer EL1 and the first cathode electrode CE1 are deposited in an inclined direction rather than in a direction perpendicular to the top surface of the substrate, they may be deposited even in the region hidden by the tip TIP of the first bank material layer BNL1.

For example, the deposition process of forming the first light emitting layer EL1 may be performed such that the materials are deposited in a direction not perpendicular to the top surface of the first anode electrode AE1, but, for example, in a direction inclined at a first angle. In an embodiment, in the process of forming the light emitting layers EL1, EL2, and EL3, the deposition of the materials may be performed at an angle of 45° to 50° inclined from the top surfaces of the anode electrodes AE1, AE2, and AE3. The first light emitting layer EL1 may be formed to fill a space between the first anode electrode AE1 and the inorganic insulating layer ISL, and may also be formed in the region hidden by the tip TIP of the second bank material layer BNL2. For example, the first light emitting layer EL1, may be partially disposed on the side surface of the first bank material layer BNL1, which is the region hidden by the tip TIP.

The deposition process of forming the first cathode electrode CE1 may be performed such that the materials are deposited in a direction not perpendicular to the top surface of the first anode electrode AE1, but, for example, in a direction inclined at a second angle. In an embodiment, in the process of forming the cathode electrodes CE1, CE2, and CE3, the deposition of the materials may be performed at an angle of 30° or less inclined from the top surfaces of the anode electrodes AE1, AE2, and AE3. The first cathode electrode CE1 may be disposed on the first light emitting layer EL1, and may also be formed in the region hidden by the tip TIP of the second bank material layer BNL2. For example, the first cathode electrode CE1 may be partially disposed on the side surface of the first bank material layer BNL1, which is the region hidden by the tip TIP.

The deposition process of forming the cathode electrodes CE1, CE2, and CE3 may be performed at an angle inclined to be relatively closer to a horizontal direction compared to the deposition process of forming the light emitting layers EL1, EL2, and EL3. Accordingly, the cathode electrodes CE1, CE2, and CE3 may be in contact with the side surface of the first bank layer BN1 or the first bank material layer BNL1 in larger areas compared to those of the light emitting layers EL1, EL2, and EL3. As another example, the cathode electrodes CE1, CE2, and CE3 may be deposited to higher positions on the side surface of the first bank layer BN1 or the first bank material layer BNL1 compared to those of the light emitting layers EL1, EL2, and EL3. The different cathode electrodes CE1, CE2, and CE3 may be electrically connected to each other, while being in contact with the first bank layer BN1 or the first bank material layer BNL1 having high conductivity.

Figure 18:
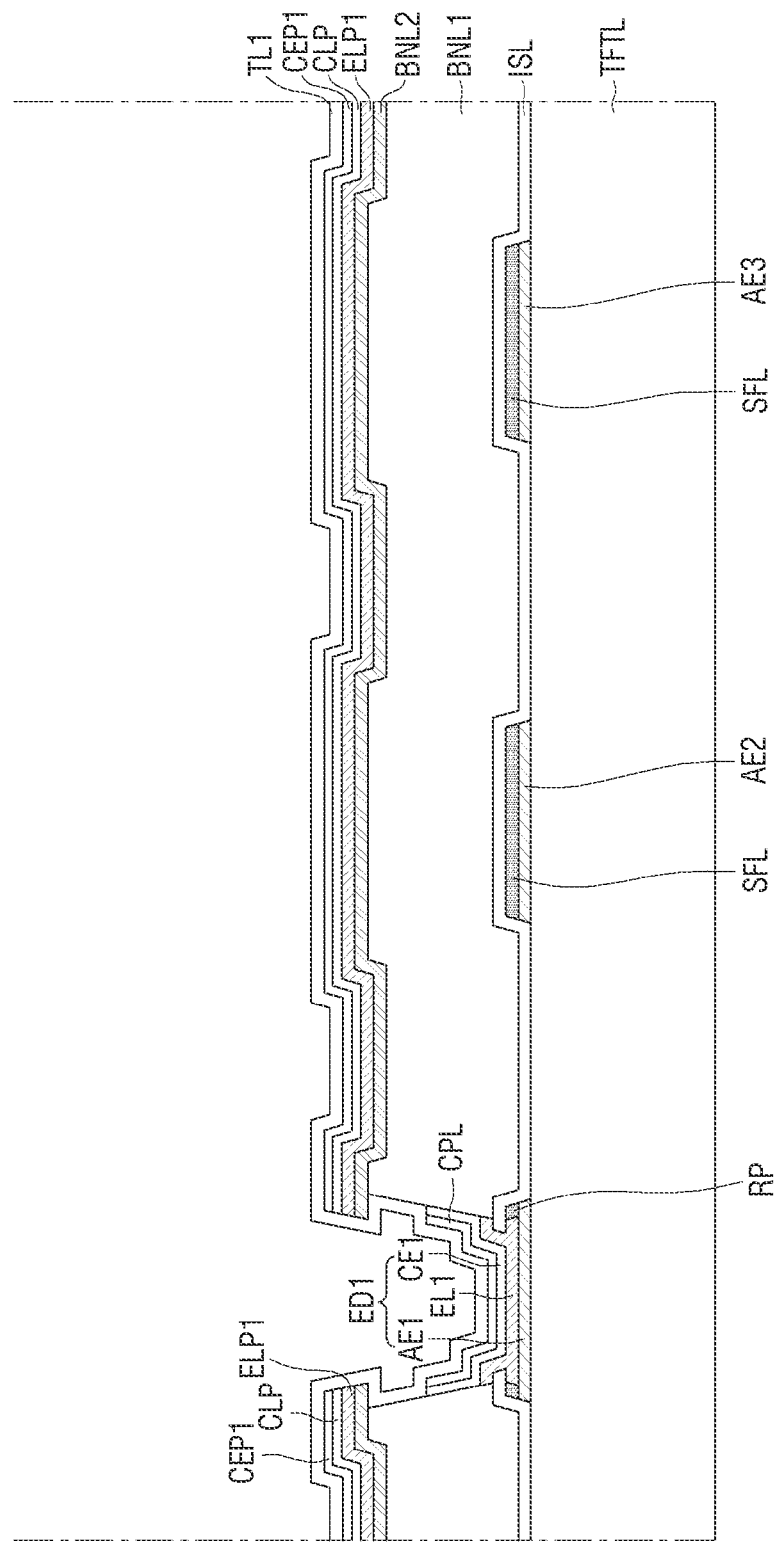

Referring to FIG. 18, the first inorganic layer TL1 covering the first light emitting element ED1 and the capping layer CPL is formed. Unlike the light emitting layers EL1, EL2, and EL3 and the cathode electrodes CE1, CE2, and CE3, the first inorganic layer TL1 may be formed by a chemical vapor deposition (CVD) process, and the first inorganic layer TL1 may form a uniform or substantially uniform film regardless of the stepped portion of the deposited portion. The first inorganic layer TL1 may be formed to completely cover the outer surfaces of the first light emitting element ED1, the bank material layers BNL1 and BNL2, and the capping layer CPL. In more detail, the first inorganic layer TL1 may also be deposited under the tip TIP of the second bank material layer BNL2.

Figure 19:
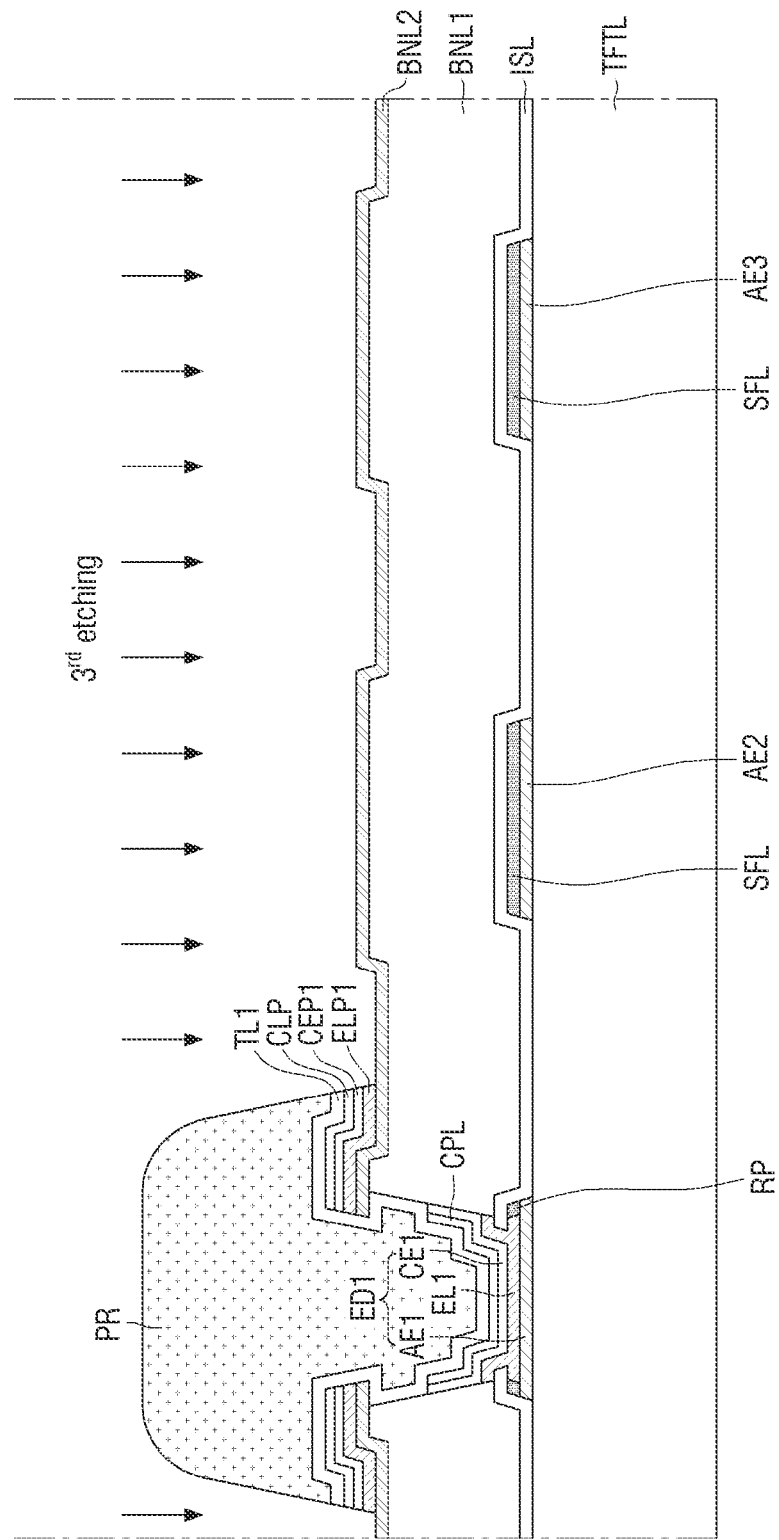

Referring to FIG. 19, a photoresist PR is formed on the first inorganic layer TL1, and a third etching process ($3^{rd}$ etching) of partially removing the first organic pattern ELP1, the first electrode pattern CEP1, the capping layer CPL, and the first inorganic layer TL1 disposed on the bank material layers BNL1 and BNL2 is performed.

In the third etching process ($3^{rd}$ etching), the photoresist PR may be disposed to overlap with the first opening OPE1 or the first light emitting element ED1. The first organic pattern ELP1, the first electrode pattern CEP1, the capping pattern CLP, and the first inorganic layer TL1 disposed on the bank material layers BNL1 and BNL2 may be completely removed, except for the periphery of the first light emitting element ED1 or the first opening OPE1. In the process, the region of the second bank material layer BNL2, except the periphery of the first light emitting element ED1 or the first opening OPE1, may be exposed. In an embodiment, the third etching process ($3^{rd}$ etching) for removing the first inorganic layer TL1 disposed on the bank material layers BNL1 and BNL2 may be performed as a dry etching process using a fluorine (F)-based etchant.

Figure 20:
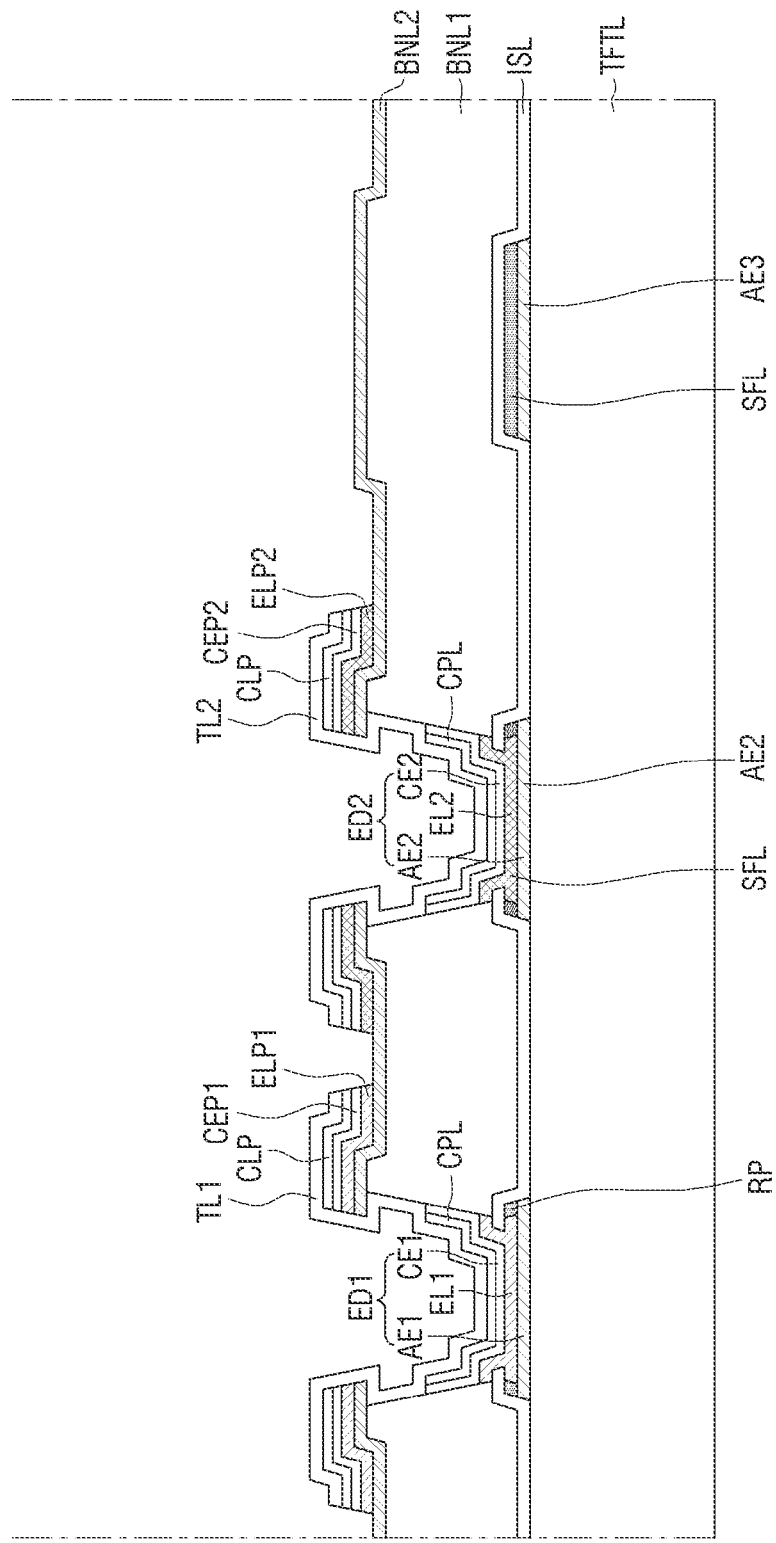
Figure 21:
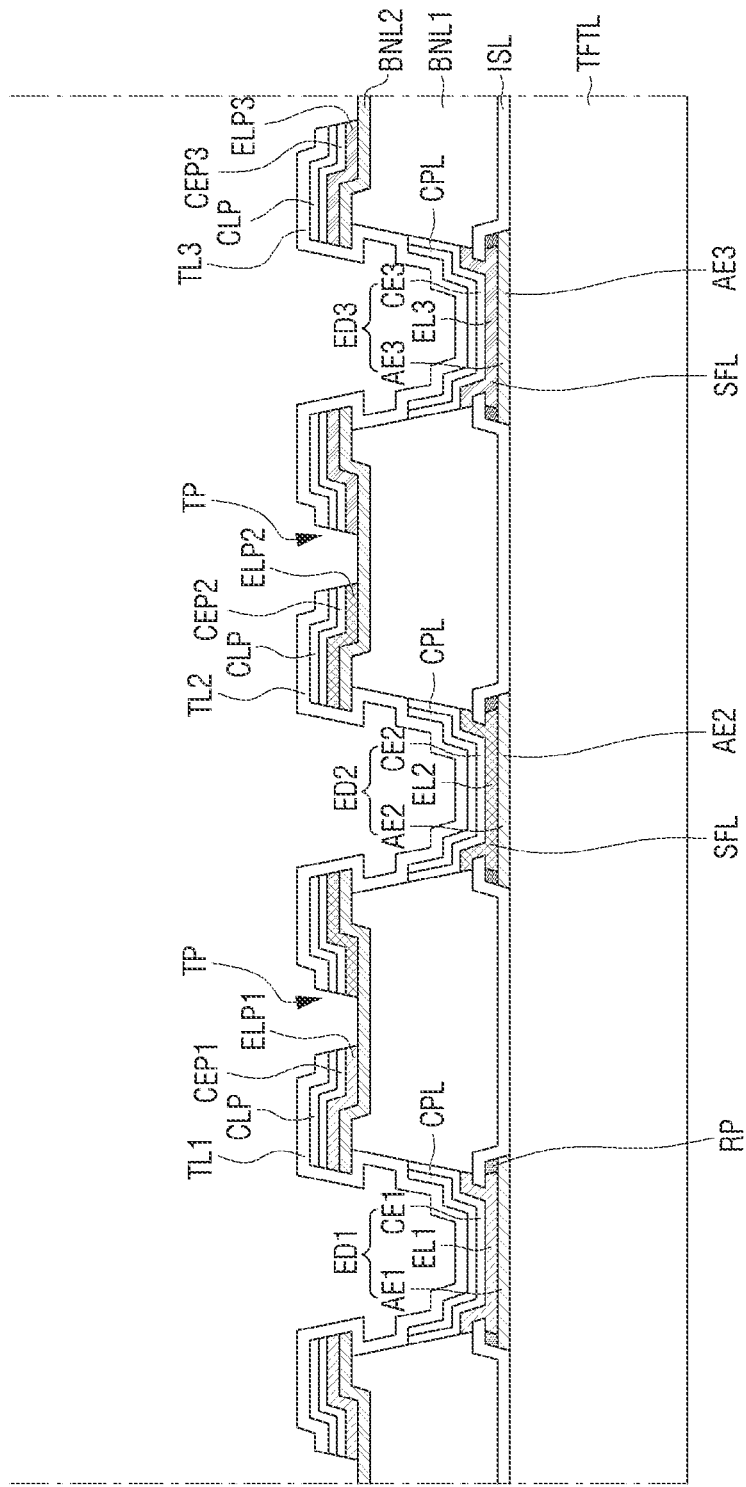

According to the above described processes, the first light emitting element ED1, and the first inorganic layer TL1 covering the first light emitting element ED1, the first organic pattern ELP1, the first electrode pattern CEP1, and the capping layer PL may be formed. Referring to FIGS. 20 and 21, the second light emitting element ED2, the third light emitting element ED3, the second and third organic patterns ELP2 and ELP3, the second and third electrode patterns CEP2 and CEP3, the second inorganic layer TL2, and the third inorganic layer TL3 may be formed by repeating or substantially repeating processes that are the same or substantially the same as (or similar to) the above-described processes.

The thin film encapsulation layer TFEL may be formed by forming the second encapsulation layer TFE2 and the third encapsulation layer TFE3 on the first encapsulation layers TFE1 and the bank structure BNS, and the touch sensing layer TSU, the light blocking layer BM, the color filter layer CFL, and the overcoat layer OC may be formed, thereby manufacturing the display device 10.

As described above, the process of forming the hole pattern OH in the non-display area NDA may be performed concurrently (e.g., simultaneously or substantially simultaneously) with the process of forming the openings OPE1, OPE2, and OPE3 in the display area DA. Hereinafter, a process of forming the hole pattern OH in the non-display area NDA will be described in more detail.

FIGS. 22 through 28 are views illustrating a part of a non-display area during a manufacturing process of a display device according to one or more embodiments.

Figure 22:
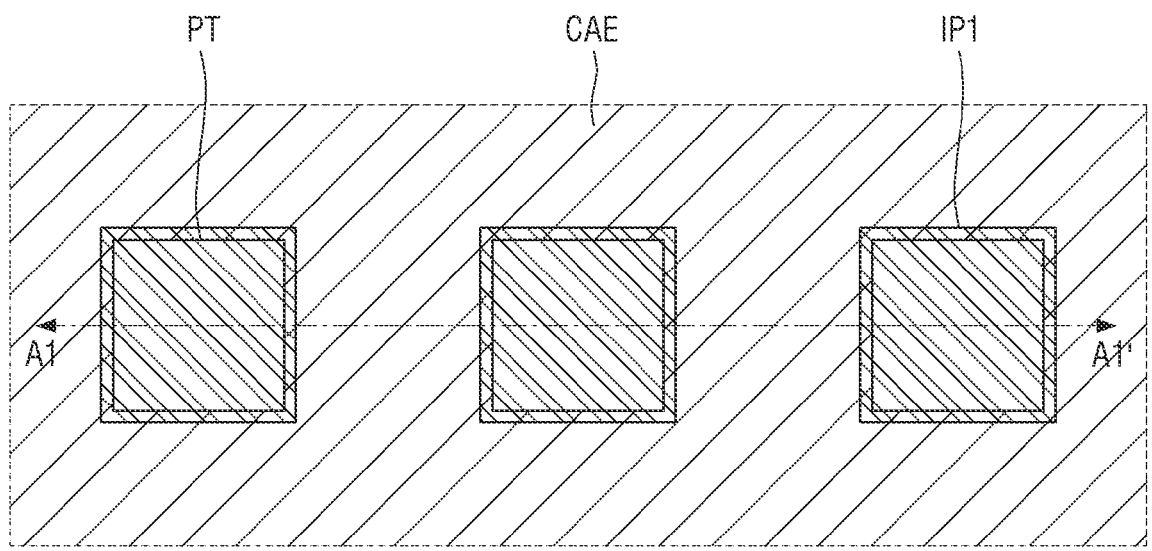
FIGS. 22-28 are views illustrating a part of a non-display area during a manufacturing process of a display device according to one or more embodiments.
Figure 23:
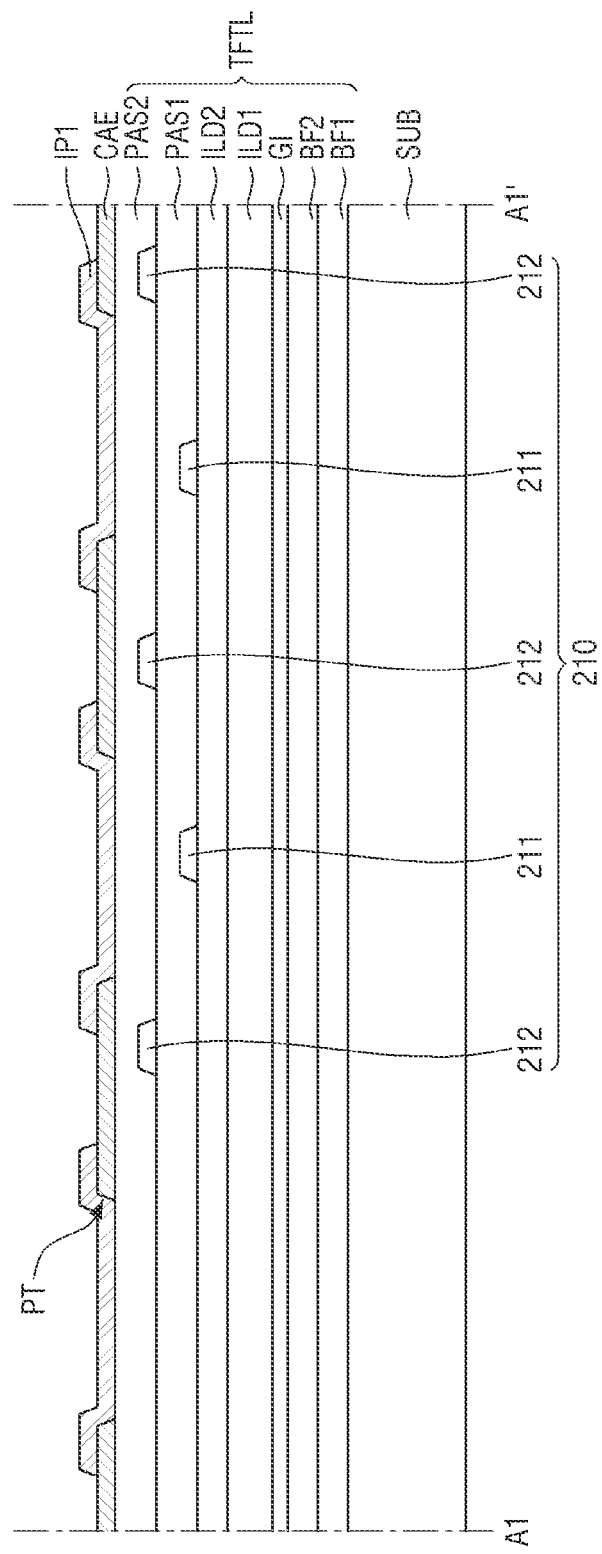

Referring to FIGS. 22 and 23, the power connection electrode CAE including the plurality of through portions PT is formed on the thin film transistor layer TFTL. A plurality of first insulating patterns IP1 are formed to correspond to the through portions PT, respectively.

The thin film transistor layer TFTL may include the plurality of gate driving electrodes 211 and 212 disposed in the non-display area NDA, and may also include the second thin film transistor TFT2 of the gate driver 210. A description thereof is the same as described above with reference to FIG. 10.

The power connection electrode CAE may be disposed in the non-display area NDA to surround (e.g., around a periphery of) the display area DA, and the plurality of through portions PT may be disposed to be spaced apart from each other. The through portions PT of the power connection electrode CAE may be spaces where the hole patterns OH are formed by penetrating layers disposed thereon in a subsequent process.

The first insulating pattern IP1 may be disposed to completely cover the through portion PT. A part thereof may be disposed directly on the power connection electrode CAE, and another part thereof may be directly disposed on the second passivation layer PAS2. The first insulating pattern IP1 may be disposed to cover the inner sidewall of the through portion PT, and may prevent or substantially prevent the side surface of the power connection electrode CAE from being exposed. In more detail, in an embodiment in which the power connection electrode CAE and the anode electrode AE have a stacked structure of ITO/Ag/ITO, the first insulating pattern IP1 may prevent or substantially prevent exposure of an Ag layer of the power connection electrode CAE. The first insulating pattern IP1 may be formed at (e.g., in or on) the same layer and in the same process as those of the sacrificial layer SFL in the display area DA.

Figure 24:
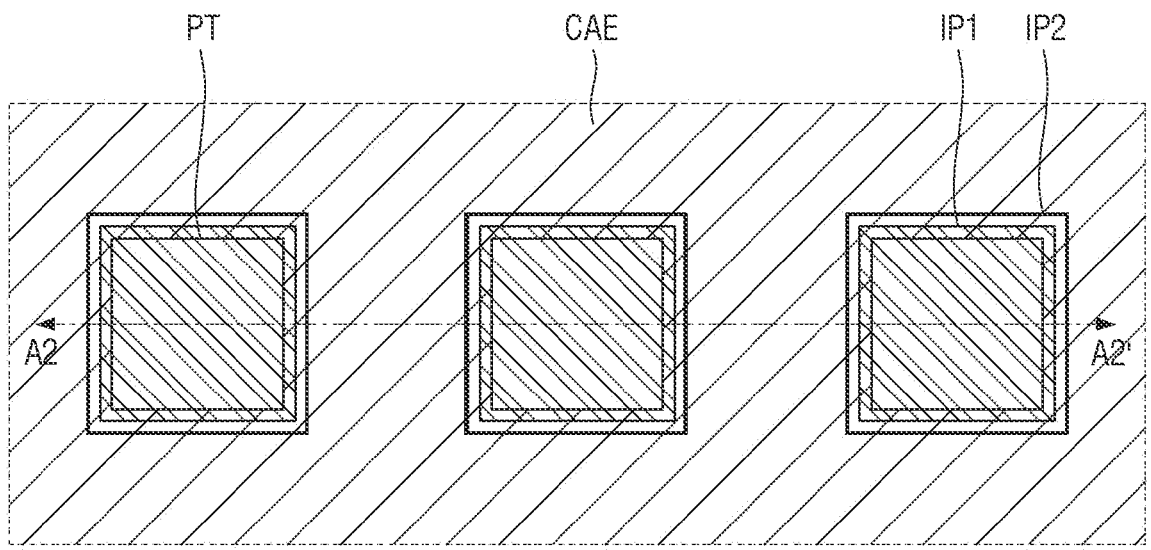
Figure 25:
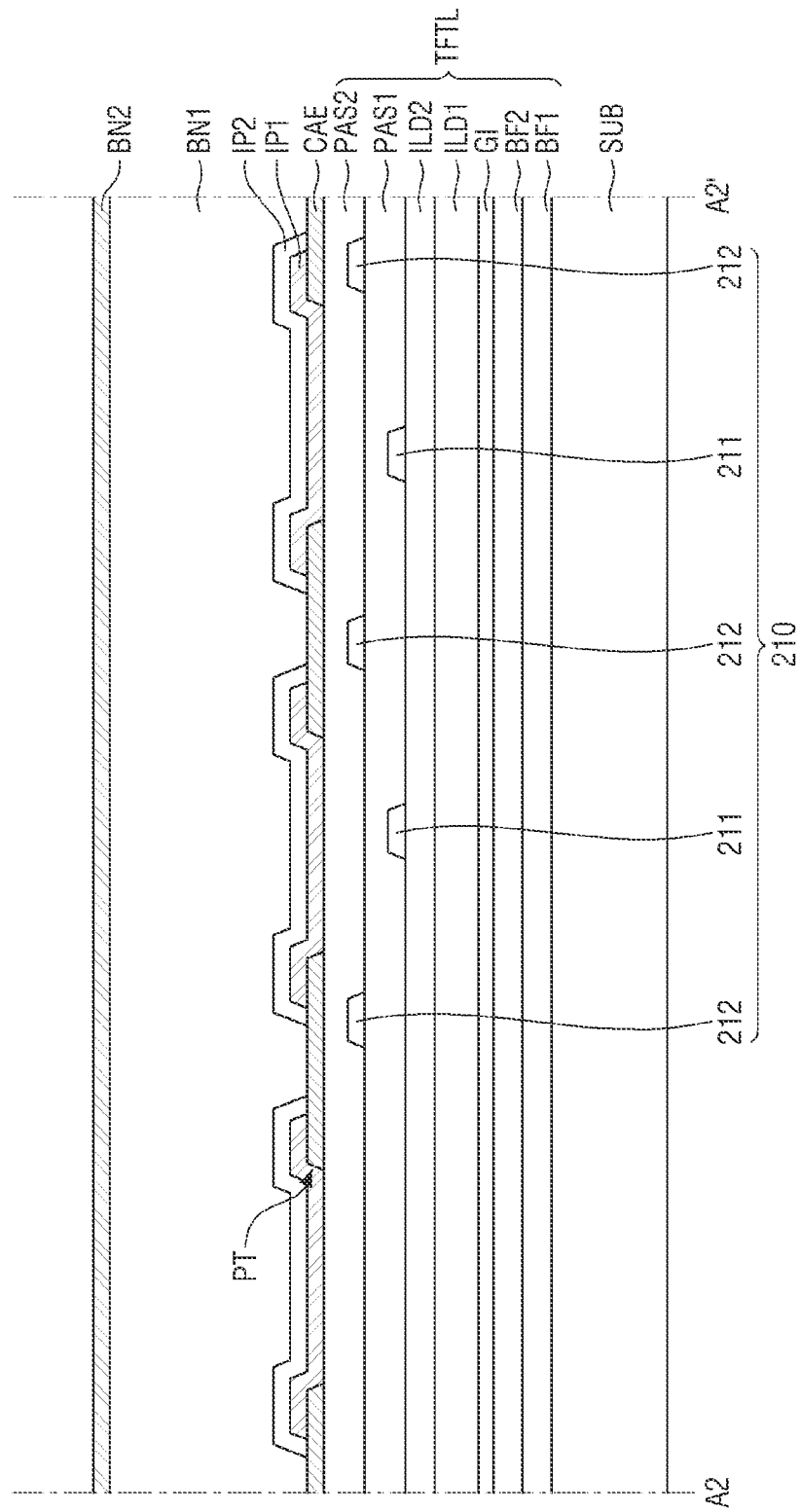

Referring to FIGS. 24 and 25, the second insulating pattern IP2 and the bank structure BNS are formed on the power connection electrode CAE and the first insulating pattern IP1.

The second insulating pattern IP2 may be disposed to overlap with the through portion PT and the first insulating pattern IP1, and may have an area larger than that of the first insulating pattern IP1 in a plan view. The second insulating pattern IP2 may be disposed to completely cover the first insulating pattern IP1, and may be partially disposed on the power connection electrode CAE. The second insulating pattern IP2 may be formed at (e.g., in or on) the same layer and in the same process as those of the inorganic insulating layer ISL of the display area DA.

The bank structure BNS may include the first bank layer BN1 and the second bank layer BN2 that are sequentially stacked. The bank structure BNS in which the hole pattern OH is not formed may be the same as the bank material layers BNL1 and BNL2 of FIG. 19.

Figure 26:
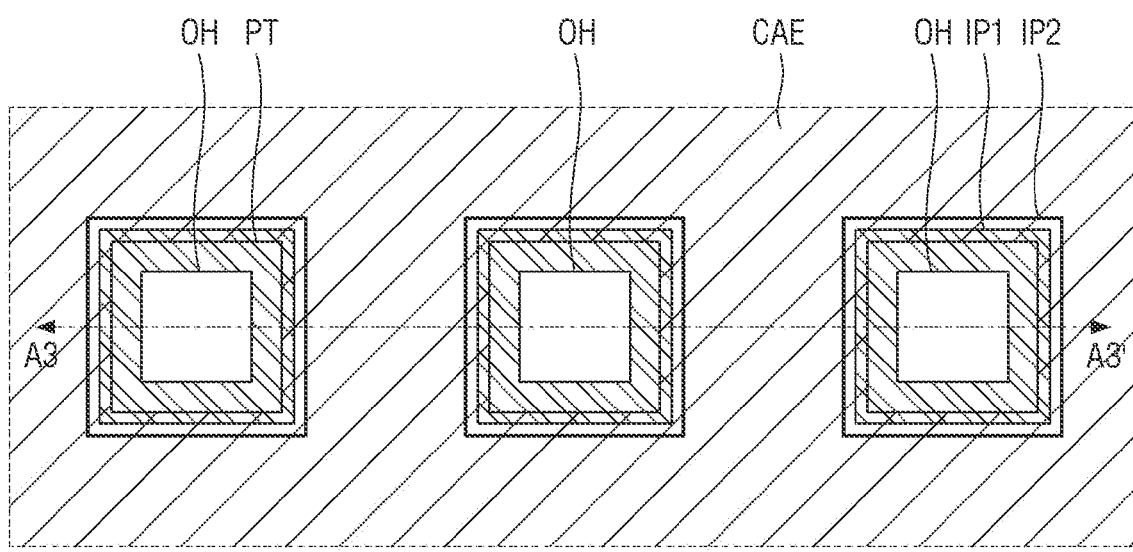
Figure 27:
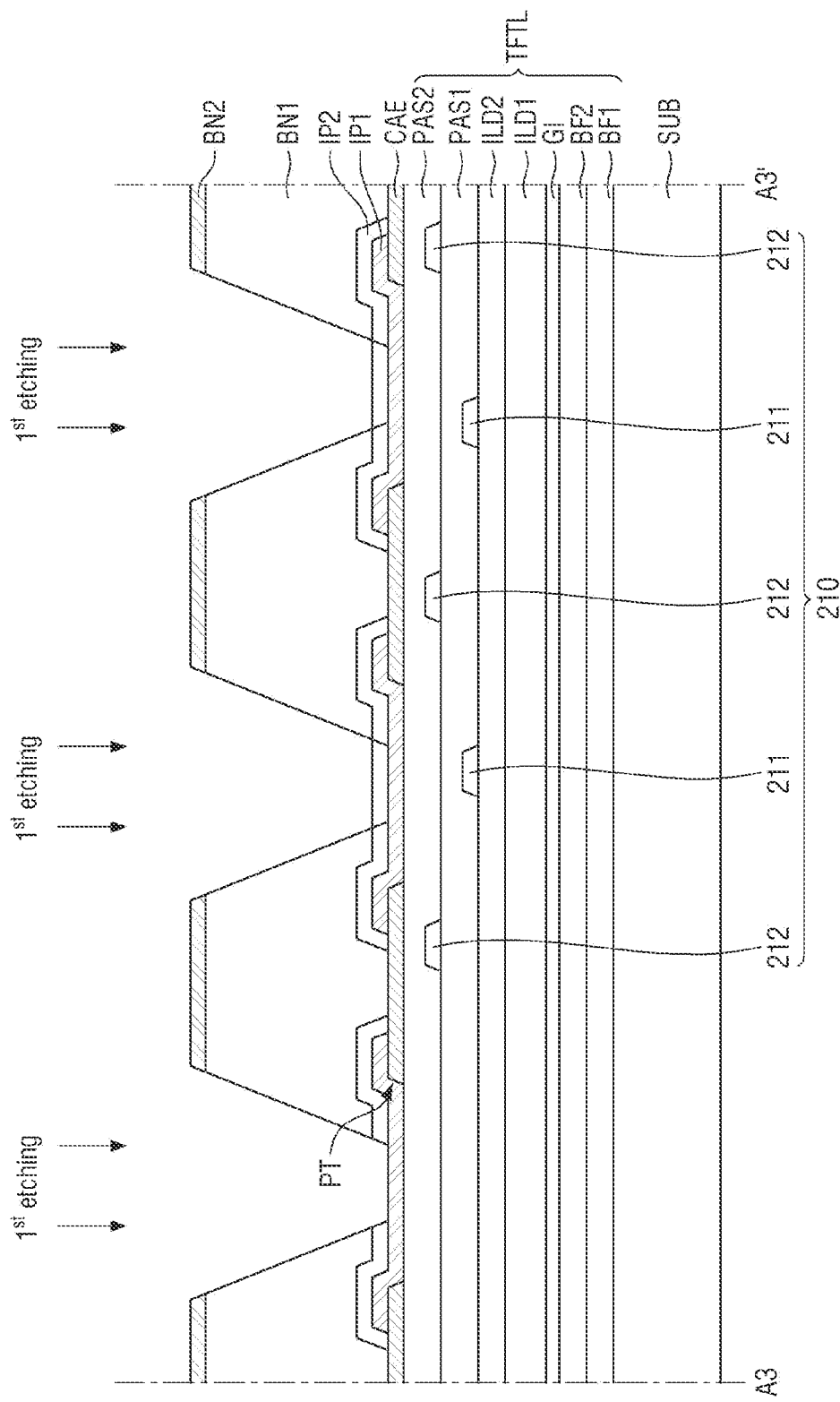

Referring to FIGS. 26 and 27, a first etching process ($1^{st}$ etching) is performed to penetrate the bank structure BNS and the second insulating pattern IP2. Through the first etching process, the first bank layer BN1, the second bank layer BN2, and the second insulating pattern IP2 may be penetrated, and the top surface of the first insulating pattern IP1 may be exposed. As shown in FIG. 15, the first etching process may be performed as a process of forming a photoresist layer, and etching using the photoresist layer as a mask. In the display area DA, the first hole HOL1 may be formed through the first etching process.

Figure 28:
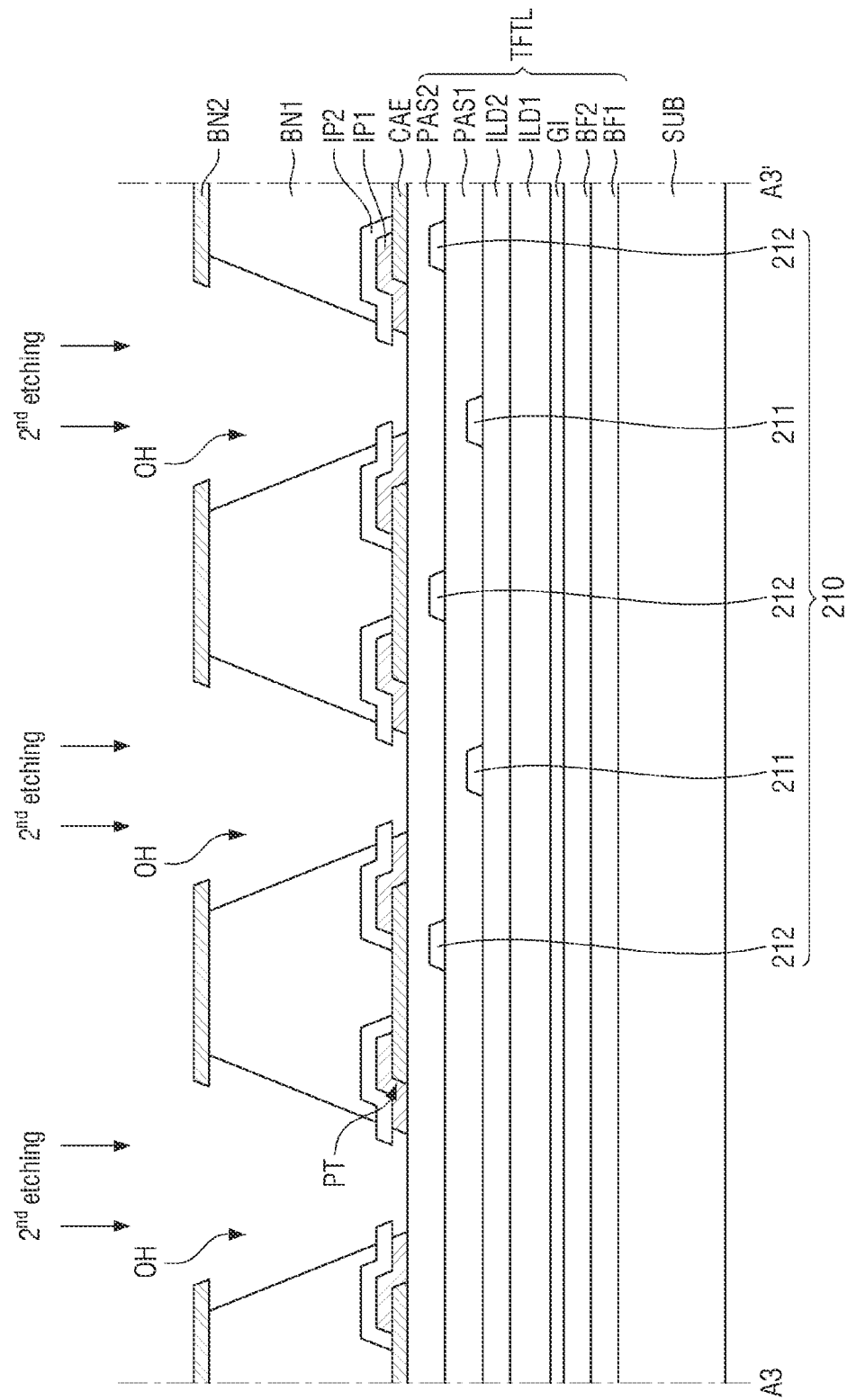

Referring to FIG. 28, a second etching process (2$^{nd}$ etching) is performed to remove a part of the first insulating pattern IP1 disposed in the through portion PT. In an embodiment, the first insulating pattern IP1 may include the oxide semiconductor layer similarly to the sacrificial layer SFL, and the second etching process may be performed as a wet etching process. In this process, the top surface of the second passivation layer PAS2 may be exposed by the partial removal of the first insulating pattern IP1, and the inner sidewall of the first bank layer BN1 may be isotropically etched. The first insulating pattern IP1 may be further etched than the second insulating pattern IP2, and the second insulating pattern IP2 may include a portion protruding further toward the inside of the hole pattern OH than the first insulating pattern IP1.

As described above, the first bank layer BN1 may be etched faster than the second bank layer BN2, and even in the non-display area NDA, the second bank layer BN2 may have a tip protruding more than the lateral side of the first bank layer BN1.

While the top surface of the second passivation layer PAS2 is exposed, the hole pattern OH, which is a gas discharge path, may be formed in the non-display area NDA. In the manufacturing process of the display device 10, while a plurality of processes are performed on the second passivation layer PAS2, gases generated from the passivation layers PAS1 and PAS2 may be discharged through the hole pattern OH. In the display device 10, even when the bank structure BNS includes metal materials, a gas discharge path may be secured to prevent or substantially prevent lifting of the thin film transistor layer TFTL, and thus, product reliability may be secured.

Figure 29:
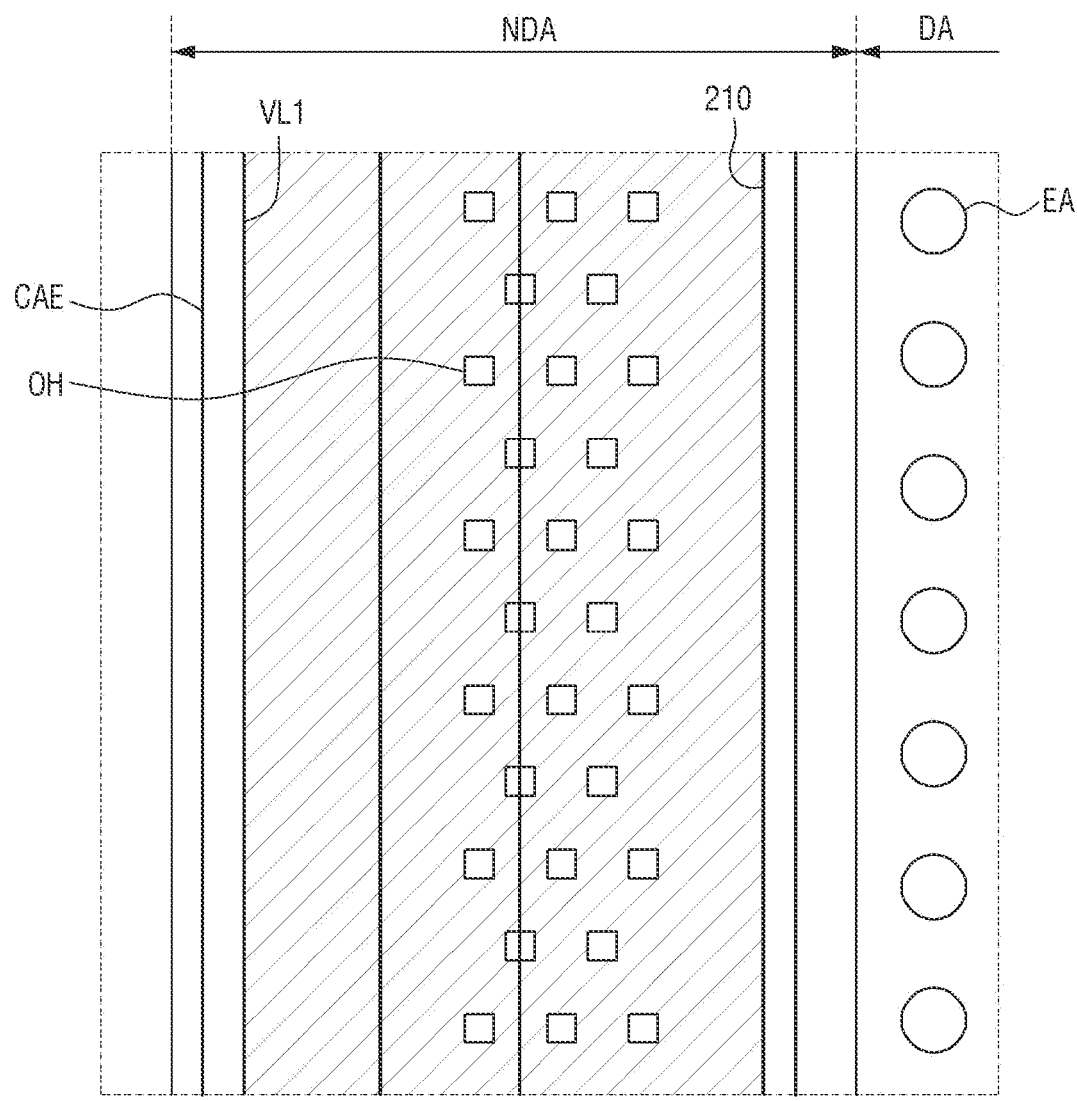
FIG. 29 is a plan view illustrating the arrangement of a plurality of hole patterns disposed in a display device according to one or more embodiments.

FIG. 29 is a plan view illustrating the arrangement of a plurality of hole patterns disposed in a display device according to one or more embodiments.

Referring to FIG. 29, in the display device 10, adjacent hole patterns OH may be disposed to be spaced apart from each other in a fourth direction DR4 or a fifth direction DR5, in addition to the first and second directions DR1 and DR2. Unlike the embodiment of FIG. 11, adjacent hole patterns OH may not necessarily be arranged only in the first direction DR1 or the second direction DR2. Considering that the process of forming the hole patterns OH are performed concurrently (e.g., simultaneously or substantially simultaneously) with the process of forming the openings OPE1, OPE2, and OPE3 of the display area DA, the arrangement of the hole patterns OH may be similar to the arrangement of the emission areas EA1, EA2, and EA3 of FIG. 5 in a plan view. However, the present disclosure is not limited thereto, and the arrangement of the hole patterns OH may be variously modified in a plan view as needed or desired.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display area, and a non-display area surrounding the display area;
anode electrodes in the display area, and spaced from each other;
an inorganic insulating layer in the display area, and on the anode electrodes;
a bank structure on the inorganic insulating layer, and comprising a plurality of openings overlapping with the anode electrodes;
a plurality of light emitting layers on the anode electrodes and in the openings of the bank structure;
a plurality of cathode electrodes on the light emitting layers and in the openings of the bank structure;
a first power line in the non-display area, and surrounding the display area; and
a power connection electrode comprising a plurality of through portions partially overlapping with the first power line, and between the first power line and the display area,
wherein the bank structure comprises:
a plurality of hole patterns on the power connection electrode in the non-display area, and overlapping with the through portions;
a first bank layer; and
a second bank layer on the first bank layer, and comprising a metal material different from that of the first bank layer, and
wherein the second bank layer comprises a tip protruding from a sidewall of the first bank layer.

2. The display device of claim 1, further comprising:
a first insulating pattern on the through portions of the power connection electrode; and
a second insulating pattern on the first insulating pattern,
wherein the hole patterns penetrate the first insulating pattern and the second insulating pattern.

3. The display device of claim 2, wherein the inorganic insulating layer is not in contact with a top surface of each of the anode electrodes, and
wherein the display device further comprises a residual pattern between the anode electrodes and the inorganic insulating layer.

4. The display device of claim 3, wherein the power connection electrode is at the same layer as that of the anode electrodes,
wherein the first insulating pattern comprises the same material as that of the residual pattern, and
wherein the second insulating pattern comprises the same material as that of the inorganic insulating layer.

5. The display device of claim 3, wherein parts of the light emitting layers are located between the anode electrodes and the inorganic insulating layer.

6. The display device of claim 2, wherein the first insulating pattern covers inner sidewalls of the through portions.

7. The display device of claim 1, further comprising a bridge electrode in the non-display area between the first power line and the power connection electrode,
    wherein the bridge electrode is in direct contact with the first power line and the power connection electrode.

8. The display device of claim 1, wherein areas of the hole patterns are smaller than areas of the through portions.

9. The display device of claim 1, wherein the first bank layer comprises aluminum (Al), and the second bank layer comprises titanium (Ti).

10. The display device of claim 1, wherein each of the cathode electrodes is in direct contact with a corresponding side surface of the first bank layer.

11. The display device of claim 1, wherein the hole patterns do not overlap with the first power line.

12. The display device of claim 1, further comprising a gate driver between the display area and the first power line in the non-display area,
    wherein the power connection electrode overlaps with the gate driver, and
    wherein at least some of the plurality of hole patterns overlap with the gate driver.

13. The display device of claim 1, further comprising:
    a plurality of organic patterns on the second bank layer to surround the openings, and comprising the same material as those of the light emitting layers; and
    a plurality of electrode patterns on the organic patterns, and comprising the same material as that of the cathode electrodes.

14. The display device of claim 1, further comprising:
    a thin film encapsulation layer comprising:
        a first encapsulation layer on the bank structure;
        a second encapsulation layer on the first encapsulation layer; and
        a third encapsulation layer on the second encapsulation layer; and
    a touch layer on the thin film encapsulation layer, and comprising a plurality of touch insulating layers, and a touch electrode between the touch insulating layers.

15. The display device of claim 14, further comprising:
    a light blocking layer on the touch layer to overlap with the touch electrode, and comprising a plurality of opening holes overlapping with the openings of the bank structure; and
    a plurality of color filters in the opening holes, respectively, on the light blocking layer.

16. A display device comprising:
    a substrate comprising a display area, and a non-display area surrounding the display area;
    a first power line in the non-display area;
    a passivation layer on the first power line, and in the display area and the non-display area;
    an anode electrode on the passivation layer in the display area;
    a power connection electrode on the passivation layer in the non-display area, electrically connected to the first power line, and comprising a plurality of through portions;
    a residual pattern partially on the anode electrode;
    a plurality of first insulating patterns partially overlapping with the through portions in the non-display area;
    an inorganic insulating layer on the residual pattern, and partially overlapping with the anode electrode;
    second insulating patterns on the first insulating patterns and the power connection electrode;
    a bank structure comprising:
        a plurality of openings on the inorganic insulating layer and the power connection electrode, and overlapping with the anode electrode; and
        a plurality of hole patterns overlapping with the through portions, and
    penetrating the first insulating patterns and the second insulating patterns;
    an active layer on the anode electrode in the openings of the bank structure; and
    a cathode electrode on the active layer,
    wherein the bank structure comprises:
        a first bank layer; and
        a second bank layer on the first bank layer, and comprising a metal material different from that of the first bank layer, and
    wherein the second bank layer comprises a tip protruding from a sidewall of the first bank layer.

17. The display device of claim 16, wherein the hole patterns do not overlap with the first power line, and are located between the first power line and the display area in the non-display area.

18. The display device of claim 16, wherein the first insulating patterns cover inner sidewalls of the through portions, and
    wherein areas of the hole patterns are smaller than areas of the through portions.

19. The display device of claim 16, further comprising a bridge electrode in the non-display area between the first power line and the power connection electrode.

20. The display device of claim 16, wherein the cathode electrode is in direct contact with a side surface of the first bank layer.

* * * * *